United States Patent [19]
Wadaka et al.

[11] Patent Number: 5,789,845
[45] Date of Patent: Aug. 4, 1998

[54] FILM BULK ACOUSTIC WAVE DEVICE

[75] Inventors: Shusou Wadaka; Koichiro Misu; Tsutomu Nagatsuka; Tomonori Kimura; Shunpei Kameyama; Chisako Maeda; Akira Yamada; Toshihisa Honda, all of Tokyo, Japan

[73] Assignee: Mitsubishi Denki Kabushiki Kaisha, Tokyo, Japan

[21] Appl. No.: 559,706

[22] Filed: Nov. 15, 1995

[30] Foreign Application Priority Data

Nov. 24, 1994 [JP] Japan .................. 6-289804

[51] Int. Cl.⁶ .................................. H01L 29/66
[52] U.S. Cl. ............................ 310/334; 310/311
[58] Field of Search ..................... 310/311, 324, 310/328, 334, 313 R, 313 A, 313 B, 357

[56] References Cited

U.S. PATENT DOCUMENTS

| | | | |
|---|---|---|---|
| 3,745,564 | 7/1973 | Gandolfo et al. | 340/365 A |
| 4,398,114 | 8/1983 | Minagawa et al. | 310/313 R |
| 4,403,834 | 9/1983 | Kley | 350/371 |
| 4,575,690 | 3/1986 | Walls et al. | 331/162 |
| 4,640,756 | 2/1987 | Wang et al. | 209/192.18 |
| 5,075,641 | 12/1991 | Weber et al. | 331/108 C |
| 5,166,646 | 11/1992 | Avanic et al. | 331/107 A |
| 5,233,259 | 8/1993 | Krishnaswamy et al. | 310/324 |
| 5,260,596 | 11/1993 | Dunn et al. | 257/414 |
| 5,338,999 | 8/1994 | Ramakrishnan et al. | 310/358 |
| 5,446,335 | 8/1995 | Hino | 310/359 |
| 5,512,864 | 4/1996 | Vig | 331/162 |
| 5,596,239 | 1/1997 | Dydyk | 310/311 |

FOREIGN PATENT DOCUMENTS

| | | | |
|---|---|---|---|
| 0407848A2 | 1/1991 | European Pat. Off. | H03H 3/00 |
| 0503892A1 | 9/1992 | European Pat. Off. | H01L 27/20 |

OTHER PUBLICATIONS

Yoichi Miyasaka, Shigeki Hoshino & Sadayuki Takahashi "Advances in Structure and Fabrication Process For Thin Film Acoustic Resonator" 1987 Ultrasonics Symposium IEEE.

Hiroaki Satoh, Mitoshi Suzuki, Chikau Takahashi, Chhouji Narahara and Yasuo Ebata "A 400 MHz One–Chip Oscillator Using an Air–Gap Type Thin Film Resonator" 1987 Ultrasonics Symposium IEEE.

C. Vale, J. Rosenbaum, S. Horwitz, S. Krishnaswamy & R. Moore "FBAR Filters At Ghz Frequencies" 1990 IEEE Westinghouse Electric Corp.

1987 IEEE, 41st Annual Frequency Control Symposium, "Thin File Resonator Technology", pp. 371–381.

1987 IEEE Ultrasonics Symposium, "A 400 MHz One–chip oscillator using an Air–Gap type Think Film Resonator", pp. 363–368.

Primary Examiner—Thomas M. Dougherty
Attorney, Agent, or Firm—Wolf, Greenfield & Sacks, P.C.

[57] ABSTRACT

Embodiments of the present invention provide a small and well-characterized bulk acoustic wave device by fabricating a filter having a wide band width or a resonator having a wide oscillation frequency range together with a semiconductor circuit. In embodiments of the present invention, a bulk acoustic wave device comprises a semiconductor substrate having a dielectric substance layer thereon, the dielectric substance layer has a ground conductor layer thereon, the ground conductor layer has a piezoelectric ceramic thin film thereon and the piezoelectric ceramic thin film has a conductive electrode pattern thereon. The thickness of the piezoelectric ceramic thin film is more than ten times the thickness of the ground conductor layer, and the wave number of acoustic waves that propagate in a direction parallel to a surface of the piezoelectric ceramic thin film multiplied by the thickness of the piezoelectric ceramic thin film is less than 2.

36 Claims, 39 Drawing Sheets

FILM BULK ACOUSTIC WAVE DEVICE

BACKGROUND OF THE INVENTION

1. Field of the Invention

This invention relates to a bulk acoustic wave device using an acoustic wave, such as a resonator and a filter, and an electronics device which utilizes the bulk acoustic wave device.

2. Description of Related Arts

The bulk acoustic wave device operates as the resonator and the filter by using the piezoelectric material, which performs transformation between an electric signal and the acoustic wave.

FIG. 54 shows a conventional type of the bulk acoustic wave device described in the literatures, for example, the literature "1983 IEEE Ultrasonics Symposium, pp.299–310" (hereinafter, referred to as reference 1), Japanese Unexamined Patent Publication Number sho 63-187713 (hereinafter, referred to as reference 2), and the literature "IEEE, 41st Annual Frequency Control Symposium, pp.371–381, 1987" (hereinafter, referred to as reference 3). A semiconductor substrate 1 is, for instance, silicon (Si) or gallium arsenide (GaAs). A piezoelectric thin film 2 is such as zinc oxide (ZnO) or aluminum nitride (AlN). And, a semiconductor circuit 3 is provided.

As to a device using the piezoelectric thin film 2, there can be two cases. One is a case where a surface acoustic wave device as shown in reference 1 is used and the other is a case where the film bulk acoustic wave device as shown in the references 2 and 3 is used. The surface acoustic wave device configures an interdigital transducer on the surface of the piezoelectric thin film 2. The surface acoustic wave device can realize the resonator, the filter, a delay line, a correlator and so on. On the other hand, the bulk acoustic wave device can realize a bulk ultrasonic resonator, and a bulk acoustic wave filter which consist of the bulk acoustic wave resonators. The surface acoustic wave resonator and the bulk ultrasonic wave resonator have different structures each other but have almost the same electric function. Hereinafter, there is shown a case of the bulk acoustic wave device.

FIGS. 55 and 56 show a conventional type of the bulk acoustic wave resonator shown in the references 2 and 3, and the literature "1985 IEEE Ultrasonic Symposium, pp.311–318" (hereinafter, referred to as reference 4), "1990 IEEE Ultrasonics Symposium, pp.529–536" (hereinafter, referred to as reference 5), Japanese Unexamined Patent Publication Number hei 6-350154" (hereinafter, referred to as reference 6) and so on. FIG. 55 shows an upper-side view of this conventional type of the bulk ultrasonic wave resonator. FIG. 56 shows an A—A cross sectional view of the bulk ultrasonic wave resonator shown in FIG. 55. In FIG. 56, silicon oxide ($SiO_2$) 4 is provided. A ground conductor 5 is composed of a semiconductor in which impurity is doped with high concentration. The ground conductor 5 may be one of metals. A top-side electrode 6 is composed of one of metals and a via hole 7 is provided.

The operation will now be described. In FIG. 56, when the voltage is applied between the ground conductor 5 and the top-side electrode 6, there occurs an electric field in the piezoelectric thin film 2. The piezoelectric thin film 2 has a characteristic in that deformation or strain is caused when the electric field is generated. Then, when the applied voltage oscillates, an acoustic wave is excited in the piezoelectric thin film 2 corresponding to the applied voltage. The direction of propagation of the excited acoustic wave, the direction of displacement of elastic vibration and the excitation efficiency of the acoustic wave for the applied voltage is determined by the materials of the piezoelectric thin film 2 in use, the shapes of the ground conductor 5 and the top-side electrode 6, and so on. In the following discussion, it is assumed that the direction of propagation of the acoustic wave is in the direction of thickness of the piezoelectric thin film 2, this direction corresponding to the direction from the ground conductor 5 to the top-side electrode 6. And, it is assumed that the direction of displacement of elastic vibration is the direction of thickness of the piezoelectric thin film 2.

The acoustic wave is excited in the region between the top-side electrode 6 and the ground conductor 5 where an electric field exists. Therefore, approximately, the acoustic wave is excited in the region between the top-side electrode 6 and the ground conductor 5. Since the excited acoustic wave is propagated in the direction of the thickness of the piezoelectric thin film, it is reflected on the faces touching the air, i.e., the surface 6a of the top-side electrode 6 and the bottom side 4a of silicon oxide 4. This is because the acoustic impedance of the solid medium, like the top-side electrode 6, the piezoelectric thin film 2, the ground conductor 5 and silicon oxide 4 is far different from the acoustic impedance of the air. The surface 6a and bottom side 4a facing to the air can be substantially regarded as the complete reflector. The boundary condition on such a surface is disclosed in the literature such as in "Supervised by Onoue, The Basics of Solid Oscillation Theory, issued on September, 1982, Ohmu-sha, Chapter 5, Wave on Infinite Plate, pp. 77–116" (hereinafter, referred to as reference 7). Accordingly, in the bulk ultrasonic wave resonator having the configuration as shown in FIG. 56, the material of the semiconductor substrate 1 does not directly affect the excitation characteristic of the acoustic wave.

The acoustic wave is contained between the surface 6a of the top-side electrode 6 and the bottom side 4a of silicon oxide 4. Resonance occurs approximately around the frequency at which the length between the surface 6a of the top-side electrode 6 and the bottom side 4a of silicon oxide 4 is an integer multiple of the half wave length of the acoustic wave. Namely, the bulk acoustic wave device as shown in FIG. 56 operates as a bulk ultrasonic wave resonator. Silicon oxide 4 is thin and its density is low in general, compared to the top-side electrode 6, the ground conductor 5 and the piezoelectric thin film 2. Accordingly, contributions to the elastic resonance condition by silicon oxide 4 can be regarded to be low. FIG. 57 shows a simplified configuration of the bulk ultrasonic wave resonator. The simplified configuration has a triple layer structure composed of the top-side electrode 6, piezoelectric thin film 2 and the ground conductor 5. The simplified configuration may be used to represent the bulk acoustic wave resonator when the triple layer structure essentially determines the resonance condition. In the figure, the resonance device 8 operates as the resonator.

In FIG. 57, each of the thicknesses of the top-side electrode 6 and the ground conductor 5 is assumed to be d and the thickness of the piezoelectric thin film 2 is assumed to be h. When the load effects of the top-side electrode 6 and the ground conductor 5 are ignored, the resonant frequency $f_r$ is calculated by expression 1.

expression 1:

$$2f_r = n(h/V_p + d/V_m)^{-1}$$

In expression 1, n is an integer, $V_p$ is the propagation velocity of an acoustic wave in the piezoelectric thin film 2, $V_m$ is the propagation velocity of an acoustic wave of the top-side electrode 6 and the ground conductor 5. The propagation velocities $V_p$ and $V_m$ are determined by the materials used for the piezoelectric thin film 2, the top-side electrode 6 and the ground conductor 5, as well as the direction of propagation and the direction of vibration. The actual resonant frequency of the resonance device as shown in FIG. 57 is lower than the resonant frequency $f_r$ calculated by expression 1 due to the load effects of the top-side electrode 6 and the ground conductor 5 which are ignored in expression 1. The relationship between the resonant frequency and the load effects is described in the literature in "Supervised by Onoue, The Basics of Solid Oscillation Theory, issued on September, 1982, Ohmu-sha, Chapter 9, Wave of Piezoelectric Plate, pp. 189–195" (hereinafter, referred to as reference 8).

As shown in reference 5, the acoustic velocity of the piezoelectric material is approximately 6000 m/sec for zinc oxide and approximately 10000 m/sec for aluminum nitride. The thin film piezoelectric resonator as shown in FIG. 57 is configurated by using such piezoelectric material. For example, in a case where the resonant frequency of the fundamental wave (n=1) is 2 GHz, even when each of the thicknesses d of the top-side electrode 6 and the ground conductor 5 is ignored, the thickness h of the piezoelectric thin film 2 is calculated as 1.5 μm to 2.5 μm. Namely, an extremely thin film thickness is required. Additionally, when each of the thicknesses d of the top-side electrode 6 and the ground conductor 5 is considered, the required film thickness h of the piezoelectric thin film 2 is thinner. Piezoelectric thin films used in the conventionally well-known piezoelectric resonators and conventionally well-known piezoelectric filters for the intermediate frequency (hereinafter, referred to as IF) band are produced by planing plate materials. The planing method cannot be used to produce a piezoelectric thin film having several μm thickness.

The characteristics of the thin film piezoelectric resonator shown in FIG. 57 are basically the same as that of conventionally well-known crystal oscillators and conventionally well-known ceramic oscillators for the IF band using the plate material. The crystal oscillator and the ceramic oscillator are described in detail, for example, in the literature in "Acoustic wave Device Technology Handbook, edited by the Japan Society for the Promotion of Science Acoustic wave Device Technology The 150th committee, issued by Ohmu-sha, the 1st edition issued on Nov. 30, 1991, volume II, Bulk Wave Device, Chapter 3, Piezoelectric Bulk Wave Device, pp. 90 to 143" (hereinafter, referred to as reference 9).

As described in the reference 9, FIG. 58 shows an equivalent circuit of the bulk ultrasonic wave resonator shown in FIG. 57. In the figure, a capacity $C_0$ 9 is coupled between the top-side electrode 6 and the ground conductor 5. An equivalent inductance $L_1$ 10, an equivalent capacity $C_1$ 11 and an equivalent resistance $R_1$ 12 are coupled in series. FIG. 59 shows a representative characteristic impedance of the equivalent circuit shown in FIG. 58.

The equivalent circuit in FIG. 58 resonates at frequency $F_r$. The frequency $F_r$ is the frequency which the equivalent inductance $L_1$ 10 and the equivalent capacity $C_1$ 11 resonate in series. When the equivalent resistance $R_1$ is zero, the impedance comes to be zero. The equivalent circuit anti-resonates at frequency $F_a$. The frequency $F_a$ is a frequency in which the capacity $C_0$ 9, the series circuit of the equivalent inductance $L_1$ 10 and the equivalent capacity $C_1$ 11 resonate in parallel. When the equivalent resistance $R_1$ is zero, the impedance comes to be infinite. The characteristic impedance in FIG. 59 shows a case where the equivalent resistance $R_1$ is not zero and therefore the impedance at frequency $F_a$ shows a finite value.

There is a unique relationship among the capacity $C_0$ 9, the equivalent inductance $L_1$ 10, the equivalent capacity $C_1$ 11, the resonant frequency $F_r$ and the antiresonant frequency $F_a$. The following expressions 2 and 3 are disclosed in reference 9.

expression 2:

$$F_r = \frac{1}{2\pi\sqrt{L_1 C_1}}$$

expression 3:

$$F_a = \frac{1}{2\pi}\sqrt{\frac{1}{L_1}\left(\frac{1}{C_0}+\frac{1}{C_1}\right)} = F_r\sqrt{1+\frac{C_1}{C_0}}$$

Additionally, $Q_m$, a quality factor of the resonator, is related to the circuit constant of the equivalent circuit shown in FIG. 58 and the following expression 4 for $Q_m$ is disclosed in reference 9.

expression 4:

$$Q_m = \frac{1}{2\pi F_r C_1 R_1}$$

The frequency $f_r$ shown in the expression 1 is an approximate value of the resonant frequency $F_r$ and the antiresonant frequency $F_a$. Strictly, the value is determined by the materials and physical shapes of the top-side electrode 6 and the ground conductor 5, and the material, the direction of crystallization and the physical shape of the piezoelectric thin film 2. In addition, $Q_m$ and the difference between the resonant frequency $F_r$ and the antiresonant frequency $F_a$ are mostly determined by the material and the direction of crystallization of the piezoelectric thin film 2. The difference between the resonant frequency $F_r$ and the antiresonant frequency $F_a$ largely affects the maximum frequency adjustment range when an oscillator circuit is configured using the bulk ultrasonic wave resonator and affect the maximum passband width when a filter is configured with the bulk ultrasonic wave resonators.

The effective electromechanical coupling factor $k^2_{eff}$ is calculated as the following expression 5 by using the resonant frequency $F_r$ and the antiresonant frequency $F_a$.

expression 5:

$$k^2_{eff} = \frac{F_a^2 - F_r^2}{F_r^2}$$

The effective electromechanical coupling constant $k^2_{eff}$ is determined based on the materials, the direction eff of crystallization of the piezoelectric thin film 2 and the direction of propagation and the direction of vibration of the acoustic wave. This is described in the literature in "Ultrasonic Wave Technology Handbook, Daily Technical Newspaper Publishing Company, the 8th edition issued on Jun. 25, 1991, pp. 363 to 371" (hereinafter, referred to as reference 10). When the electromechanical coupling constant $k^2$ is assumed as the maximum value of the electromechanical coupling constant $k^2_{eff}$, the frequency difference $\Delta F$ between the resonant frequency $F_r$ and the antiresonant frequency $F_a$ can be calculated by the following expression 6.

expression 6:

$$\Delta F = F_a - F_r = F_r(\sqrt{1+k^2} - 1)$$

FIG. 60 shows an example of the characteristic impedance of a bulk ultrasonic wave resonator. In the bulk ultrasonic wave resonator, the frequency, at which the impedance varies from the capacitive reactance area to the inductive reactance area as the frequency increases and the reactance component comes to be zero, is set to be $F_r$. The frequency, at which the impedance varies from the inductive reactance area to the capacitive reactance area and the reactance component comes to be zero, is set to be $F_a$. The frequency $F_r$ is the resonant frequency as shown in expressions 2 to 5 and the frequency $F_a$ is the antiresonant frequency.

FIG. 61 is a basic portion of the oscillator circuit of a Colpitts type which is conventionally well known. In the figure, a transistor 13, condensers $C_C$, $C_B$ 14, and a bulk ultrasonic wave resonator 15 are provided.

One of the conditions where the oscillator circuit as shown in FIG. 61 oscillates is approximately shown in the following expression 7, when it is assumed that the affect of the transistor 13 is small. The oscillator circuit is described in detail in the literature in "High Frequency, Oscillation, Modulation and Demodulation, Tokyo Electric College publishing co., the first edition issued on May 10, 1986" (hereinafter, referred to as reference 11) on pp. 49 to 91.

expression 7:

$$1/j\omega C_C + 1/j\omega C_B + 1/Y = 0$$

In the expression 7, $\omega$ is the angular frequency and Y is the admittance of the bulk ultrasonic wave resonator 15. Admittance Y is calculated by the following expression 8 based on the equivalent circuit in FIG. 58.

expression 8:

$$Y = j\omega C_0 + \frac{1}{j\omega L_1 + 1/j\omega C_1 + R_1}$$

In order to satisfy expression 7, it is necessary that the bulk ultrasonic wave resonator 15 have an inductive reactance characteristic. Therefore, the possible frequency range of oscillation is limited to the range within $F_r$ and $F_a$. Namely, by using the bulk ultrasonic wave resonator 15 having the characteristics shown in FIG. 60, the frequency range which can be oscillated is smaller than the frequency difference $\Delta F$ between the resonant frequency $F_r$ and the antiresonant frequency $F_a$.

In a case where a stable oscillation is required at a specified frequency, the resonator with a narrow band width, whose frequency difference $\Delta F$ between the resonant frequency $F_r$ and the antiresonant frequency $F_a$ is small, is appropriate. Conventionally, when stable oscillation is required at a specified frequency, as disclosed in the reference 9, a quartz resonator has been used widely. Since quartz has an extremely small electromechanical coupling constant $k^2$, the frequency difference $\Delta F$ between the resonant frequency $F_r$ and the antiresonant frequency $F_a$ is extremely small and the temperature characteristic is stable. As a result, when an oscillator circuit is configured using quartz, the stability of the oscillation frequency is extremely large.

However, since the piezoelectric thin film 2 is not configured using quartz, it is impossible to configure the bulk ultrasonic wave resonator using the piezoelectric thin film 2 shown in FIG. 56. In addition, since the frequency difference $\Delta F$ between the resonant frequency $F_r$ and the antiresonant frequency $F_a$ is extremely small in case of the quartz, the frequency variable range when the voltage control oscillator (VCO) is configured by the quartz is extremely narrow.

When the high stability, provided by quartz is not required, for example, as shown in references 2 and 3, a bulk ultrasonic wave resonator using zinc oxide (ZnO) and aluminum nitride (AlN) has been utilized. A bulk ultrasonic wave resonator using zinc oxide (ZnO) and aluminum nitride (AlN) cannot provide high stability oscillation as a quartz oscillator does by itself. Therefore, either the condenser $C_B$ 14 or the condenser $C_C$ 14 is replaced by a variable capacitance diode and so forth. The capacitance of the variable capacitance diode is varied based on the applied voltage to the diode. Accordingly, the bulk ultrasonic wave resonator can be used as a VCO with a variable oscillation frequency. In this case, the limitation of the frequency range which can be oscillated depends on the electromechanical coupling constant $k^2$. Namely, according to the material of the piezoelectric thin film 2, the possible oscillation frequency range can be determined.

FIG. 62 shows an example of one section of a circuit view of the bulk ultrasonic wave filter which is conventionally well-known and configurated by connecting the bulk ultrasonic wave resonators 15a and 15b in a ladder circuit. In the figure, the input terminal 16, an output terminal 17, and a ground terminal 18 are provided. FIG. 63 shows a view of the characteristic impedance of each of the bulk ultrasonic wave resonators 15a and 15b which configure the bulk ultrasonic wave filter shown in FIG. 62. In the figure, the characteristic impedance 19 is the impedance of the bulk ultrasonic wave resonator 15a which is a shunt element in FIG. 62, and the characteristic impedance 20 is characteristic impedance of the bulk ultrasonic wave resonator 15b which is a series element in FIG. 62. FIG. 64 shows the frequency responses of the bulk ultrasonic wave filter shown in FIG. 62.

When the filter is configurated by using the ladder shaped connection as shown in FIG. 62, as disclosed in the reference 9, the antiresonant frequency $F_{ap}$ of the bulk ultrasonic wave resonator 15a which is the shunt element and the resonant frequency $F_{rs}$ of the bulk ultrasonic wave resonator 15b which is the series element are set to be almost the same frequency. Around these frequencies $F_{ap}$ and $F_{rs}$, the bulk ultrasonic wave resonator 15a (the shunt element) has almost infinite impedance. The bulk ultrasonic wave resonator 15b (the series element) has an impedance which can be regarded as almost a short-circuit. Then, the electric characteristics between the input terminal 16 and the output terminal 17 can be regarded as almost a short-circuit and the circuit shown in FIG. 62 can be regarded as a transmission line. Namely, the bulk ultrasonic wave filter works as a filter which has a passband around frequency $F_{ap}$ and $F_{rs}$. On the other hand, around the resonant frequency $F_{rp}$, the bulk ultrasonic wave resonator 15a (the shunt element) has impedance to be regarded as almost short-circuit. Around the antiresonant frequency $F_{as}$, the bulk ultrasonic wave resonator 15b (the series element) has almost infinite impedance. Hence, the electric characteristics between the input terminal 16 and the output terminal 17 can be determined to be opened. The circuit shown in FIG. 62 provides an attenuation pole around the frequencies $F_{rp}$ and $F_{as}$. Accordingly, the bulk ultrasonic wave filter which is configurated by connecting the bulk ultrasonic wave resonators 15a and 15b having the characteristic impedance shown in FIG. 63 as shown in FIG. 62 shows the passing characteristic as illustrated in FIG. 64.

When the difference between the resonant frequency $F_{rp}$ and the antiresonant frequency $F_{ap}$ of the bulk ultrasonic wave resonator 15a of the shunt element and the difference between the resonant frequency $F_{rs}$ and the antiresonant frequency $F_{as}$ of the bulk ultrasonic wave resonator 15b are almost the same frequency difference ΔF, the passband width based on the frequency responses shown in FIG. 64 cannot exceed 2ΔF. The frequency difference, ΔF, as shown in the expression 6, depends largely on the electromechanical coupling constant $k^2$ of the piezoelectric thin film 2 and therefore the limiting value of the passband width of the bulk ultrasonic wave filter greatly depends on the material of the piezoelectric thin film 2.

By replacing the bulk ultrasonic wave resonators 15a and 15b with the equivalent circuit shown in FIG. 58, the insertion loss or the attenuation volume at the attenuation pole of the bulk ultrasonic wave filter depends on the equivalent resistance of each bulk ultrasonic wave resonators 15a and 15b. Therefore, the frequency responses of the bulk ultrasonic wave filter such as the insertion loss, the passband width, and the attenuation at the attenuation pole depends on the electromechanical coupling constant $k^2$ and $Q_m$.

FIGS. 65 and 66 show an example of a bulk ultrasonic wave filter using conventionally known multiple mode resonance. FIG. 65 shows an upper-side view and FIG. 66 shows a B—B cross sectional view. FIGS. 65 and 66 show a double mode filter described in the literature in "Applied Physics Letters, Vol.37, No.11, pp.993–995, Dec 1980" (hereinafter, referred to as reference 12). In the figure, a semiconductor substrate 1 is composed of silicon. A silicon layer 21 is epitaxialized on the semiconductor substrate 1. A ground conductor 5 has gold (Au) between titanium (Ti) layers. A piezoelectric thin film 2 is composed of zinc oxide (ZnO). A top-side electrode 6 is composed of aluminum (Al). A lead electrode on the input side 22, a lead electrode on the output side 23 and a via hole 7 are provided.

FIG. 67 shows an example of the equivalent circuit of the bulk ultrasonic wave filter shown in FIG. 66. In the figure, equivalent circuit components $C_s$, $L_s$, $R_s$ in the symmetry mode resonance shown with subscript s, and the equivalent circuit components $C_a$, $L_a$, $R_a$ in asymmetry mode resonance shown with subscript a are coupled by a transformer T. The coupling amount or the coupling capacity $C_{13}$ of the transformer T is determined by materials and thicknesses of the piezoelectric thin film 2, the top-side electrode 6 and the ground conductor 5, and the shape and the layout of the top-side electrode 6. As to the bulk ultrasonic wave filter in FIG. 66, reference 9 discloses the equivalent circuit shown in FIG. 67. Reference 9 also discloses that the bulk ultrasonic wave filter shown in FIGS. 65 and 66 has characteristics corresponding to one section of the bulk ultrasonic wave filter of the ladder connection as shown in FIG. 62. Namely, in the case of the bulk ultrasonic wave filter shown in FIGS. 65 and 66, the frequency responses of the bulk ultrasonic wave filter such as insertion loss, passband with, attenuation at the attenuation pole and so forth depend on the electromechanical coupling constant $k^2$ and $Q_m$ of the piezoelectric thin film 2.

As has been described, the characteristics of the bulk acoustic wave resonator and the bulk ultrasonic wave filter, are greatly affected by the electromechanical coupling constant $k^2$ and $Q_m$, which are the material characteristics of the piezoelectric thin film 2. The following table 1 is a representative value of the material constants of the main piezoelectric material shown in reference 9. Generally, the single crystal has an extremely large $Q_m$ and a large electromechanical coupling constant $k^2$. But, it is used as a wafer and there is no report of a thin film having the characteristic equivalent to that of wafer. Ceramics has a feature of having a large electromechanical coupling constant $k^2$ and a large dielectric constant. On the other hand, $Q_m$ is small. In ceramics, many various kinds of electromechanical coupling constants $k^2$, $Q_m$ and dielectric constants may be achieved, by varying the compound ratio of the composite component and by adding a small amount of additions. Usually, the plate material, into which the ceramics is burnt, is used in the resonator and the filter to operate in the IF band. Reference 6 shows an example of a thin film using lead titanate-zirconate (PZT). As to thin films, conventionally, zinc oxide (ZnO) and aluminum nitride (AlN) are widely used although only zinc oxide is shown in the table 1. These materials have a smaller electromechanical coupling constant $k^2$, compared to the single crystal and the ceramics. In addition, $Q_m$ has an intermediate value between the single crystal and the ceramics.

TABLE 1

| classification | | speech velocity (m/s) | relative dielectric constant | electro mechanical coupling factor $k^2$ | mechanical $Q_m$ |
|---|---|---|---|---|---|
| single crystal | | | | | |
| crytal | SiO₂ OX | 5740 | 4.5 | 0.11 | >100000 |
| lithium niobate | LiNbO₃ 35Y | 7360 | 39 | 0.49 | >100000 |
| ceramics | | | | | |
| titanate zirconate | PZT-4 | 4600 | 1300 | 0.7 | 500 |
| lead metaniobate | PbNb₂O₆ | 3300 | 300 | 0.4 | (12) |
| lead titanate thin film | PbTiO₃ | 3980 | 179 | 0.4 | 1240 |
| zinc oxide | ZnO | 6330 | 8.8 | 0.28 | — |

As has been described, various plate materials are used in bulk ultrasonic wave resonators for bulk ultrasonic wave filters to be used in the IF band, as disclosed in reference 9. However, in the bulk ultrasonic wave resonator and the bulk ultrasonic wave filter composing the piezoelectric thin film 2 on the semiconductor substrate 1, materials to be used are limited. Namely, as actual examples, there are zinc oxide (ZnO) and aluminum nitride (AlN) as disclosed in references 1, 2, 3, and 5 or lead titanate-zirconate (PZT) as disclosed in reference 6. According to table 1 and references 3 and 5, the electromechanical coupling constant $k^2$ of zinc oxide has a range of 0.02 to 0.1. The electromechanical coupling constant $k^2$ of aluminum nitride (AlN) is 0.03. When a ratio of the frequency difference between the resonant frequency $F_r$ and the antiresonant frequency $F_a$ to the resonant frequency (ΔF/$F_r$) is calculated from these values by using expression 6, the ratio ΔF/$F_r$ is from 1% to 5% for zinc oxide (ZnO) and about 1% for aluminum nitride (AlN). Assuming that the electromechanical coupling constant $k^2$ of lead titanate-zirconate (PZT) is 0.5, the ratio ΔF/$F_r$ is about 22% for lead titanate-zirconate (PZT).

When these materials are configured on the semiconductor substrate 1 as the piezoelectric thin film 2, the thin film is produced not by planing the plate material such as a wafer. The thin film is produced by a plate fabrication process such as vacuum evaporation, sputtering and so forth. Therefore, it is possible to fabricate the thin film having thickness of several microns. Further, it is possible to operate the thin film at a higher frequency than the bulk ultrasonic wave resonator and the bulk ultrasonic wave filter which operate in the conventional IF band. Since the bulk ultrasonic wave resonator and the bulk ultrasonic wave filter can be composed on the same substrate with that of the semiconductor circuit, it is possible to make a whole circuit small in size and light in weight. However, when the bulk ultrasonic wave resonator and the bulk ultrasonic wave filter are actually manufactured, manufacturing error surely occurs. Especially, it is difficult to control the thicknesses of the piezoelectric thin film 2, the top-side electrode 6, and the ground conductor, precisely.

As to this conventional type of bulk ultrasonic wave resonator, in the literature in "Manufacture and Application of Piezoelectric Materials, issued by CMC, the 2nd edition issued on Aug. 5, 1985" (hereinafter, referred to as the reference 13), a method for adjusting the resonant frequency and the antiresonant frequency is described. Conventional methods include evaporating and adding metals to the top-side electrode 6, and trimming the top-side electrode 6 by using, for example, a laser, after configuring the bulk ultrasonic wave resonator, is adopted. FIG. 68 shows the method of adjusting frequency of the conventional type of bulk ultrasonic wave resonator. In the figure, the portion 24 is where trimming is performed for the top-side electrode 6 by using a laser.

As has been described, in the bulk ultrasonic wave resonator, approximately characterized by expression 1, at the frequency in which the sum of the thicknesses of the top-side electrode 6 and the piezoelectric thin film 2 and the ground conductor 5 is a half wave length, the acoustic wave resonates. However, the mass loads of the top-side electrode 6 and the ground conductor 5 lower the resonant frequency from that determined using expression 1. As shown in FIG. 68, when trimming is performed for a part of the top-side electrode 6, the mass load in accordance with the top-side electrode 6 is slightly reduced. Therefore, the resonant frequency is increased. On the other hand, when metals are added by the means such as the vacuum evaporation to the top-side electrode 6, the resonant frequency gets lower. Further, when the resonant frequency varies, the antiresonant frequency also varies, as it is linked with the resonant frequency.

Such a method for frequency adjustment can be used for adjusting each bulk ultrasonic wave resonator, independently. Therefore, it is necessary to know the mass amount for adding or trimming precisely. As a result, the adjustment cost becomes higher. Where only the bulk ultrasonic wave resonator and only the bulk ultrasonic wave filter, consisting of the bulk ultrasonic wave resonators, are manufactured, it is possible to manufacture the bulk ultrasonic wave resonator and the bulk ultrasonic wave filter in the manufacturing process of the film bulk acoustic wave device, and therefore, the above adjustment method can be used. On the other hand, where the bulk ultrasonic wave resonator and the bulk ultrasonic wave filter are configurated on a semiconductor substrate which has the semiconductor circuit thereon, the bulk ultrasonic wave resonator and the bulk ultrasonic wave filter are manufactured during the manufacturing process of the semiconductor circuit. Since the manufacturing process of the semiconductor circuit handles a wafer as a manufacturing unit, wherein the wafer includes a plurality of devices, a different process from the manufacturing process of the semiconductor circuit is required to adjust each device. This additional process increases the manufacturing cost.

When the amount of adjustment achieved by adding or trimming is not enough, additional adjustment amount is performed. On the other hand, when the amount of adjustment is in excess of that desired, it is not possible to perform readjustment by the same adjustment method. For instance, in the adjustment method of evaporating and adding metals, when the metal added is more than the required mass volume, it is not possible to correct the over adjustment by evaporating and adding metals. Similarly, in the adjustment method of trimming, when the amount of trimming is more than the required mass volume, it is not possible to correct the over adjustment by trimming.

FIGS. 69 and 70 show an example of another conventional method for frequency adjustment of a film bulk acoustic wave device. FIG. 69 shows an example of connecting a variable condenser $C_v$ 25 to the bulk ultrasonic wave resonator in series. FIG. 70 shows an example of connecting a variable condenser $C_v$ 25 to the bulk ultrasonic wave resonator 15 in parallel. FIG. 71 shows an equivalent circuit of the circuit shown in FIG. 69. FIG. 72 shows an equivalent circuit of the circuit shown in FIG. 70.

In FIG. 71, when the equivalent resistance $R_1$ 12 is zero, the frequency, at which the impedance between terminals A and B is zero is different from the resonant frequency $F_r$ of the bulk ultrasonic wave resonator 15 because of the variable condenser $C_v$ 25. This means that the resonant frequency of the bulk ultrasonic wave resonator 15 can be varied by varying the variable condenser $C_v$ 25. Here, since the maximum frequency difference of the resonant frequency and the antiresonant frequency is limited by the electromechanical coupling constant $k^2$ of the piezoelectric thin film 2, the frequency range which can be adjusted by the variable condenser $C_v$ 25 is limited. Namely, it is impossible to perform adjustment in which the resonant frequency is beyond the frequency difference $\Delta F$ of the resonant frequency and the antiresonant frequency. In addition, when there is a loss in the variable condenser $C_v$ 25, $Q_m$ of the bulk ultrasonic wave resonator 15 is reduced.

Hence, for example, when zinc oxide (ZnO) is used in the conventional type of bulk ultrasonic wave resonator 15, the maximum adjustable frequency range is around 1 to 5%. When aluminum nitride (AlN) is used, the maximum adjustable frequency range is about 1%. Fluctuation of the antiresonant frequency or the resonant frequency of the bulk ultrasonic wave resonator 15 is mostly caused by the manufacturing errors or fabrication errors that cause variations in the thicknesses and composition of the piezoelectric thin film 2, thickness of the top-side electrode 6, thickness of the ground conductor 5 and so forth. Even when the thickness of the piezoelectric thin film 2 is precisely controlled, the manufacturing error is in the range of around several percent. When thickness of the piezoelectric thin film 2 is not precisely controlled, manufacturing error becomes about 10%. The adjustment of frequency in accordance with the electrical adjustment wherein the adjustable frequency range is from 1 to 5% and it is practically impossible to correct for frequency errors of 10% with the conventional materials. As to lead titanate-zirconate (PZT), the electromechanical coupling constant $k^2$ of the thin film is not shown in the reference 6. When the electromechanical coupling constant $k^2$ of lead titanate-zirconate (PZT) is considered to be equivalent to one of the ceramics of the bulk material on table 1, the maximum of the adjustable frequency range is about 22%. This adjustable frequency range is within the fluctuation range of the resonant frequency or the antiresonant frequency caused by fabrication error.

Other factors causing fluctuation of the resonant frequency and the antiresonant frequency, is a pattern precision or relative position of the top-side electrode 6 and the ground conductor 5 and the dimensional tolerances of the top-side electrode and the ground conductor. FIGS. 73 and 74 will be used to show that the pattern precision affects the fluctuation of the resonant frequency and the antiresonant frequency. FIG. 73 is an upper-side view and FIG. 74 is a C—C sectional view. In the figures, a lead electrode 26 is electrically connected to the top-side electrode 6. Since a dielectric substance 4 like silicone oxide ($SiO_2$) affects the resonant frequency and the antiresonant frequency relatively little, the illustration of the dielectric substance is omitted in FIGS. 73 and 74.

The capacity $C_0$ between electrodes of the bulk ultrasonic wave resonator can be calculated according to expression 9 where a usual dielectric substance is positioned between conductors.

expression 9:

$$C_0 = \epsilon_r \epsilon_0 A/h$$

Wherein $\epsilon_r$ is a relative dielectric constant of the piezoelectric thin film 2. $\epsilon_0$ is a dielectric constant in a vacuum. A is an area of the crossing point where the top-side electrode 6 and the ground conductor 5 overlap. h is a thickness of the piezoelectric thin film 2. As shown in FIG. 65, when the top-side electrode 6 is located in the inside of the ground conductor 5, the area A is the area of the top-side electrode 6. The area A can be varied as required. The area A can be selected such that the impedance of the capacity $C_0$ between electrodes is the characteristic impedance of the circuit in use. In general, circuits having an operating frequency of approximately 2 GHz have a characteristic impedance of 50 Ω. The capacity of $C_0$ corresponding to an impedance of 50 Ω at 2 GHz is about 1.6 pF. As to the conventional type of bulk ultrasonic wave resonator, shown in the reference 6, when the size of the top-side electrode 6 whose capacity between electrodes is 1.6 pF is calculated, it is about 19 by 19 μm square according to the expression 9, in a case where the thickness of the piezoelectric thin film 2 is 2 μm and the relative dielectric constant of the piezoelectric thin film 2 is 1000. When the relative dielectric constant of the piezoelectric thin film 2 gets larger, the size of the top-side electrode 6 gets smaller. For instance, when the relative dielectric constant is 2000, the size comes to be about 13 by 13 μm square.

On the other hand, the dimensions of the top-side electrode 6 have a tolerance limitation almost corresponding to the thickness of the top-side electrode 6. In the conventional type of bulk ultrasonic wave resonator shown in reference 6, the thickness of the top-side electrode 6 is 0.2 μm. When the dimensional tolerances of each edge of the top-side electrode 6 are assumed to be +−0.2 μm, the tolerance of the capacity $C_0$ between electrodes is equivalent to the tolerance of the area of the top-side electrode. Therefore, when an electrode of 19 by 19 μm square is used, the tolerance of the capacity is $(19.4/19)^2 \approx 4\%$. In case of an electrode 13 by 13 μm square, the capacitive tolerance is $(13.4/13)^2 \approx 6\%$. Namely, the capacity $C_0$ between electrodes, determined by the precision of the top-side electrode 6, contains an error of more than 4 to 6%. This value can be reduced by enlarging the size of the top-side electrode 6. However, the capacity $C_0$ between electrodes increases with an increase in size of the top-side electrode 6. Considering the relationship with the surrounding electric circuits connected to the bulk ultrasonic wave resonator, the practically available value of the capacity $C_0$ between electrodes is limited. Consequently, it is impossible to enlarge the size of the top-side electrode 6 without limitation.

Additionally, the capacity $C_0$ between electrodes is affected by the lead electrode 26. When the piezoelectric thin film 2 is zinc oxide (ZnO) or aluminum nitride (AlN), the direction of the c axis, which is a crystal axis, is oriented in the direction of the thickness of the piezoelectric thin film 2. Therefore, the piezoelectric thin film 2 shows piezoelectricity by forming only a film. Lead titanate-zirconate (PZT) disclosed in reference 6 is a piezoelectric thin film formed with an orientation rate of more than 70%. It also shows piezoelectricity by forming only a film. That is, the conventional type of piezoelectric thin film 2 is a spontaneous polarization film showing piezoelectricity right after forming a film. Therefore, the formed piezoelectric thin film 2 shows piezoelectricity at any point.

As shown in FIGS. 73 and 74, an overlapping portion 26a where the lead electrode 26 and the ground conductor 5 overlap operates electrically in exactly the same way as the overlapping area of the top-side electrode 6 and the ground conductor 5. Namely, the overlapping portion 26a where the lead electrode 26 and the ground conductor 5 overlap is a condenser having the piezoelectric thin film 2 as a dielectric substance. In addition, an acoustic wave is excited from the overlapping portion. A portion 26b of the lead electrode 26 does not overlap the ground conductor 5. A dielectric constant of the piezoelectric thin film 2 is extremely large compared to that of the semiconductor substrate 1. An electric field concentratedly occurs between the portion 26b and the ground conductor 5. Therefore, the portion 26b of the lead electrode 26 has capacitance even though the portion 26b does not overlap the ground conductor 5. An elastic wave is excited by the electric field occurring in the portion 26b. Since the lead electrode 26 connects the top-side electrode 6 to the surrounding electric circuits, there is a case that the lead electrode 26 needs to be drawn on other places except for the via hole 7. The acoustic wave excited in such place is propagated in the inside of the semiconductor substrate 1. Therefore, it will cause undesirable resonance points and losses. The undesirable resonance points and the losses due to the lead electrode 26 depend on a ratio of the area of the top-side electrode 6 to the area of the lead electrode 26. The line width of the lead electrode 26, is limited by the required conductor resistance and the line path impedance. Accordingly, when the area of the top-side electrode 6 is not large, an affect of the undesirable resonance points and the losses due to the lead electrode 26 relatively is relatively large.

The film bulk acoustic wave device is formed with a semiconductor circuit. The film bulk acoustic wave device includes a bulk ultrasonic wave resonator and a bulk ultrasonic wave filter. The film bulk acoustic wave device is fabricated together with various electric circuits required in the electric apparatuses. When the manufacturing cost or fabrication cost is high and the problems, such as fluctuation of frequency by the manufacturing error or fabrication error, undesirable resonance, and increase of loss, cannot be solved, there is no advantage to fabricating the bulk ultrasonic wave resonator and the bulk ultrasonic wave filter together with various kinds of other electric circuits. As a result, it is difficult to provide a small and light bulk acoustic wave device formed with many other electric circuits on the same semiconductor substrate. Problems to be solved by the Invention As has been described, the conventional bulk acoustic wave devices using zinc oxide (ZnO) or aluminum nitride (AlN) cannot adjust the fluctuation of the resonant frequency and the antiresonant frequency due to manufacturing tolerances by electrical adjustment. Accordingly, it is necessary to adopt a physical adjustment using either a method of sputtering the topside electrode 6 at each device or a method of trimming the top-side electrode. This causes the manufacturing cost to be higher. Since the conventional type of bulk acoustic wave device using lead titanate-zirconate (PZT) has an extremely large dielectric constant, the size of the top-side electrode cannot be enlarged because of the restriction of the capacity between electrodes. Therefore, the dimensional tolerances of the top-side electrode may cause fluctuation of the resonance and antiresonant frequency.

Furthermore, because the conventional type of bulk acoustic wave device is a spontaneous polarization film, the acoustic wave is excited in the lead electrode and propagated on the semiconductor substrate outside of the via hole. Then, undesirable resonance and increase of the loss are caused. Since the conventional type of film bulk acoustic wave device cannot solve these problems, it cannot be fabricated together with other electric circuits on the same semiconductor substrate.

SUMMARY OF THE INVENTION

Embodiments of the present invention solve one or more of the problems discussed above. It is an object of this invention to provide a film bulk acoustic wave device which can adjust characteristics of the film bulk acoustic wave device at a low cost.

It is another object of this invention to provide a well-characterized bulk acoustic wave device which decreases undesirable resonance points and losses.

Further, it is another object of this invention to provide a small, light and adjustment-free electric apparatus fabricated together with the other electric circuits on the same semiconductor substrate.

According to one aspect of this invention, a film bulk acoustic wave device may include:

a semiconductor substrate;

a ground conductor layer, having a thickness, mounted on the semiconductor substrate;

a piezoelectric ceramic thin film, having a thickness, mounted on the ground conductor layer; and a conductive electrode pattern mounted on the piezoelectric ceramic thin film;

wherein the thickness of the piezoelectric ceramic thin film is more than 10 times the thickness of the ground conductor layer.

According to another aspect of this invention, film bulk acoustic wave device may include:

a semiconductor substrate;

a ground conductor layer mounted on the semiconductor substrate;

a piezoelectric ceramic thin film, having a thickness, mounted on the ground conductor layer; and a conductive electrode pattern mounted on the piezoelectric ceramic thin film;

wherein the piezoelectric ceramic thin film generates an acoustic wave propagated in a direction parallel to a surface of the piezoelectric ceramic thin film and a wave number of the acoustic waves is less than 2 divided by the thickness of the piezoelectric ceramic thin film.

According to another aspect of this invention, a film bulk acoustic wave device may include:

a ground conductor layer mounted on the semiconductor substrate;

a piezoelectric ceramic thin film mounted on the ground conductor layer;

a conductive electrode pattern mounted on the piezoelectric ceramic thin film; and a semiconductor circuit mounted on the semiconductor substrate;

wherein the semiconductor circuit is configured by using a part of the piezoelectric ceramic thin film.

According to another aspect of this invention, a film bulk acoustic wave device may include:

a semiconductor substrate;

a ground conductor layer mounted on the semiconductor substrate;

a piezoelectric ceramic thin film mounted on the ground conductor layer; and, a conductive electrode pattern mounted on the piezoelectric ceramic thin film;

wherein the piezoelectric ceramic thin film has a piezoelectric section processed by a polarization process and a dielectric section that has not been processed by the polarization process.

According to another aspect of this invention, a film bulk acoustic wave device may include:

a semiconductor substrate;

a ground conductor layer mounted on the semiconductor substrate;

a piezoelectric ceramic thin film mounted on the ground conductor layer;

a conductive electrode pattern mounted on the piezoelectric ceramic thin film;

a semiconductor circuit mounted on the semiconductor substrate;

a polarization circuit used for a polarization process of the piezoelectric ceramic thin film; and a protective circuit for protecting the semiconductor circuit from the polarization process by the polarization circuit.

According to another aspect of this invention, a film bulk acoustic wave device may include:

a semiconductor substrate;

a ground conductor layer mounted on the semiconductor substrate;

a piezoelectric ceramic thin film mounted on the ground conductor layer;

a conductive electrode pattern mounted on the piezoelectric ceramic thin film;

a plurality of reactance devices mounted on the semiconductor substrate; and a means for changing an electrical connection of each of the plurality of reactance devices.

According to another aspect of this invention, a film bulk acoustic wave device may include:

a semiconductor substrate;

a ground conductor layer mounted on the semiconductor substrate;

a piezoelectric ceramic thin film mounted on the ground conductor layer;

a conductive electrode pattern mounted on the piezoelectric ceramic thin film; and an active device circuit that provides a variable capacitive reactance, mounted on the semiconductor substrate.

According to another aspect of this invention, a method of manufacturing a film bulk acoustic wave device may include the steps of:

(a) forming a ground conductor layer on a semiconductor substrate;

(b) forming a piezoelectric ceramic thin film of one of lead titanate and lead titanate-zirconate (PZT) on the ground conductor layer; and (c) forming a conductive electrode pattern on the piezoelectric ceramic thin film.

DESCRIPTION OF THE PREFERRED EMBODIMENTS

Embodiment 1

Figure 1:
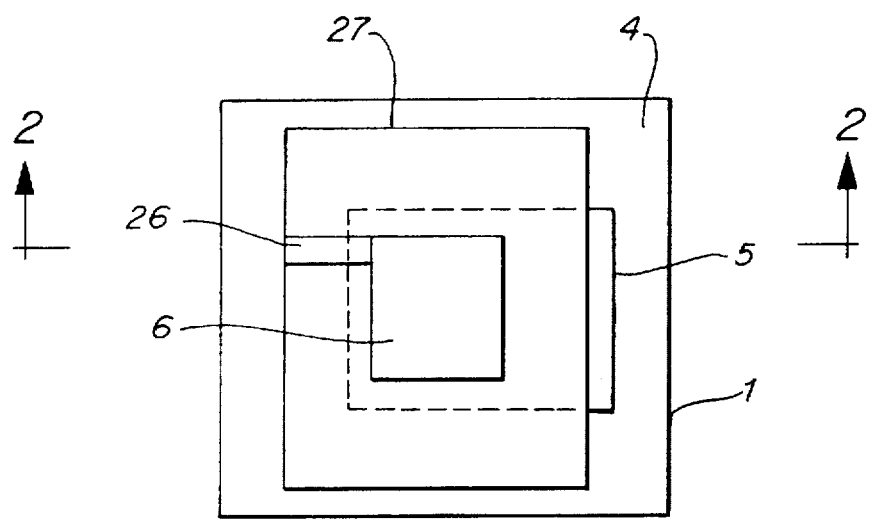
FIG. 1 shows an upper-side view of a bulk ultrasonic wave resonator of Embodiment 1 of this invention.
Figure 2:
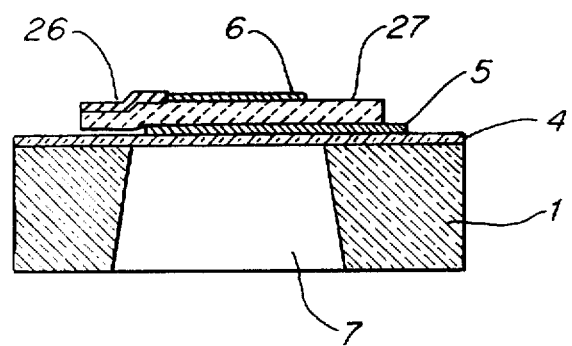
FIG. 2 shows a transverse cross sectional view of the bulk ultrasonic wave resonator of Embodiment 1 of this invention.

FIGS. 1 and 2 show a bulk ultrasonic wave resonator according to Embodiment 1 of this invention. FIG. 1 shows an upper-side view and FIG. 2 shows a D—D cross sectional view. In the figure, a semiconductor substrate 1 is mainly composed of silicon (Si), gallium arsenide (GaAs) or tantalum oxide ($Ta_2O_5$). A dielectric substance 4 is mainly composed of silicon oxide ($SiO_2$), silicon nitride (SiN) or tantalum oxide ($Ta_2O_5$). A ground conductor 5 is such as platinum (Pt) or gold (Au). A top-side electrode 6 is one of metals like platinum (Pt), gold (Au), copper (Cu), aluminum (Al), titanium (Ti), tungsten (W) and so forth. The top-side electrode 6 may be a semiconductor layer of high conductivity in which impurity density is high. The top-side electrode 6 may be one of materials of high conductivity like polysilicon. A via hole 7 is provided. A piezoelectric ceramic thin film or a piezoelectric thin film 27 is mainly composed of lead titanate ($PbTiO_3$). Hereinafter, a bulk ultrasonic wave resonator means a device which generates resonance by using an acoustic wave. A bulk ultrasonic wave filter means a device which operates as a filter consisting of a plurality of bulk ultrasonic wave resonators. A bulk acoustic wave device means a bulk ultrasonic wave resonator or a bulk ultrasonic wave filter, and includes the other circuit components on the same semiconductor substrate 1.

In conventional bulk ultrasonic wave resonators, there is a dielectric substance 4 on the semiconductor substrate 1, the ground conductor 5 on the dielectric substance 4, the piezoelectric thin film 27 on the ground conductor 5, a top-side electrode 6 on the piezoelectric thin film 27 and a via hole 7 formed in the semiconductor substrate 1 corresponding to a place where the top-side electrode 6 located. An area of the via hole 7 is bigger than an area of the top-side electrode 6.

In the bulk ultrasonic wave resonator according to embodiments of the present invention, the piezoelectric material mainly composed of lead titanate ($PbTiO_3$) is used for the piezoelectric thin film 27. When a thickness of the ground conductor 5 is set to be d, a thickness of the piezoelectric thin film is set to be h and a wave number of the acoustic waves propagated in the parallel direction of the surface of the piezoelectric thin film 27 is assumed to be k, k×h is or less than 2 or d/h is or less than 0.1. The thickness of the top-side electrode 6 can be d or the other.

The bulk ultrasonic wave resonator according to this invention uses lead titanate ($PbTiO_3$) for the piezoelectric thin film 27. Lead titanate ($PbTiO_3$) has an electromechanical coupling constant $k^2$ of more than twice that of zinc oxide (ZnO) and aluminum nitride (AlN) which previously have been used in this type of bulk ultrasonic wave resonator. The relative dielectric constant of lead titanate ($PbTiO_3$) is several hundred, which is rather small, compared to that of lead titanate-zirconate (PZT) which exceeds 1000.

Since a number of constituent elements of lead titanate is fewer than that of lead titanate-zirconate (PZT), the variation of characteristics caused by a film formation, are few.

In the film formation of lead titanate ($PbTiO_3$), the semiconductor substrate 1 needs to be heated with a high temperature of above several hundred degrees celsius so as to obtain a well-qualified film. Hence, a specific element in the semiconductor substrate 1 is deposited. Deterioration of film or inferiority of forming a film are sometimes caused. Especially, when gallium arsenide (GaAs) is used for the semiconductor substrate 1, there is a danger of depositing arsenic (As). To prevent this, it is important to cover the surface of the semiconductor substrate 1 with a dielectric substance 4 of silicon oxide ($SiO_2$), silicon nitride (SiN) or tantalum oxide ($Ta_2O_5$).

Especially, silicon nitride (SiN) prevents deposition of arsenic (As) and the like. Since lead titanate ($PbTiO_3$) which is directly layered on silicon nitride (SiN) does not show piezoelectricity, it is quite effective to utilize silicon nitride (SiN) so as to restrict the resonance area only to an area where the ground conductor 5 is formed.

On the other hand, when lead titanate ($PbTiO_3$) is directly layered on silicon oxide ($SiO_2$), the film quality of lead titanate ($PbTiO_3$) does not vary at the boundary of silicon oxide ($SiO_2$). Therefore, silicon oxide ($SiO_2$) is especially appropriate in a case where a plurality of bulk ultrasonic wave resonators like filters are closely arranged.

Tantalum oxide ($Ta_2O_5$) is mechanically stronger than silicon nitride (SiN) and silicon oxide ($SiO_2$).

Accordingly, it is appropriate in a case where mechanical strength of silicon nitride (SiN) and silicon oxide ($SiO_2$) is not enough when the air-gap like a via hole is composed on the bottom side of the dielectric substance 4 and the dielectric substance 4 supports the piezoelectric thin film 24.

The dielectric substance 4 excels in electric insulation. Even when the surface of the semiconductor substrate 1 has a relatively high conductivity, it is possible to separate the potential of the ground conductor 5 due to the existence of the dielectric substance 4.

Because the piezoelectric thin film 27 contains oxygen, it must be formed in an oxygen ambience having high temperature and high chemical reactivity. Therefore, when the material of the ground conductor 5 has a low melting point or provides a high diffusibility at a high temperature or tends to be easily oxidized in an oxygen ambience under a high temperature, the ground conductor 5 deteriorates during forming of the piezoelectric thin film 27. There is a method of producing a protective film partially on the ground conductor 5 and the dielectric substance 4. However, the usual protective film deteriorates under conditions used for forming the piezoelectric thin film 27. Zinc oxide (ZnO) and aluminum nitride (AlN) which have been used in the conventional type of bulk ultrasonic wave resonator, need not produce a film under such high temperatures as to cause the deterioration of the ground conductor 5 and therefore, the above mentioned problems didn't occur. However, the piezoelectric thin film 27 of the bulk ultrasonic wave resonator according to this invention has a problem of the processing temperature being high. In order to solve the problem, platinum (Pt) or gold (Au), which have high chemical stability need to be used as the ground conductor 5. Especially, platinum (Pt) excels in resisting oxygen reactivity at high temperatures. Platinum which is layered on the smooth surface of the dielectric substance 4 is oriented towards <111>. Lead titanate ($PbTiO_3$) is a tetragonal crystal and polycrystal. Because the direction of polarization of each crystal right after forming a film is in disorder, the piezoelectricity is low. By applying the proper direct current voltage at above the required temperature to lead titanate ($PbTiO_3$), the disorderly direction of polarization can be arranged and the piezoelectricity gets high.

Figure 3:
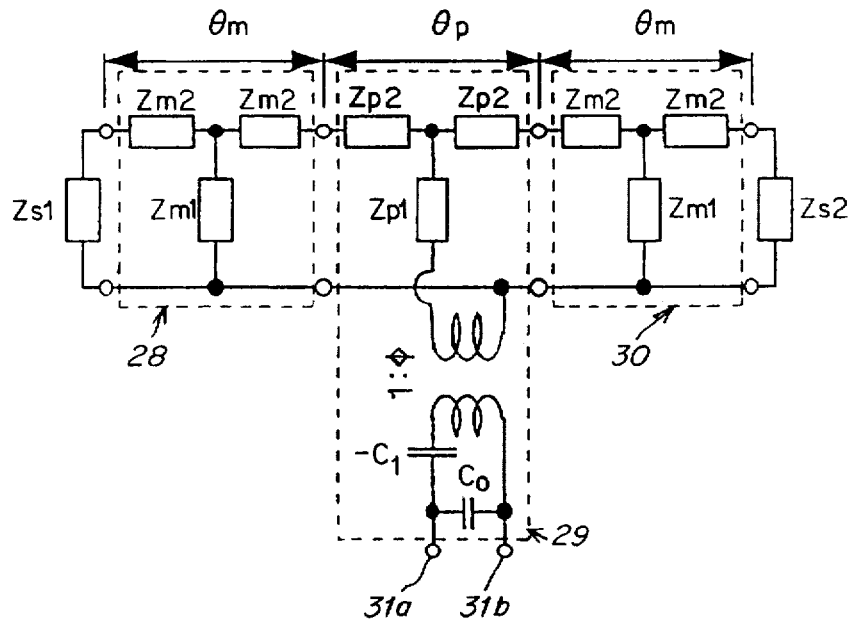
FIG. 3 shows an equivalent circuit of the bulk ultrasonic wave resonator.

Metals having a large specific gravity like platinum (Pt) and gold (Au) greatly affect the resonant frequency of the piezoelectric thin film 27 due to the mass load. FIG. 3 shows a view of an equivalent circuit of a triple layer structure composed of the ground conductor 5, the piezoelectric thin film 27 and the top-side electrode 6. To simplify the explanation, it is assumed that both of the ground conductor 5 and the top-side electrode 6 are platinum (Pt) and that their thickness is the same. In the figure, an equivalent circuit 28 corresponds to the top-side electrode 6. An equivalent circuit 29 corresponds to the piezoelectric thin film 27. An equivalent circuit 30 corresponds to the ground conductor 5. An electric terminal 31a corresponds to the top-side electrode 6. An electric terminal 31b corresponds to the ground conductor 5. In each equivalent circuit, an electric length $\theta_m$ corresponds to the thicknesses of the top-side electrode 6 or ground conductor 5 and an electric length $\theta_p$ corresponds to the thickness of the piezoelectric thin film 27. The boundary condition $Z_{s1}$ of the surface of the top-side electrode 6, the boundary condition $Z_{s2}$ Of the bottom side of the ground conductor 5 are treated as short-circuits. The equivalent circuit shown in FIG. 3 is disclosed in detail in the literature in "Supervised by Onoue, The Basics of Solid Oscillation Theory, issued on September, 1982, Ohmu-sha, Chapter 6, Piezoelectric Equation and the Application, pp. 115–157" (hereinafter, referred to as reference 14).

Figure 4:
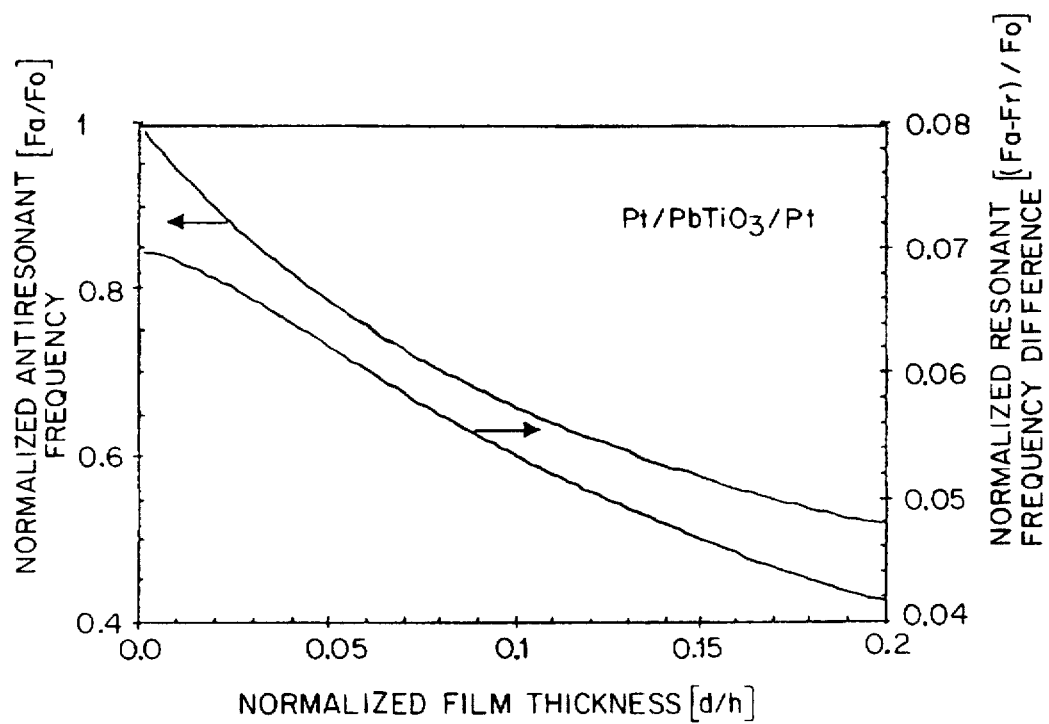
FIG. 4 shows a calculation result of antiresonant frequency and a difference between antiresonant frequency and resonant frequency.

FIG. 4 shows an example where the frequency $F_a$ in which the admittance estimated at the electric terminals 31a and 31b is zero and the frequency $F_r$ in which the impedance estimated at the electric terminals 31a and 31b is zero are calculated. The frequency $F_a$ corresponds to the antiresonant frequency. The frequency $F_r$ corresponds to the resonant frequency. In the figure, the horizontal axis is a normalized film thickness, which is a ratio of thickness d of the ground conductor 5 to thickness h of the piezoelectric thin film 27. The vertical axis on the left side is a normalized antiresonant frequency, which is a ratio of frequency $F_a$ to frequency $f_0$ whereat thickness h of the piezoelectric thin film 27 is equal to half wave length of the acoustic wave. The vertical axis on the right side is a normalized resonant frequency difference, which is a ratio of the difference between the frequencies $F_a$ and $F_r$ to frequency $f_0$ whereat the thickness h of the piezoelectric thin film 27 is half wave length of the acoustic wave. The material constants used in the calculation are as follows: As to the lead titanate ($PbTiO_3$), the density $\rho$ is 7700($kg/m^3$), the elastic constant $c_{33}$ is $13.2 \times 10^{10}$ ($N/m^2$), the piezoelectric constant $e_{33}$ is 6.52($C/m^2$), the relative dielectric constant $\epsilon_{33}$ is 190. As to platinum (Pt), the density $\rho$ is 21300 ($kg/m_3$), the elastic constant $c_{33}$ is $30.9 \times 10^{10}$ ($N/m^2$). The above mentioned material constants are the values examined not in the thin film but in the bulk material. Therefore, in a case where the thin film is formed, the material constants may be different from the above values. The values change according to methods and conditions for forming films with lead titanate ($PbTiO_3$) and platinum (Pt). The values change according to the kinds of impurity added to lead titanium ($PbTiO_3$) and the addition ratio.

When the normalized film thickness is enlarged, both the normalized antiresonant frequency and the normalized resonant frequency difference are small. This is because the mass load of the top-side electrode 6 and the ground conductor 5 increases when the normalized film thickness is large. The density of platinum (Pt) or gold (Au) is relatively large, compared to that of other metal materials. Therefore, the amount of deterioration of the normalized antiresonant frequency and the normalized resonant frequency difference is large compared to the normalized film thickness. The normalized resonant frequency difference is a value which determines a maximum value of the adjustment range of the oscillating frequency of an oscillator using a bulk ultrasonic wave resonator. The normalized resonant frequency difference is also a value which determines the maximum value of the adjustment range of the fluctuation of the resonant frequency and the antiresonant frequency of the bulk ultrasonic wave resonator or filter caused by manufacturing errors. When the normalized film thickness is 0, and the affect of the mass load of the top-side electrode 6 and the ground conductor 5 is ignored, the normalized resonant frequency difference is about 8%. On the other hand, when the normalized film thickness is 0.2, the normalized resonant frequency difference is about 4%. This value is similar to that of zinc oxide (ZnO) used in conventional bulk acoustic wave devices. Therefore a large value of an electromechanical coupling constant of lead titanate ($PbTiO_3$) cannot be used appropriately. Namely, by setting the normalized film thickness (d/h) to be less than 0.1, the value of the electromechanical coupling constant can be above 5% and it is possible to obtain a larger value of the electromechanical coupling constant than the conventional type of bulk acoustic wave device.

Figure 5:
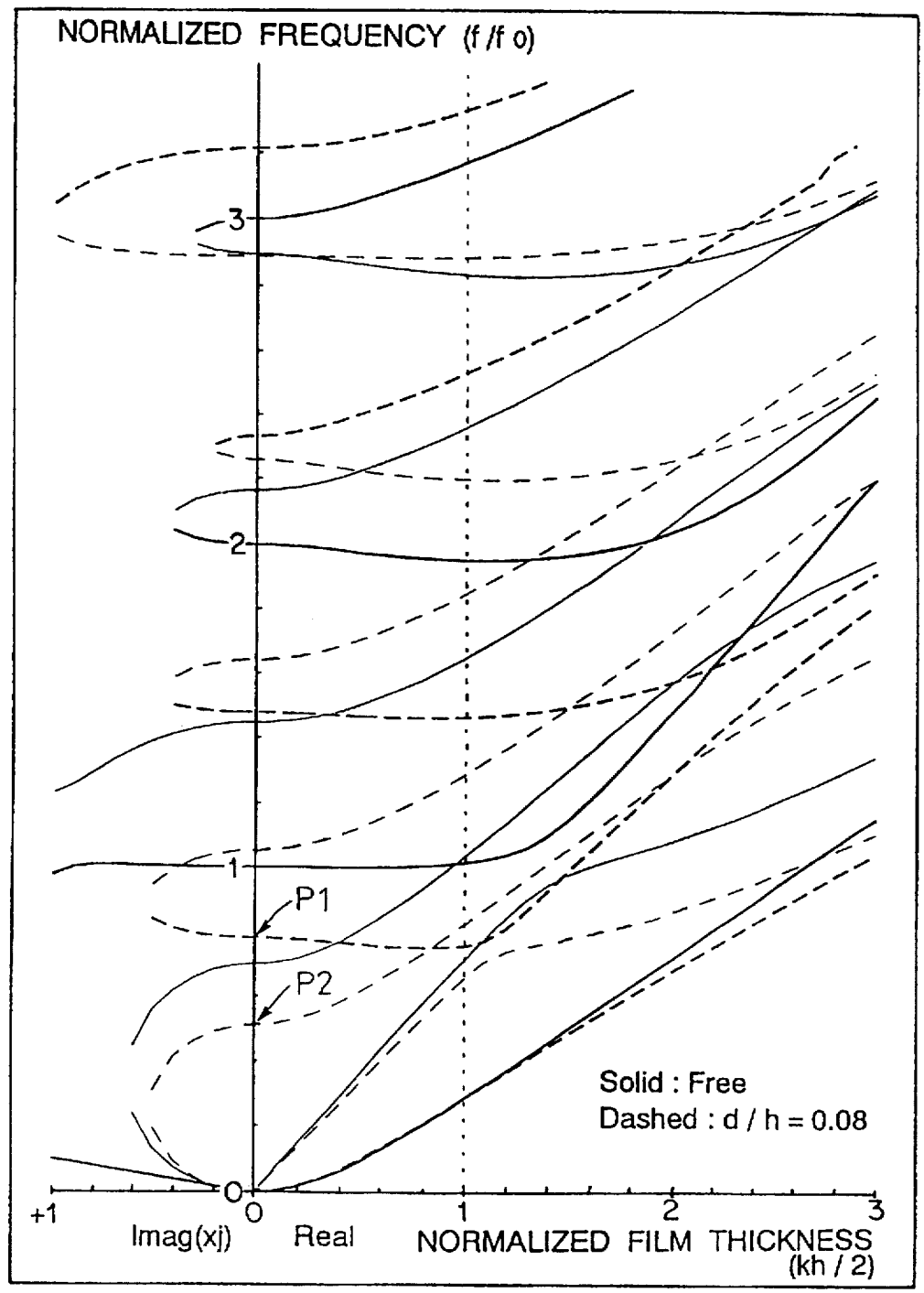
FIG. 5 shows an example of a calculation result of dispersion characteristic of Embodiment 1.
Figure 6:
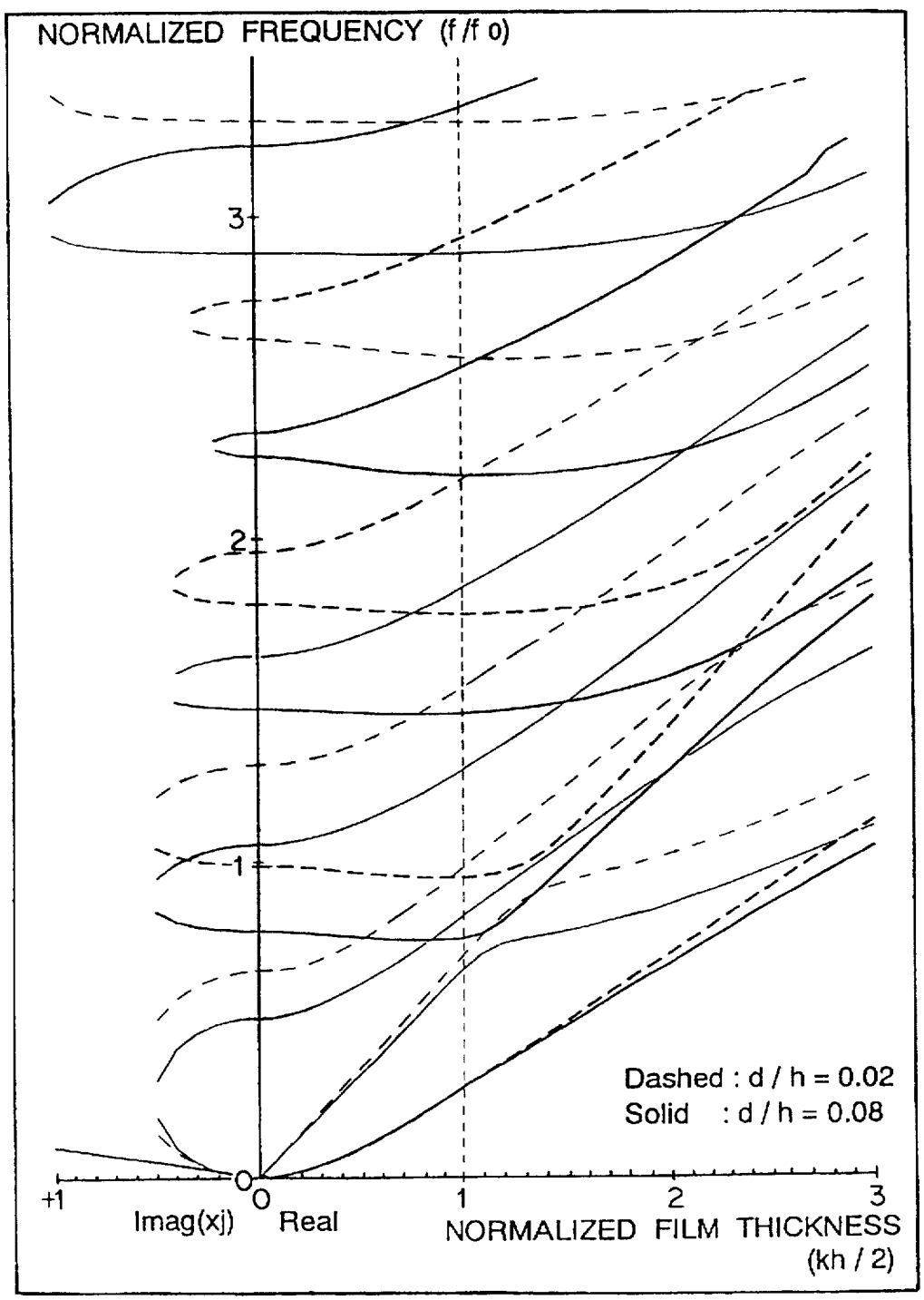
FIG. 6 shows another example of a calculation result of dispersion characteristic of Embodiment 1.

FIGS. 5 and 6 show an example of a dispersion characteristic calculated result of an acoustic wave which propagates in the lead titanate (PbTiO₃) thin film according to Embodiment 1 of this invention. FIGS. 5 and 6 show a calculated result of the acoustic wave that propagates parallel to the surface of the lead titanate (PbTiO₃) thin film and contains an amplitude component vertical to the surface of the lead titanate (PbTiO₃) thin film and an amplitude component parallel to the direction of the thickness. The wave number of the acoustic waves is k, the thickness of the lead titanate (PbTiO₃) thin film is h and the frequency in which the thickness h of the lead titanate (PbTiO₃) thin film is equal to a half wave length is $f_0$. The horizontal axis is the normalized film thickness of the lead titanate (PbTiO₃) thin film (kh/2) and the vertical axis is the normalized frequency (f/$f_0$). The right side of the vertical axis is an area where the value of the normalized film thickness is a real number. The left side of the vertical axis is an area where the value of the normalized film thickness is an imaginary number. When the value of the normalized film thickness is a real number, the acoustic wave can propagate. On the other hand, when the value of the normalized film thickness is an imaginary number, the acoustic wave cannot propagate. In FIG. 5, the solid line shows the dispersion characteristic in the case there is only one layer of the lead titanate (PbTiO₃) thin film and the dashed line shows the dispersion characteristic in the case of a triple layer in which the platinum (Pt) layers, whose normalized thickness (d/h) is 0.08, are positioned on both sides of the lead titanate (PbTiO₃) thin film. In FIG. 6, the solid line shows the same dispersion characteristic in the case of a triple layer in which the platinum (Pt) layers, whose normalized thickness (d/h) is 0.08 are positioned on both sides of the lead titanate (PbTiO₃) as shown by the dashed line in FIG. 5. The dashed line shows the dispersion characteristic in the case of a triple layer where the platinum (Pt) layers whose normalized thickness (d/h) is 0.02 are positioned on both sides of the lead titanate (PbTiO₃) thin film. The calculation is according to the method described in reference 8.

In FIGS. 5 and 6, when values on the vertical axis of the acoustic wave are proportional to values on the horizontal axis of the acoustic wave, the propagation velocity of the acoustic wave is constant. An inclination of the above proportional straight line is determined by the propagation velocity of the acoustic wave and the thickness h of the lead titanate (PbTiO₃) thin film. The calculated values of each dispersion characteristic in FIGS. 5 and 6 does not show a straight line. This means that the propagation velocity of the acoustic wave varies according to the thickness h of the lead titanate (PbTiO₃) thin film and the frequency f.

For example, in the bulk ultrasonic wave resonator shown in FIG. 2, it is assumed that the dielectric substance 4 can be substantially ignored for elastic vibration. In the case of the triple structure of the top-side electrode 6, the piezoelectric thin film 27 and the ground conductor 5, the dispersion characteristics as shown in the dashed line of FIG. 5 come to be modes of the acoustic wave existable in the triple layer structure. In the case of thickness resonance wherein the acoustic wave propagates only in the direction of thickness, a crossing point of each mode of the acoustic wave and the vertical axis corresponds to the thickness resonance. The values at crossing points of the solid and dashed lines in FIG. 5 and the vertical axis and at crossing points of the solid and dashed lines in FIG. 6 and the vertical axis get small when the thicknesses d of the top-side electrode 6 and the ground conductor 5 get large. This indicates that the resonant frequency gets lower with increases of the thicknesses of the top-side electrode 6 and the ground conductor 5. In FIG. 5, the solid line shows a characteristic in a case where there are no other components on the surface of the piezoelectric thin film 27. When modes shown in the solid line are located in the left side of the vertical axis near the normalized frequency (f/$f_0$), where the dashed line crosses the vertical axis, the acoustic wave can propagate in the direction parallel to the piezoelectric thin film 27 where the top-side electrode 6 and the ground conductor 5 are not located. This corresponds to an excitation of an unnecessary acoustic wave for the bulk ultrasonic wave resonator shown in FIG. 2 and a quality factor Q of the resonator deteriorates. As to modes shown in the dashed line, when modes of the acoustic wave to propagate in the direction parallel to the surface of the piezoelectric thin film 27 exist near the normalized frequency (f/$f_0$), wherein the dashed line crosses the vertical axis, the acoustic wave that propagates parallel to the surface of the piezoelectric thin film 27 can exist where the top-side electrode 6 and the ground conductor 5 are located. As a result, spurious, which is undesirable to the resonator, is caused.

When the bulk ultrasonic wave filter is composed, the similar situations can be predicted. The bulk ultrasonic wave filter which electrically connects the bulk ultrasonic wave resonators is affected by the spurious of the bulk ultrasonic wave resonator. The bulk ultrasonic wave resonator which lays out the bulk ultrasonic wave resonator closely and uses the energy trapping resonance of a symmetry mode and an asymmetry mode between a plurality of top-side electrodes 6 causes spurious when the acoustic wave of a different propagation mode exists near the normalized frequency. As a result, characteristics as the bulk ultrasonic wave filter deteriorates. In FIGS. 5 and 6, when the normalized film thickness (kh) is above 2, there exist various modes at the same normalized frequency (f/$f_0$), which will cause spurious. Therefore, the normalized film thickness (kh) needs to be less than 2 in order to realize a well-characterized bulk ultrasonic wave resonator and filter.

Figure 7:
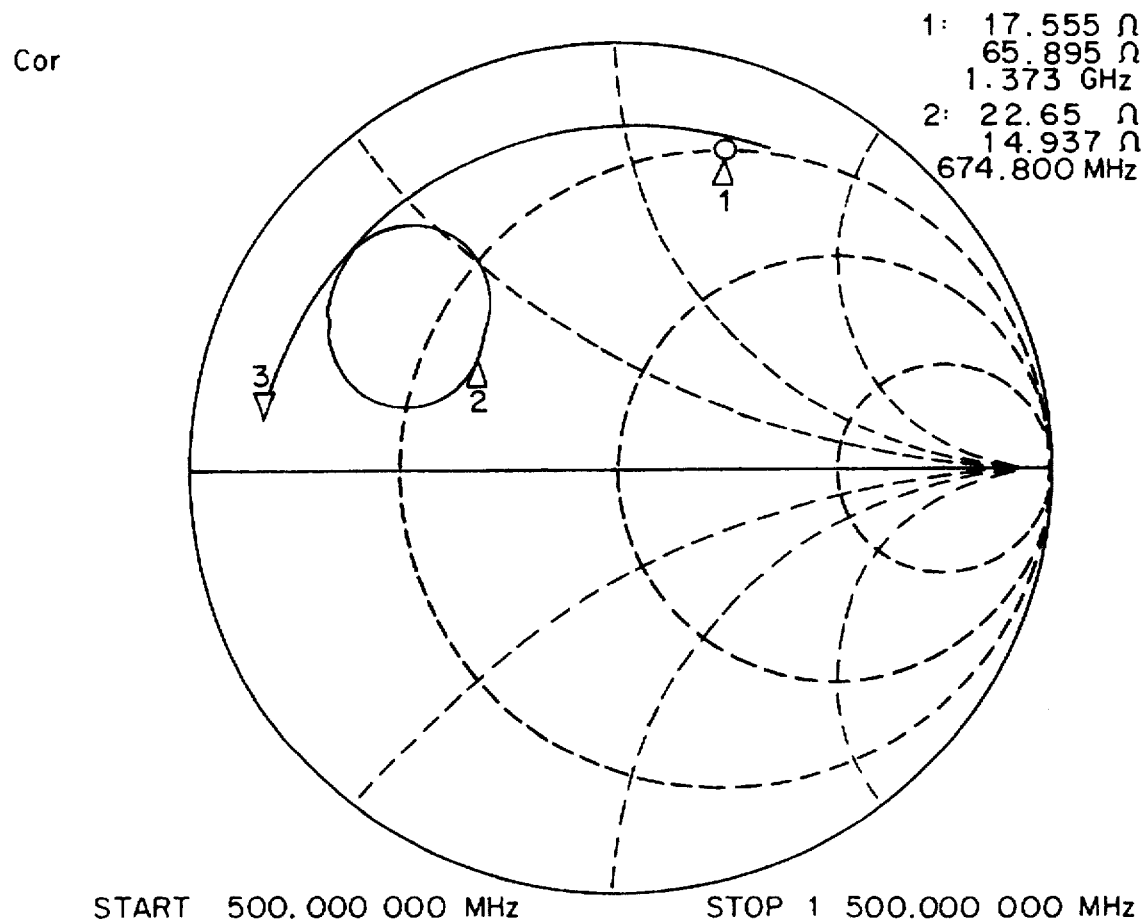
FIG. 7 shows a measurement result of impedance of the bulk ultrasonic wave resonator of Embodiment 1 before polarization.
Figure 8:
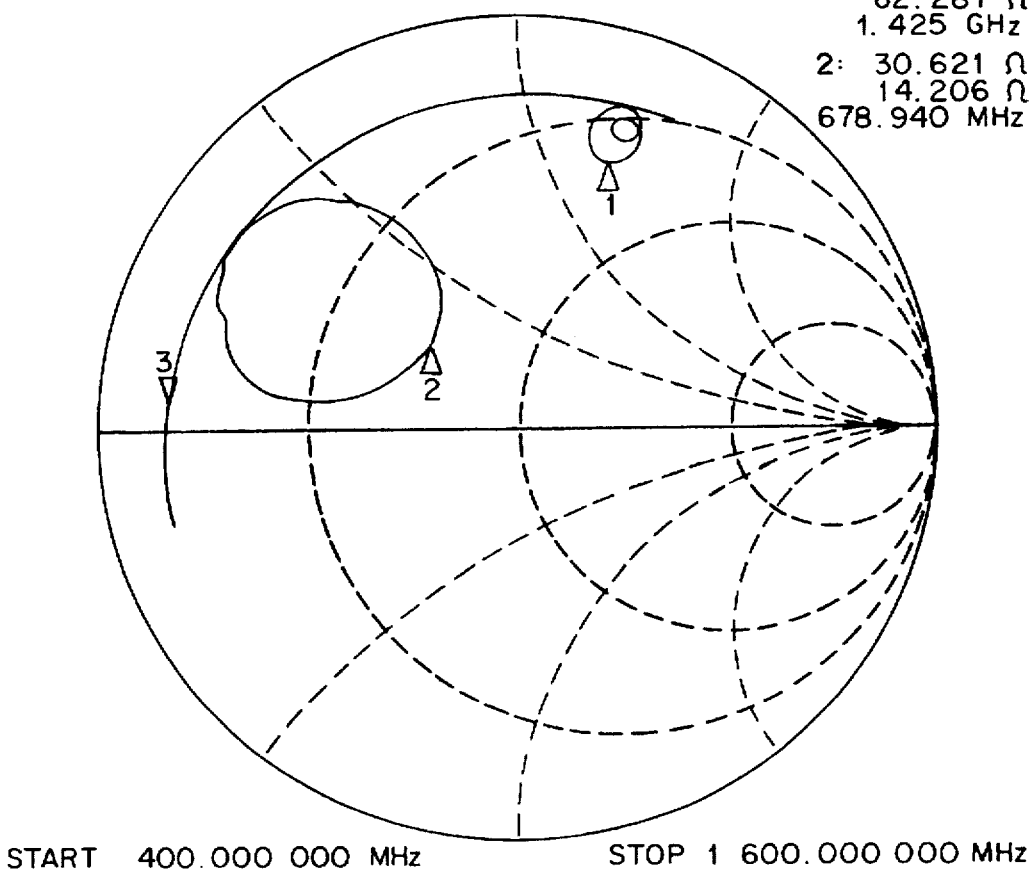
FIG. 8 shows a measurement result of impedance of the bulk ultrasonic wave resonator of Embodiment 1 after polarization.

FIGS. 7 and 8 show impedance measurement results of the an experimental bulk ultrasonic wave resonator configured in accordance with FIGS. 1 and 2. FIG. 7 is a measurement result before polarization and FIG. 8 is a measurement result after polarization. The piezoelectric thin film 27 uses lead titanate (PbTiO₃) and the thickness h is about 1 µm. The top-side electrode 6 and the ground conductor 5 use platinum (Pt) of about 0.07 µm thick, which has a titanium ground of about 0.03 µm thick, and used an air-bridge as a lead of the top-side electrode 6 and the bonding pad. In the bonding pads of the top-side electrode 6 and the ground conductor 5, a layer of gold (Au) of about 3 µm thick is composed. The dielectric substance 4 is silicon oxide (SiO₂) of about 0.1 µm thick. During polarization process, a direct current voltage of 15 Volts is applied for about an hour under the condition that the bulk ultrasonic wave resonator is heated at 200 centigrade.

FIG. 7 shows the piezoelectricity characteristics before polarization. When the value of the plate thickness is relatively large, compared to the particle size of the piezoelectric ceramics, the direction of polarization of each particle is in disorder before polarization and there is little indication of piezoelectricity. In the case of the bulk ultrasonic wave resonator shown in FIG. 7, the piezoelectric ceramics is thin film. Therefore, the direction of polarization of each particle can be arranged even before polarization. A comparison of characteristics after polarization shown in FIG. 8 with the characteristics before polarization shown in FIG. 7, the resonance circle gets larger after polarization and the piezoelectricity also increases because of the polarization. The resonance occurs in two frequency bands and the frequency indicated by marker 1 (shown as Δ1) is about 1.4 GHz and the frequency indicated by marker 2 (Δ2) is about 700 MHz.

The thickness of the lead titanate (PbTiO$_3$) thin film of the experimental bulk ultrasonic wave resonator is about 1 μm and the frequency $f_0$ wherein the thickness is equal to a half wave length of the acoustic wave is about 2 GHz. The normalized frequency of marker 1 is about 0.7 (=1.4 GHz/2 GHz) and the normalized frequency of marker 2 is about 0.4 (=700 MHz/2 GHz). On the other hand, according to the calculated result shown in FIG. 5, a dispersion curve shown in the dashed line which crosses the vertical axis at point P1 with a little smaller normalized frequency than the normalized frequency of 0.8 is a vertical wave that propagates in the direction of thickness of the lead titanate (PbTiO$_3$) thin film. This corresponds to the resonance around the normalized frequency of about 0.7 denoted by marker 1 in FIGS. 7 and 8. The differences between the calculated results and the measured normalized frequencies is because the material constant used for the calculation and the film thickness differ a little from those of the experimental bulk ultrasonic wave resonator. The dispersion curve shown in the dashed line crossing the vertical axis at point P2 of FIG. 5 with the normalized frequency of about 0.5 corresponds to resonance around the normalized frequency of about 0.4 denoted by marker 2. This shows an acoustic wave that propagates in a direction parallel to the surface of the lead titanate (PbTiO$_3$) thin film. The frequency of an acoustic wave having the same mode shown in the solid line in a case where no metals are provided on the surface of the lead titanate (PbTiO$_3$) thin film is a cutoff frequency in the same normalized film thickness (kh/2). Therefore, it corresponds to the energy trapping resonance, which resonates between both ends of the top-side electrodes 6. The top-side electrode 6 of the experimental bulk ultrasonic wave resonator is 100×100 μm square and the wave length is 200 μm. Accordingly, when the thickness of the lead titanate (PbTiO$_3$) thin film is assumed to be 1 μm, the normalized film thickness (kh/2) is as follows.

expression 10:

$$kh/2 = \frac{2\pi}{\lambda} \cdot \frac{h}{2} = \frac{\pi h}{\lambda} \approx 0.016$$

The expression shows that resonance occurs at the normalized film thickness (kh/2) which is a little to the right of the vertical axis depicted in FIG. 5. According to the measurement of the experimental bulk ultrasonic wave resonator, there is no unnecessary spurious around the frequency of the normalized film thickness and a well-qualified resonance characteristic is shown. In addition, the relative dielectric constant is about 200 based on the measurements of the experimental bulk ultrasonic wave resonator.

Lead titanate (PbTiO$_3$) used in the bulk acoustic wave device according to this invention shows weak piezoelectricity unless a polarization process is performed. In the conventional type of bulk ultrasonic wave resonator, a portion of the piezoelectric thin film 27 where the lead electrode 26 and the ground conductor do not overlap has almost the same piezoelectricity as the portion of the piezoelectric thin film 2 where the top-side electrode 6 and the ground conductor 5 overlap. As a result, it causes unnecessary spurious. In the piezoelectric thin film 27 of the bulk acoustic wave device according to this invention, when a direct electric field above a required value is not applied during the polarization process, the portion where the lead electrode 26 and the ground conductor 5 don't overlap does not have as strong piezoelectricity as the overlapping portion of the top-side electrode 6 and the ground conductor 5. Therefore, the portion of piezoelectric thin film 27 in which the lead electrode 26 and the ground conductor 5 do not overlap has weak piezoelectricity and a large spurious, as in the conventional type of bulk ultrasonic wave resonator is not caused.

The value of the relative dielectric constant of lead titanate (PbTiO$_3$) used in the bulk acoustic wave device of this invention is several hundred. The size of the top-side electrode 6 for which the capacity $C_0$ is 50 Ω around the frequency of 2 GHz, when the relative dielectric constant is 200, is about 30×30 μm square. The error of the capacity of the electrodes according to the error in size of the top-side electrode 6 can be 30% more than the equivalent error when lead titanate-zirconate (PZT) of about 13×13 μm square to 19×19 μm square is used as in conventional bulk acoustic wave devices.

As has been described, the bulk acoustic wave device according to Embodiment 1 of this invention has an electromechanical coupling constant k$^2$ above 5% and no spurious, by setting the normalized film thickness (kh) to be equal to or less than 2 or the normalized film thickness (dh) to be equal to or less than 0.1. Because of the polarization process used for the piezoelectric thin film 27, it is possible to restrict the portion of the piezoelectric thin film 27 having piezoelectricity. Therefore, it is possible to reduce spurious occurring in the portion unrelated to the elastic resonance like the portion corresponding to lead electrode 26. Because, the electromechanical coupling constant k$^2$ above 5% electrical adjustment can be performed after manufacturing devices having the thin film by setting each thin film to have a variation of characteristics caused by a film formation of about several %, which is within the region of being managed. It means that it is not required that the devices are respectively adjusted during the semiconductor manufacturing process. Hence, it is possible to manufacture bulk acoustic wave devices in mass productivity. Since the steps unsuitable for the semiconductor manufacturing process can be avoided, it is further possible to manufacture devices together with a large scale integrated semiconductor circuit. Furthermore, it is possible to integrate each semiconductor device which was conventionally manufactured with divided into one semiconductor chip and to downsize the whole electric apparatus.

Embodiment 2

Figure 9:
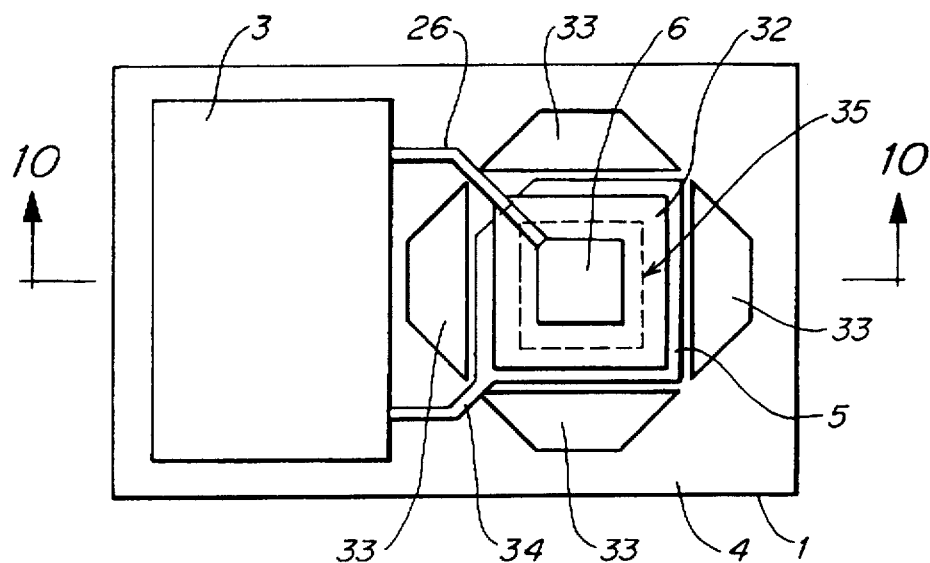
FIG. 9 shows an upper-side view of a film bulk acoustic wave device of Embodiment 2 of this invention.
Figure 10:
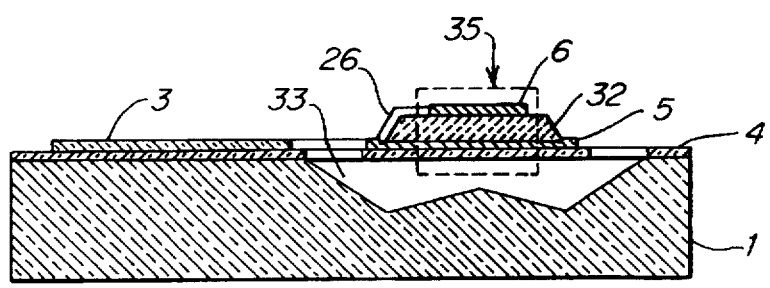
FIG. 10 shows a transverse cross sectional view of the film bulk acoustic wave device of Embodiment 2 of this invention.

FIGS. 9 and 10 show a bulk acoustic wave device according to Embodiment 2 of this invention. FIG. 9 shows an upper-side view and FIG. 10 shows an E—E cross sectional view. In the figure, lead titanate-zirconate (PZT) 32, a via hole 33, a lead electrode 34 from the ground conductor 5, and a bulk ultrasonic wave resonator 35 are provided.

The structure of the bulk ultrasonic wave resonator 35 shown in FIGS. 9 and 10 differs from that of the bulk ultrasonic wave resonator according to Embodiment 1 shown in FIG. 2. The via hole 33 is formed by using anisotropy etching from the side of lead titanate-zirconate (PZT) on the semiconductor substrate 1. However, the structure which causes elastic resonance as the bulk ultrasonic wave resonator 35 is basically the same as that of FIG. 2. The ground conductor 5 is on the dielectric substance 4. The piezoelectric substance, that is, lead titanate-zirconate (PZT) 32 is on the ground conductor 5. Top side electrode 6 is on lead titanate-zirconate (PZT) 32. The ground conductor 5 is electrically connected to a semiconductor circuit 3 through the lead electrode 26. In the structure shown in FIG. 10, the dielectric substance 4 supports the bulk ultrasonic wave resonator 35. If the dielectric substance is running short of mechanical strength, then the lead titanate-zirconate (PZT) 32 becomes warped and the resonance characteristics of the bulk ultrasonic wave resonator deteriorates. In this case, the dielectric substance mainly composed of tantalum oxide ($Ta_2O_5$) is most suitable.

Lead titanate-zirconate (PZT) 32 is a polycrystal substance like lead titanate oxide ($PbTiO_3$) of the bulk ultrasonic wave resonator in Embodiment 1. After film formation, the direction of polarization of each crystal is in disorder and strong piezoelectricity is not shown. The disorderly direction is arranged by giving proper direct current voltage to lead titanate-zirconate (PZT) 32 at an elevated temperature. As a result, a stronger piezoelectricity can be achieved. The electromechanical coupling constant $k^2$, the dielectric constant, and Q of lead titanate-zirconate (PZT) 32, vary according to the composition ratio of lead zirconate ($PbZrO_3$) and lead titanate ($PbTiO_3$). It is disclosed in the literature in "Acoustic wave Device Technology Handbook, edited by the Japan Society for the Promotion of Science, Acoustic wave Device Technology the 150th Committee, issued by Ohmu-sha, the 1st edition, issued on Nov. 30, 1991, Volume IV, Acoustic wave Material, Chapter 2, Method of Manufacturing Materials and Material Constant, pp. 280 to 329" (hereinafter, referred to as reference 15). As described in reference 15 the usual bulk material, lead titanate-zirconate (PZT) shows a phase transition when the compounding ratio of lead zirconate ($PbZrO_3$) to lead titanate ($PbTiO_3$) is around 52:48. When the compounding ratio of lead titanate ($PbTiO_3$) is smaller, lead titanate-zirconate (PZT) becomes a trigonal system. When the compounding ratio of lead titanate ($PbTiO_3$) is larger, it becomes tetragonal system and indicates a large electromechanical coupling constant $k^2$ around the compounding ratio where the phase transition appears.

For lead titanate-zirconate (PZT) 32, the processing temperature used when forming films is high and the film is formed in an oxide ambience. The ground conductor 5 needs to be chemically stable platinum (Pt) or gold (Au). Platinum (Pt) excels in chemical stability high temperatures. On the other hand, platinum (Pt) and gold (Au) have high density. As shown in a calculation example of FIG. 4, when the thickness d of the ground conductor 5 is enlarged, the difference between the antiresonant frequency $F_a$ and the resonant frequency $F_r$ gets small. Then, the large electromechanical coupling constant $k^2$ of the lead titanate-zirconate (PZT) 32 cannot be utilized efficiently. As shown in FIGS. 5 and 6, when the value of the product kh of the thickness h of lead titanate-zirconate (PZT) by the wave number k of acoustic waves is enlarged, unnecessary spurious is caused. Namely, in order to get the bulk ultrasonic wave resonator 35 having a required characteristic by using lead titanate-zirconate (PZT) 32, the normalized film thickness (kh) should be equal to or less than 2 or the normalized film thickness (d/h) should be equal to or less than 0.1.

Embodiment 3

Figure 11:
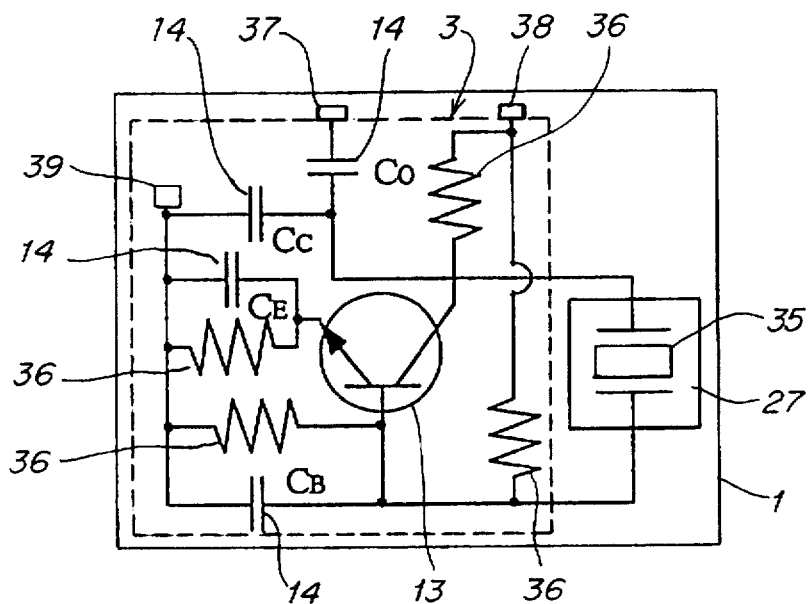
FIG. 11 shows the piezoelectric thin film oscillator of Embodiment 3 of this invention.

FIG. 11 shows a thin film piezoelectric oscillator according to Embodiment 3 of this invention. A bulk ultrasonic wave resonator 35 using lead titanate ($PbTiO_3$) is shown with a simplified form of the bulk ultrasonic wave resonator 35 shown in FIG. 9. A transistor 13 is an active device. The transistor 13 can be an electric field effect transistor even though the form of the bipolar transistor is shown as the transistor 13 in FIG. 11. Resistances 36 are composed in the semiconductor circuit 3 and condensers 14 are composed in the semiconductor circuit 3. An output terminal 37, a power supply terminal 38 and a ground terminal 39 are provided.

An oscillator circuit shown in FIG. 11 oscillates a wave having a frequency ω, in which admittance Y, condenser $C_B$ 14 and condenser $C_C$ 14 of the bulk ultrasonic wave resonator 35 satisfy expression 7. Hence, the bulk ultrasonic wave resonator 35 can oscillate within the frequency range which shows inductive reactance. The maximum value within the range of oscillation is between the antiresonance frequency and the resonant frequency. By using lead titanate ($PbTiO_3$) and setting the normalized film thickness (d/h) to be equal or less than 0.1, it is possible to set the difference of the antiresonant frequency and the resonant frequency to be more than 5% of frequency $f_o$ of which the film thickness h of lead titanate ($PbTiO_3$) is a half wave length. Further, it is possible to configure a well-characterized oscillator circuit which has no spurious. Furthermore, since lead titanate ($PbTiO_3$) is chemically stable, the oscillator circuit does not deteriorate through the manufacturing process of the semiconductor circuit 3 and the oscillator circuit is fabricated together with the semiconductor circuit 3 without deteriorating a yield rate.

Embodiment 4

Figure 12:
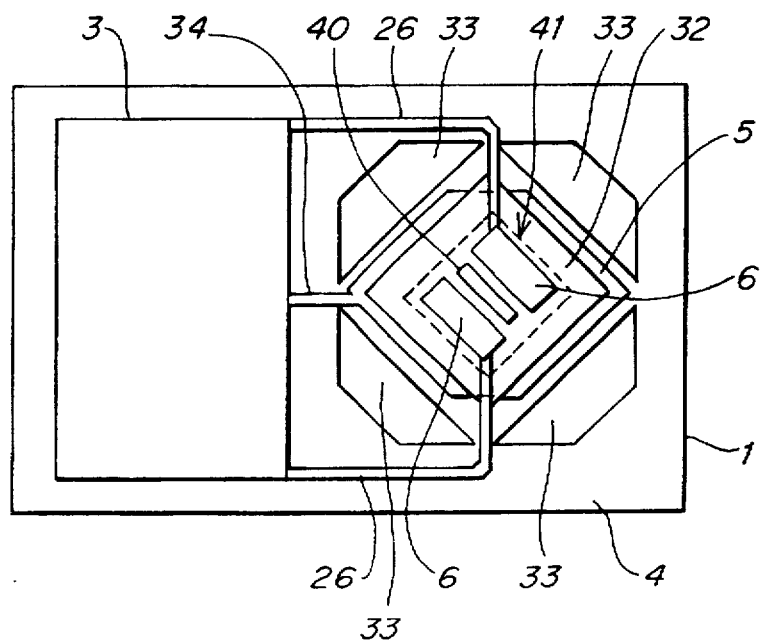
FIG. 12 shows a piezoelectric thin film amplifier of Embodiment 4 of this invention.
Figure 13:
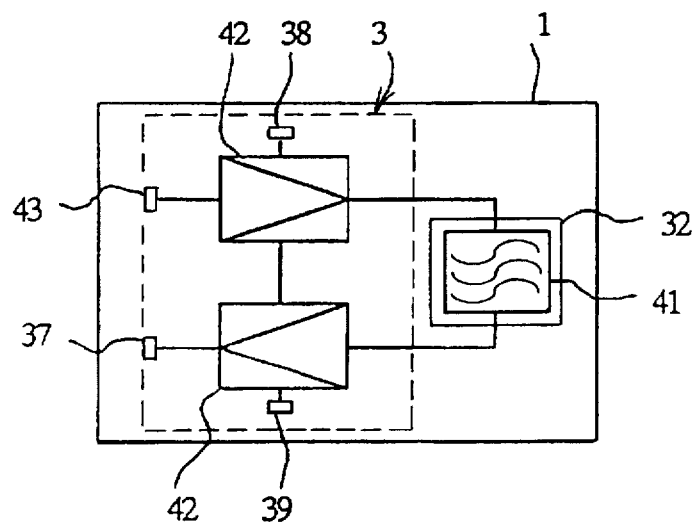
FIG. 13 shows the piezoelectric thin film amplifier of Embodiment 4 of this invention.

FIGS. 12 and 13 show a thin film piezoelectric amplifier according to Embodiment 4 of this invention. FIGS. 12 and 13 show the same thin film piezoelectric amplifier. FIG. 12 shows the structure. FIG. 13 shows the circuit configuration. In the figure, a top-side electrode 40, and a bulk ultrasonic wave filter 41 are provided. A semiconductor amplifier 42 is configured in the semiconductor circuit 3 and composed of an active circuit device like a transistor and a passive circuit device like a condenser, a resistance, an inductor, a transmission line or a stub. Further, an input terminal is provided.

The top-side electrode 6 is connected to the semiconductor amplifier 42 by a lead electrode 26. An elastic resonance occurs between the top-side electrode 40 and the top-side electrode 6 which has no connecting path with the external circuit directly. By setting each resonant frequency of a symmetry mode and an asymmetry mode appropriately, the bulk ultrasonic wave filter 41 operates as a band pass filter. The maximum value of the available band width is between the antiresonant frequency and the resonant frequency. Therefore, the bulk ultrasonic wave filter 41 using lead titanate-zirconate (PZT) 32 can expand the maximum value of the relative band $\{(F_a-F_r)/f_o\}$ by more than 20% in comparison with conventional filters previously discussed. The bulk ultrasonic wave filter 41 according to this invention uses platinum (Pt) or gold (Au) as the ground conductor. When forming films of lead titanate-zirconate (PZT) 32, the ground conductor is chemically stable. In addition, since the normalized film thickness (kh) is equal to or less than 2 or the normalized film thickness (d/h) is equal to or less than 0.1, it is possible to obtain the well-characterized thin film piezoelectric amplifier which has no spurious. Since lead titanate-zirconate (PZT) 32 is chemically stable, the bulk ultrasonic wave filter 41 is not deteriorated by the manufacturing process of the semiconductor circuit 3, and the bulk ultrasonic wave filter 41 is fabricated together with the semiconductor circuit 3 without deteriorating a yield rate.

Embodiment 5

Figure 14:
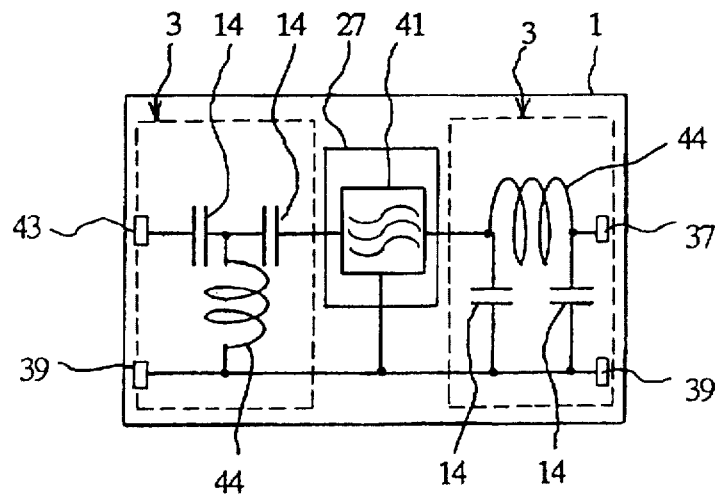
FIG. 14 shows a piezoelectric thin film filter of Embodiment 5 of this invention.

FIG. 14 shows a thin film piezoelectric filter according to Embodiment 5 of this invention. In the figure, a condenser 14, an inductor 44 are configurated as parts of the semiconductor circuit 3 on the semiconductor substrate 1. A bulk ultrasonic wave filter 41, as shown in FIG. 12, is configured on lead titanate ($PbTiO_3$).

It is appreciated that the bulk ultrasonic wave filter 41 is configurated to cohere with the characteristic impedance of the connected external circuit. However, considering the error in size of the top-side electrode 6 during manufacturing, coherency with the characteristic impedance is not always achieved. Also, because of design limitations, the bulk ultrasonic wave filter 41, configurated on lead titanate (PbTiO$_3$), does not show enough coherency with the characteristic impedance. In this case, in order to provide coherence with the characteristic impedance of the external circuit, the inductor 44, the condenser 14 and a coherent circuit using a passive circuit device like a transmission line or a stub need to be connected to the front and rear side of the bulk ultrasonic wave filter 41. By configuring the coherent circuit on the same semiconductor substrate 1 with the bulk ultrasonic wave filter 41, it is possible to configure a small and light filter which excels in the mass productivity. The bulk ultrasonic wave filter 41 uses lead titanate (PbTiO$_3$). Since the normalized film thickness (hk) is equal to or less than 2 or the normalized film thickness (d/h) is equal to or less than 0.1, it is possible to obtain a filter having a characteristic of wide band width in which there occurs no spurious.

Embodiment 6

Figure 15:
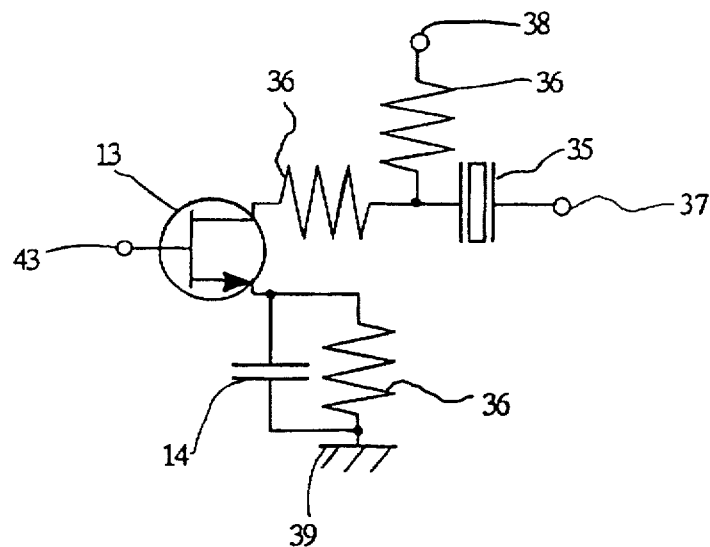
FIG. 15 shows the film bulk acoustic wave device of Embodiment 6 of this invention.

FIG. 15 shows a thin film piezoelectric device according to Embodiment 6 of this invention. FIG. 15 shows an example of an amplifier circuit using a transistor 13 and having an output terminal 37. A bias circuit and a coherent circuit on the side of the input terminal 43 are omitted in the figure.

In the amplifier, in general, the input and output impedance of the transistor 13 is different from the characteristic impedance of the external circuit. Therefore, each of the input and output terminals of the transistor 13 needs a coherent or matching circuit. Since the transistor has capacitive admittance in many cases, a coherent circuit having the inductive admittance can be used. An inductor, a transmission line or a stub may be used in the coherent circuit. The size of a transmission line and a stub used in a coherent circuit depends on the wave length of an electromagnetic wave having an expected frequency excited in the semiconductor substrate where the semiconductor circuit is configured. When the frequency is relatively low, the region required for a transmission line and a stub gets large and the area of the semiconductor chip required to configure the amplifier gets large. As a result, there is a problem that the cost for manufacturing the semiconductor chip rises and the semiconductor cannot be configured in the actual chip area. In many cases, in the frequency band where the frequency is less than around 1 to 2 GHz, an inductor is used as a device to provide inductive admittance. However, in the inductor, compared to the transistor 13 and the condenser 14, a relatively larger area in the semiconductor circuit is needed. Further, when the line width is made narrow and the line density is raised in order to make the area of the inductor small, the resistance component of the inductor becomes large and the loss of the inductor increases. Accordingly, it is difficult to downsize the inductor and, consequently, the area of the semiconductor chip becomes large and the cost for manufacturing the semiconductor chip rises.

On the other hand, the bulk ultrasonic wave resonator 35 using the piezoelectric ceramics such as lead titanate (PbTiO$_3$) and lead titanate-zirconate (PZT) can be configured on the same semiconductor substance with the semiconductor circuit parts such as a transistor 13, a condenser 14 and a resistance 36. In addition, the occupying area is less than several hundreds μm square, which is relatively small in comparison with the area of an inductor. Further, since lead titanate and lead titanate-zirconate (PZT) have a relatively large electromechanical coupling constant in comparison with that of zinc oxide (ZnO) and aluminum nitride (AlN), it is possible to exhibit inductive reactance over a wide frequency band. Then, it is possible to use lead titanate (PbTiO$_3$) and lead titanate-zirconate (PZT) as an inductance in all the band required by the usual semiconductor circuit. As a result, it is possible to make the area of the whole semiconductor circuit including the bulk ultrasonic wave resonator 35 small and reduce the manufacturing cost.

Embodiment 7

Figure 16:
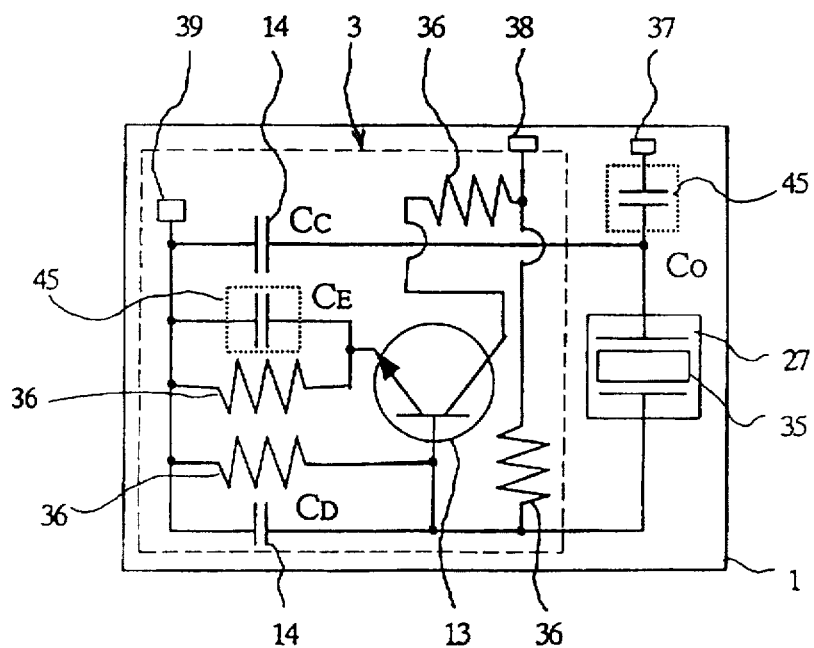
FIG. 16 shows the piezoelectric thin film oscillator of Embodiment 7 of this invention.
Figure 17:
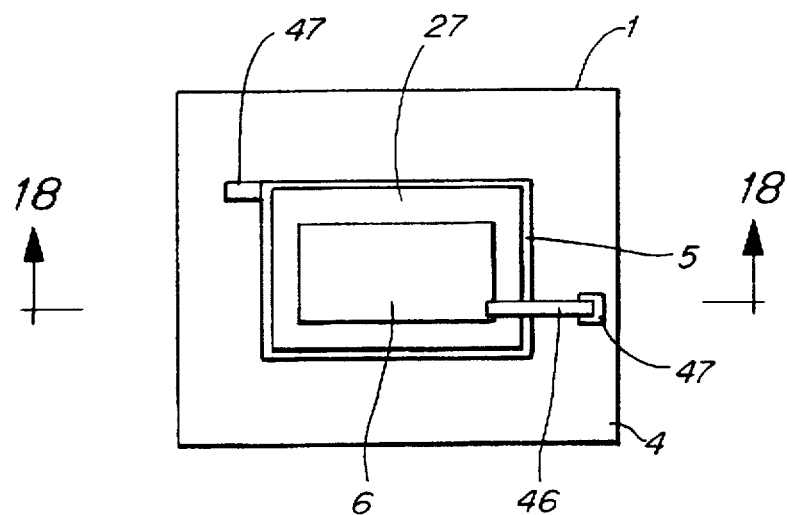
FIG. 17 shows an upper-side view of a condenser of the piezoelectric thin film oscillator of Embodiment 7 of this invention.
Figure 18:
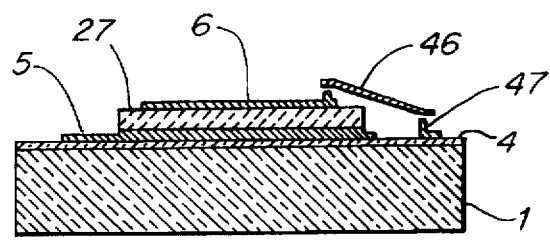
FIG. 18 shows a transverse cross sectional view of the condenser of the piezoelectric thin film oscillator of Embodiment 7 of this invention.
Figure 19:
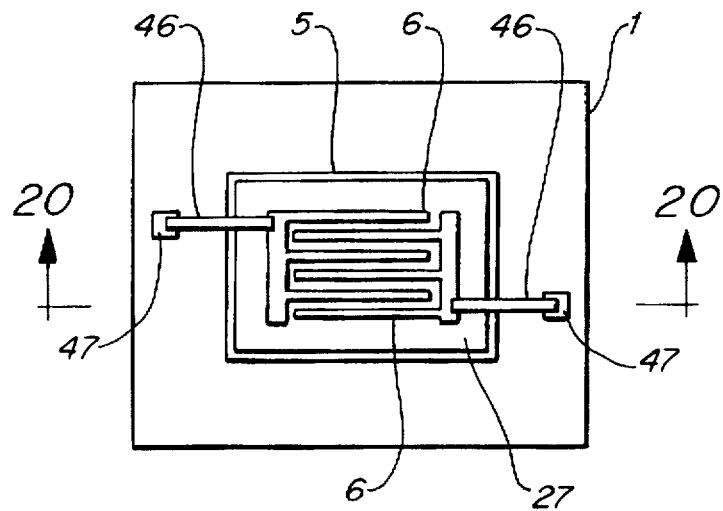
FIG. 19 shows an upper-side view of another condenser of the piezoelectric thin film oscillator of Embodiment 7 of this invention.
Figure 20:
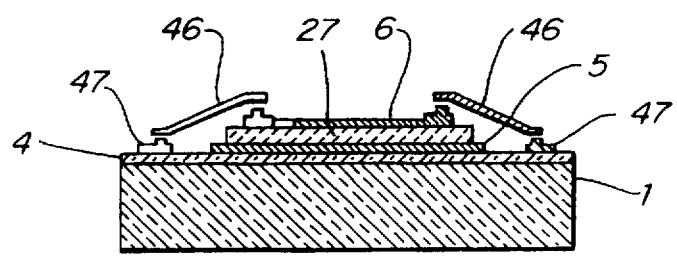
FIG. 20 shows a transverse cross sectional view of the piezoelectric thin film oscillator of Embodiment 7 of this invention.

FIG. 16 shows a thin film piezoelectric oscillator according to Embodiment 7 of this invention. The circuit shown in FIG. 16 is similar to the circuit of FIG. 11. In the circuit device shown in FIG. 11, the condensers $C_O$ and $C_E$ which require a large capacitance use lead titanate (PbTiO$_3$), that is used in the bulk ultrasonic wave resonator 35, as the dielectric substance. FIGS. 17 and 18 show an example of the configuration of the condenser 45 of FIG. 16 which uses lead titanate (PbTiO$_3$), that is used in the bulk ultrasonic wave resonator 35, as the dielectric substance. FIG. 17 shows an upper-side view and FIG. 18 shows an F—F cross sectional view. FIGS. 19 and 20 show another example of the configuration of the condenser 45 using lead titanate (PbTiO$_3$), that is used in the bulk ultrasonic wave resonator 35, as the dielectric substance. FIG. 19 shows an upper-side view and FIG. 20 shows a G—G cross sectional view. In the figures, air-bridges 46 and lead terminals 47 are provided.

The capacitance of the condenser is determined by the dielectric constant, the thickness and the electrode area of the dielectric substance to be used. In the condenser used in the semiconductor circuit, there is a condenser which is utilized for cut off of the direct current, and there is a condenser which can be treated as a short circuit in a frequency band. The condenser 45 needs a large capacitance. Depending on the dielectric substance material used, the realistic dielectric substance thickness and the realistic dielectric substance area each have limitations. Further, it is better to make the chip area as small as possible in view of the cost for manufacturing the semiconductor circuit. Therefore, the dielectric substance is required to have a large dielectric constant. Lead titanate (PbTiO$_3$) has a relative dielectric constant of about 200 in the GHz band. It has more than ten times the dielectric constant of silicon oxide (SiO$_2$). This means that the area to realize the same capacitance can be one tenth of that required for silicon oxide. The use of a dielectric substance like lead titanate (PbTiO$_3$) reduces the chip area of the semiconductor circuit and reduces the manufacturing cost. Furthermore, since an additional dielectric substance material is not required and it is possible to compose the condenser 45 simultaneously when the bulk ultrasonic wave resonator 35 is composed, it has the advantage of preventing an increase of manufacturing process caused by forming the condenser 45 having a different dielectric substance material.

As to the structure of the condenser 45, there is a case where it is located between the ground conductor 5 and the top-side electrode 6 in the direction of thickness of lead titanate (PbTiO$_3$) as shown in FIGS. 17 and 18. And, there is a case where the surface of lead titanate (PbTiO$_3$) has an interdigital structure by inserting the electrodes of two top-side electrodes 6 within each other as shown in FIGS. 19 and 20. In either case, in contrast with the bulk ultrasonic wave resonator 35, the polarization process is not performed and the via hole on the bottom side is not required for the condenser.

Embodiment 8

Figure 21:
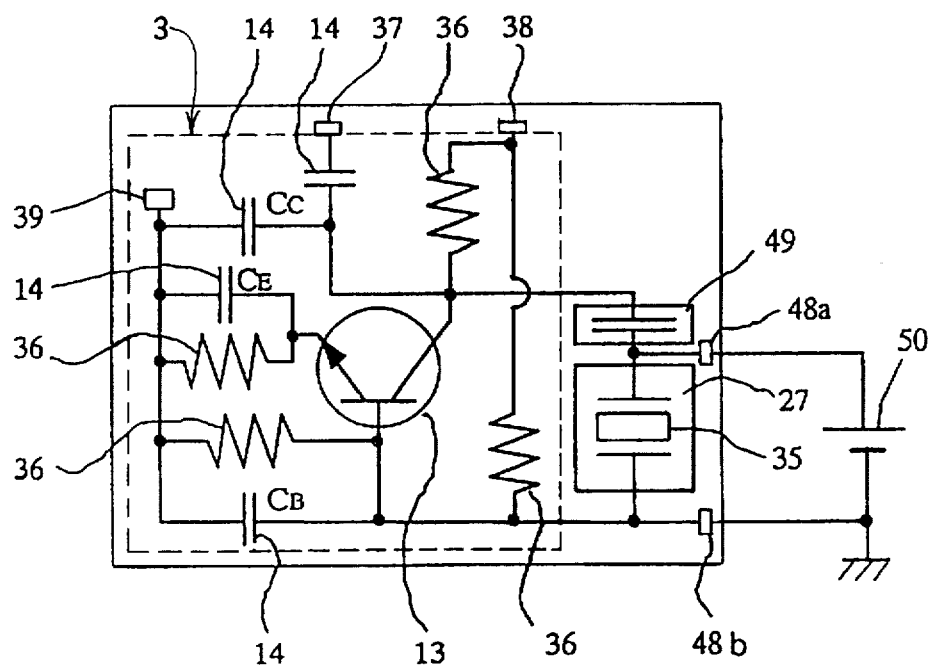
FIG. 21 shows the piezoelectric thin film oscillator of Embodiment 8 of this invention.

FIG. 21 shows a bulk ultrasonic wave resonator according to Embodiment 8 of this invention. In the figure, terminals 48a and 48b are for applying the direct current voltage for polarization. A condenser 49 and a direct current power source 50 are provided.

In a case where a piezoelectric ceramic like lead titanate ($PbTiO_3$) is used, when the proper direct current voltage is not applied to lead titanate ($PbTiO_3$) for more than the defined time under the required temperature, a large piezoelectricity cannot be obtained. The polarization process is not required for zinc oxide (ZnO) and aluminum nitride (AlN) and other conventional piezoelectric ceramics which has a spontaneous polarization. In the polarization process, for example, the direct current voltage is applied between the top-side electrode 6 and the ground conductor 5 of the bulk ultrasonic wave resonator 35. When the bulk ultrasonic wave resonator 35 is fabricated together with the semiconductor circuit 3, the direct current voltage is applied to the semiconductor circuit 3 connected to the bulk ultrasonic wave resonator 35 and there occurs a problem that the direct current voltage for this polarization will cause damage to the semiconductor circuit 3 especially for active devices like the transistor 13. In order to prevent this, the condenser 49 is inserted in series between the semiconductor circuit 3 and the terminal 48a to which the direct current voltage of the bulk ultrasonic wave resonator 35 is applied. It is possible to block the direct current voltage at the time of polarization on the side of the semiconductor circuit 3 by inserting the condenser 49. At the operation frequency of the bulk ultrasonic wave resonator 35, the capacitance of the inserted condenser 49 should be such a large value whereby the impedance of the condenser 49 is possible to ignore substantially. Or the capacitance of the inserted condenser 49 should have a value which is possible to be used as the external additional capacitance of the bulk ultrasonic wave resonator 35. For safety, it is desirable to ground all the other terminals 37, 38 and 39 except for the terminal 48a to which the direct electric voltage is applied, during the polarization process. According to such methods, it is possible to prevent the damage of the semiconductor circuit 3 during the polarization process.

Embodiment 9

Figure 22:
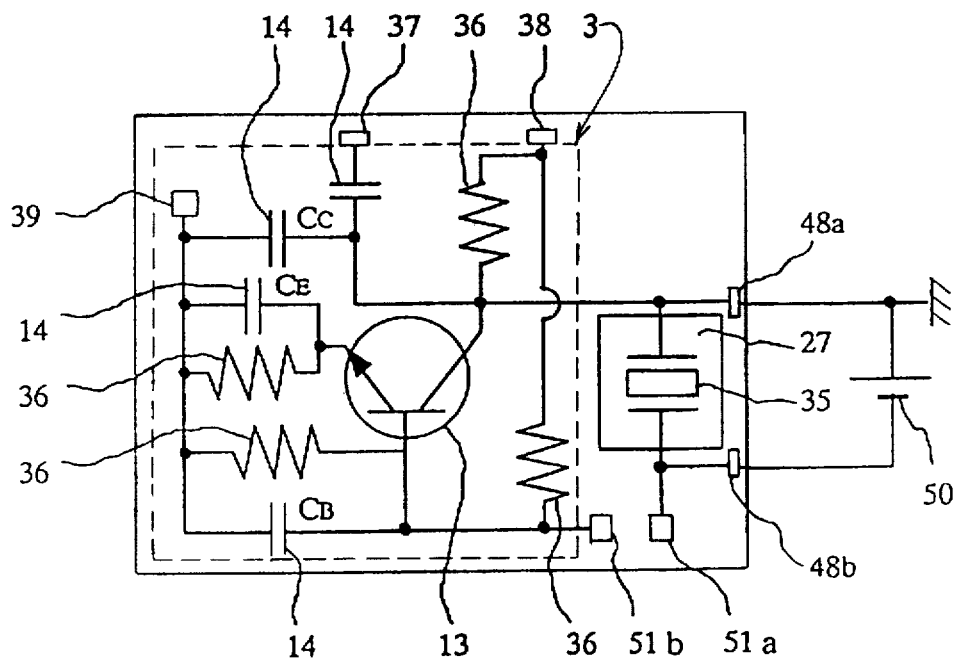
FIG. 22 shows the piezoelectric thin film oscillator of Embodiment 9 of this invention.

FIG. 22 shows a bulk ultrasonic wave oscillator according to Embodiment 9 of this invention. In the figure, a terminal 51a of the bulk ultrasonic wave resonator 35 and a terminal 51b of the semiconductor circuit 3 are provided.

In the polarization process, the terminal 51a and the terminal 51b are electrically separated. The terminal 48a is electrically connected to the transistor 13 in the semiconductor circuit 3. When the direct current voltage at the time of polarization is applied, the terminal 48a is grounded. By adopting such method, it is possible to prevent from applying the direct current voltage for the polarization process to the semiconductor circuit 3. When the polarization process ends and the operation as the bulk ultrasonic wave resonator starts, the terminal 51a and the terminal 51b should be bonded or connected according to a pattern of the circuit. The two terminals 48b and 51a in FIG. 22 can be combined and can be one terminal.

Embodiment 10

Figure 23:
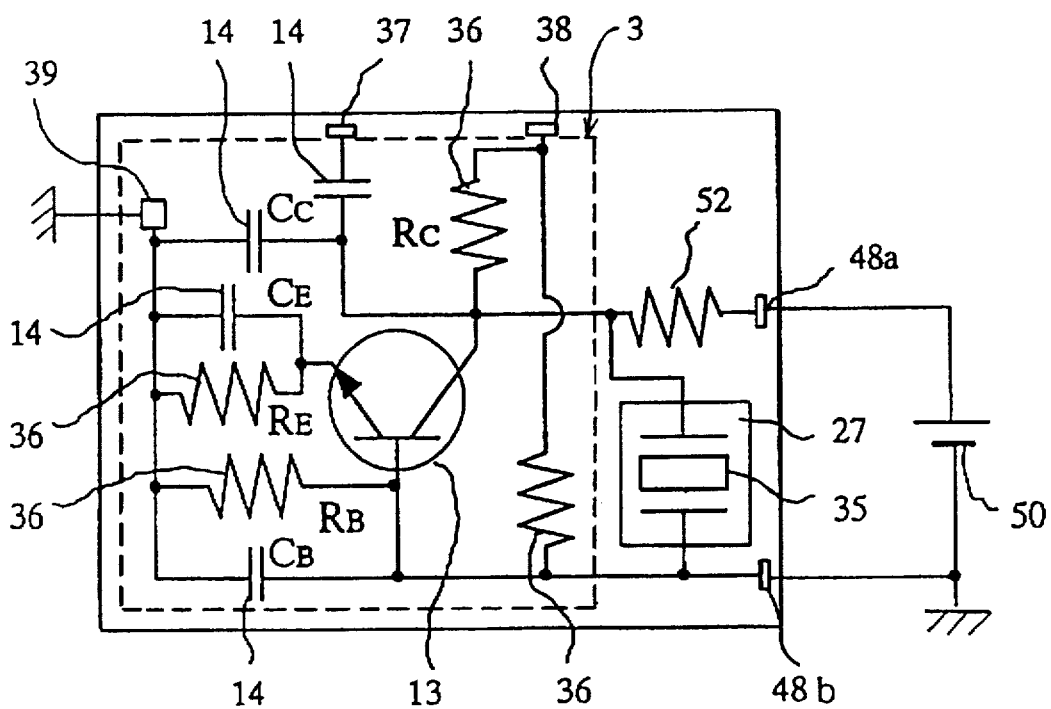
FIG. 23 shows the piezoelectric thin film oscillator of Embodiment 10 of this invention.

FIG. 23 shows a bulk ultrasonic wave oscillator according to Embodiment 10 of this invention. In the figure, resistance 52 has a resistance value larger than the resistance 36 in the semiconductor circuit 3 in the direct current path from the terminal 48a with the direct current power source 50 to the ground potential.

During the polarization process, the direct current voltage is applied across the bulk ultrasonic wave resonator but there is no substantial direct current through the bulk ultrasonic wave resonator 35. Therefore, when the resistance 52 is inserted in series between the bulk ultrasonic wave resonator 35 and the direct current power source 50, the polarization process will not be affected. Hence, by arranging the resistance 52 which has a larger resistance value than the resistance 36 in the semiconductor circuit 3 located in the direct current path from the terminal 48a of the direct current power source 50 to the ground potential, it is possible to prevent the transistor 13 or active devices like the semiconductor circuit 3 in the electric circuit from being destroyed due to an inappropriate applying method of direct current. Even though the applying method of direct current is proper, according to the transient response in a case where the direct current power source 50 is connected, the transient electric current flows. In this case, the resistance 52 is possible to prevent the active device from being destroyed. Further, when the semiconductor circuit 3 or the electric circuit actually operate, since a larger resistance value than the other resistance 36 is provided, the resistance 52 can be substantially ignored. Then, in the frequency band where the electric circuit operates, it is possible to prevent the operation of the electric circuit from being damaged. Here, when the resistance 36 exists to be connected in series with the resistance 52 on the path from the terminal 48a to the ground potential, the direct potential applied to the bulk ultrasonic wave resonator 35 is determined by the voltage dividing rate of the resistance 52 and the resistance 36 located between the resistance 52 and the ground potential. Accordingly, there is a case that the polarization is not performed properly. The polarization process according to Embodiment 10 limits the type of the applicable semiconductor circuit 3 and the electric circuit.

Embodiment 11

Figure 24:
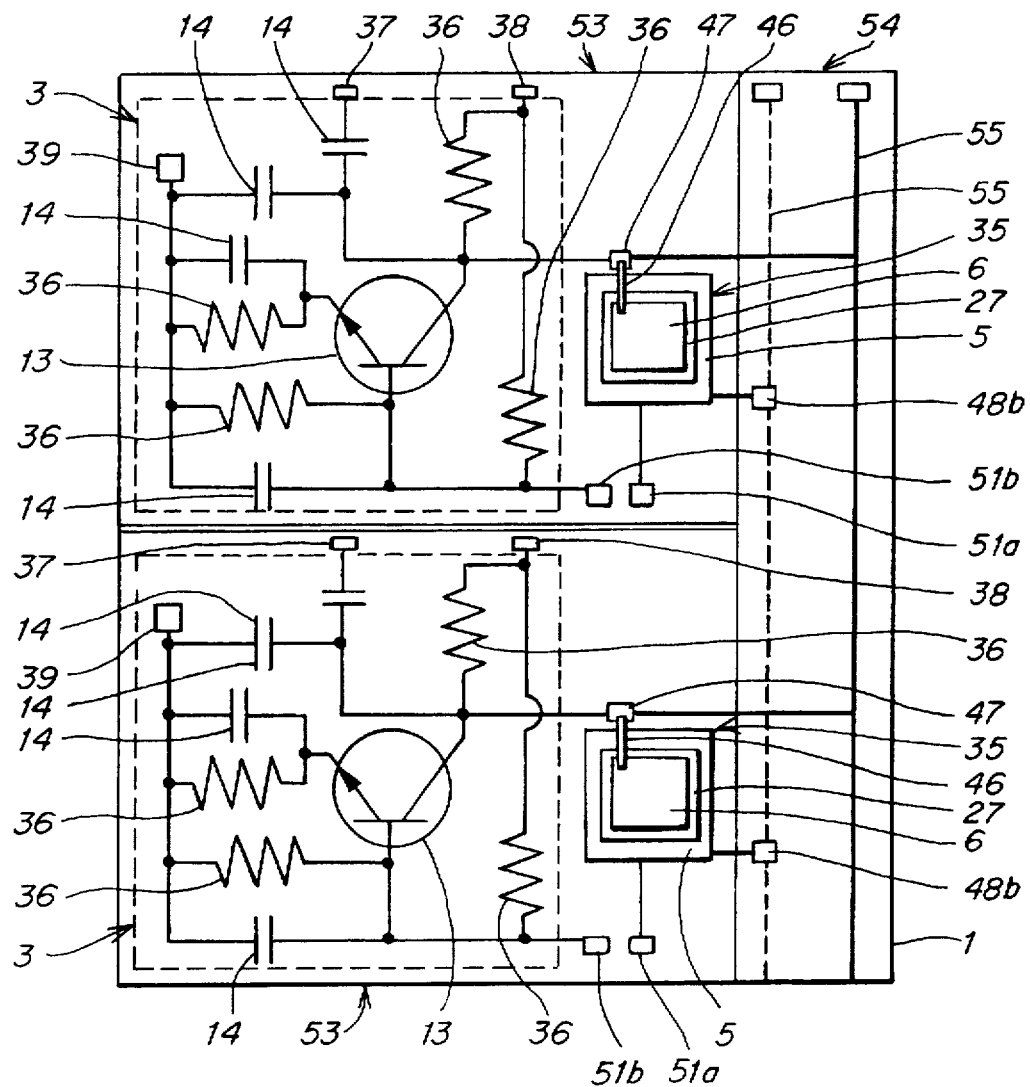
FIG. 24 shows the film bulk acoustic wave device of Embodiment 11 of this invention.

FIG. 24 shows a view of the bulk acoustic wave device according to Embodiment 11 of this invention. The bulk ultrasonic wave resonator 35 of FIG. 22 is illustrated in FIG. 24 not in the circuit view but in the configuration view similar to FIG. 1. In the figure, a bulk ultrasonic wave oscillator chip 53 is provided. A semiconductor circuit 54 forms a pattern for applying the voltage at the time of polarization and is configurated on the same semiconductor 1 of the bulk ultrasonic wave oscillator chip 53. A pattern 55 is for applying the voltage at the time of polarization. When one of the patterns crosses over, multiple layer wiring is used.

A plurality of bulk ultrasonic wave oscillator chips 53 are usually formed on a single semiconductor wafer at one time. The polarization process is preferentially performed before division into each of the bulk ultrasonic wave oscillator chips 53 to reduce the process cost required for polarization. As shown in FIG. 24, the bulk ultrasonic wave resonators 35 in a number of bulk ultrasonic wave oscillator chips 53 on the wafer are grouped together and connected by the pattern 55 for polarization. After polarization, the semiconductor substrate that forms the pattern 55 for polarization is removed from the bulk ultrasonic wave oscillator chips 53. According to this procedure, the undesirable pattern 55 for the oscillator does not remain in each of the bulk ultrasonic wave oscillator chips 53. Therefore, it is possible to make the mount area of the chip smaller when the bulk ultrasonic wave oscillator chips 53 are mounted on a printed circuit board, a package or the other chips.

In the polarization process, when all the bulk ultrasonic wave resonators 35 on the same semiconductor wafer are connected by the pattern 55 for polarization, if there is even one inferior bulk ultrasonic wave resonator 35 on the semiconductor wafer having a high direct current leakage between the top-side electrode 6 and the ground conductor 5, the polarization process of the other normal bulk ultrasonic wave resonator 35 on the semiconductor wafer will not be performed properly. Therefore, when the bulk ultrasonic wave resonators 35 on the semiconductor wafer are divided into multiple groups and the polarization process is performed by connecting each group by the pattern 55 for polarization, it is possible to reduce the effects of a bulk ultrasonic wave resonator 35 having excessive leakage current.

Embodiment 12

Figure 25:
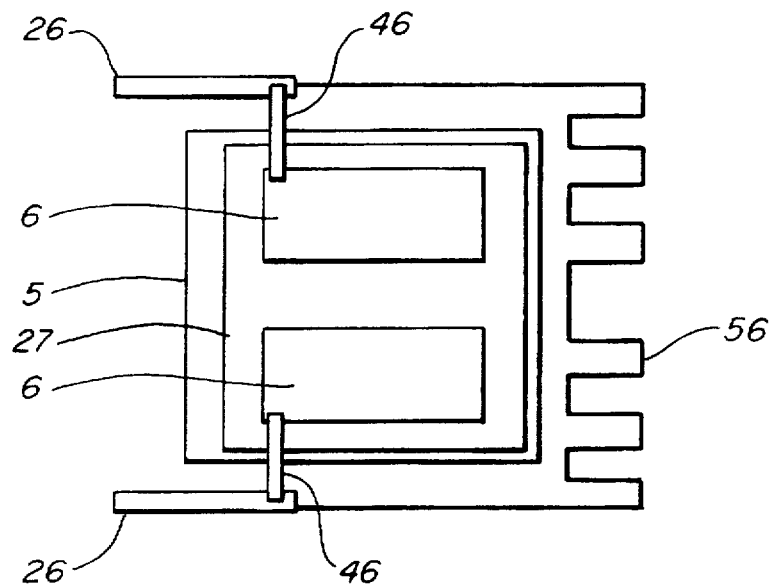
FIG. 25 shows the film bulk acoustic wave device of Embodiment 12 of this invention.

FIG. 25 shows a bulk acoustic wave device according to Embodiment 12 of this invention. In the figure, a pattern 56 directly connects a plurality of top-side electrodes 6.

FIG. 25 shows an example of a bulk ultrasonic wave filter configured using a plurality of bulk ultrasonic wave resonators in close proximity to each other. In such a bulk ultrasonic wave filter, a plurality of bulk ultrasonic wave resonators are included in a single filter. It is necessary to perform the polarization process of the plurality of bulk ultrasonic wave resonators under the same conditions so that each of the plurality of bulk ultrasonic wave resonators has the same piezoelectricity. As shown in FIG. 25, when the plurality of bulk ultrasonic wave resonators are connected by the pattern 56 and a direct current voltage is applied to each in the same way, the polarization process can be performed for the plurality of bulk ultrasonic wave resonators under exactly the same conditions. Therefore, it is possible to reduce the processing cost for the polarization and to have the same piezoelectricity of the bulk ultrasonic wave resonator. Accordingly, the well characterized bulk ultrasonic wave filter can be processed at a low price.

Additionally, by configuring the pattern 56 to have a characteristic impedance greater than 50 Ω, in the neighborhood frequency of the operational frequency of the bulk ultrasonic wave filter, the impedance of the pattern 56 is regarded to be almost opened. Therefore, even when the pattern 56 remains after the polarization process, it does not affect the operation of the bulk ultrasonic wave filter. Hence, the step of cutting the pattern 56 after the polarization process can be omitted.

When the pattern 56 has a resistance greater than 50 Ω, the polarization process is not be affected. In the neighborhood frequency of the operational frequency of the bulk ultrasonic wave filter, the pattern 56 has an impedance which is essentially an open circuit. Therefore, even when the pattern 56 remains after the polarization process, it is possible not to affect the operation of the bulk ultrasonic wave filter. Hence, the step of cutting the pattern 56 after the polarization process can be omitted.

When the pattern 56 is composed of the resistance line wherein the characteristic impedance is above 50 Ω, and the resistance is above 50 Ω, the polarization process is not affected. In the neighborhood frequency of the operational frequency of the bulk ultrasonic wave filter, the pattern 56 has an impedance which is essentially an open circuit. Therefore, even when the pattern 56 remains after the polarization process, it does not affect the operation of the bulk ultrasonic wave filter. Hence, the step of cutting the pattern 56 after the polarization process can be omitted.

Embodiment 13

Figure 26:
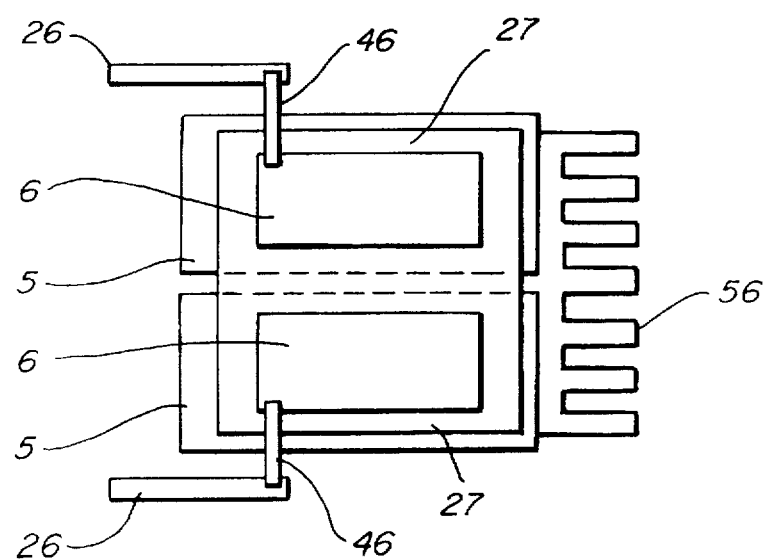
FIG. 26 shows the film bulk acoustic wave device of Embodiment 13 of this invention.

FIG. 26 shows a bulk acoustic wave device according to Embodiment 13 of this invention. In the figure, a pattern 56 connects a plurality of ground conductors 5 directly.

FIG. 26 shows an example of configuring the bulk ultrasonic wave filter by laying out a plurality of bulk ultrasonic wave resonators closely. In such a bulk ultrasonic wave filter, there exists a plurality of bulk ultrasonic wave resonators in a single filter. Therefore, it is necessary to perform the polarization process under the same conditions so that each of the plurality of bulk ultrasonic wave resonators has the same piezoelectricity. As shown in FIG. 26, when the plurality of bulk ultrasonic wave resonators is connected by the pattern 56 and the direct current voltage is applied, the polarization process can be performed for the plurality of bulk ultrasonic wave resonators under exactly the same conditions. Therefore, it is possible to reduce the processing cost for the polarization and to have same piezoelectricity for each of the bulk ultrasonic wave resonators. Accordingly, the well characterized bulk ultrasonic wave filter can be processed at a low price.

Additionally, by using the line path, wherein the characteristic impedance is above 50 Ω, as the pattern 56, in the neighborhood frequency of the operational frequency of the bulk ultrasonic wave filter, the pattern 56 operates with an impedance which is regarded to be almost opened. Therefore, when the pattern 56 remains after the polarization process, it does not affect the operation of the bulk ultrasonic wave filter. Hence, the step of cutting the pattern 56 after the polarization process can be omitted.

When the pattern 56 is composed of the resistance line, wherein the characteristic impedance is above 50 Ω and the resistance is above 50 Ω, the polarization process is not affected. In the neighborhood frequency of the operational frequency of the bulk ultrasonic wave filter, the pattern 56 operates with an impedance which can be regarded to be almost an open circuit. Therefore, even when the pattern 56 remains after the polarization process, it does not affect the operation of the bulk ultrasonic wave filter. Hence, the step of cutting the pattern 56 after the polarization process can be omitted.

Embodiment 14

Figure 27:
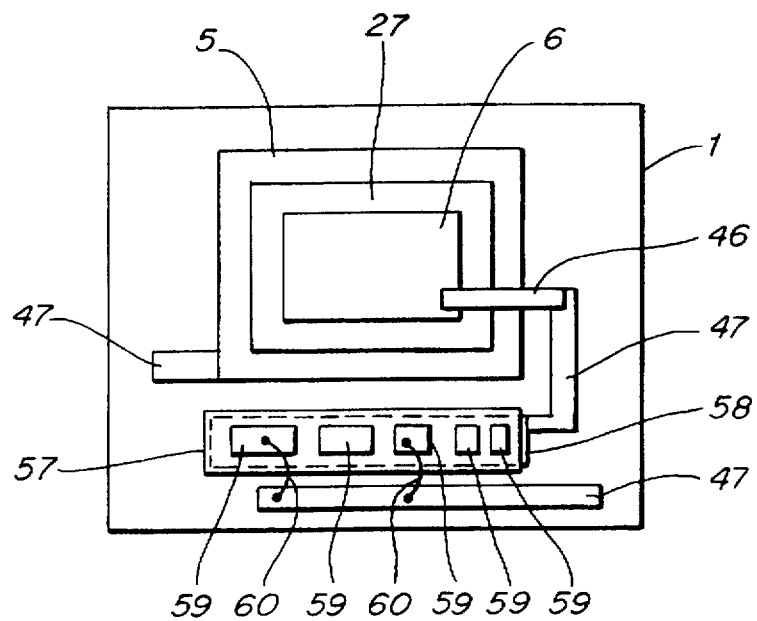
FIG. 27 shows the film bulk acoustic wave device of Embodiment 14 of this invention.

FIG. 27 shows a bulk acoustic wave device according to Embodiment 14 of this invention. In the figure, a dielectric substance 57, a ground electrode 58 and a top-side electrode 59 and a wire 60 are provided.

The dielectric substance 57 between the ground electrode 58 and the top-side electrode 59 operates as a condenser. The dielectric substance material can be an unpolarized dielectric substance like lead titanate ($PbTiO_3$) configurated on the same semiconductor substrate 1. The dielectric substance material can be a general insulating material like silicone oxide ($SiO_2$). A plurality of condensers is connected in series for the top-side electrode 6 of the bulk ultrasonic wave resonator. Some of the plurality of condensers are connected by the wire 60 to the lead electrode 47. Since the capacitive reactance is directly connected to the bulk ultrasonic wave resonator, it is possible to adjust the resonant frequency of the bulk ultrasonic wave resonator by varying the total capacitive reactance. The area of the top-side electrode 59 of each condenser is set to be different from each other. Based on the difference from the expected resonant frequency of the bulk ultrasonic wave resonator, the condenser to be connected by the wire 60 is appropriately selected and connected. In this case, since, each condenser is connected in parallel according to the wire 60, the capacitive reactance component, inserted in series in the bulk ultrasonic wave resonator, gets large when the condenser is connected. There is little deterioration due to age when the condensers are connected using the wires 60. When an appropriate material, selected based on age deterioration, is used for the capacitance of the condenser, the bulk ultrasonic wave resonator in which the resonant frequency is adjusted according to the above connecting demonstrates stable resonance characteristics. The above connecting method is also applicable to the impedance adjustment of the resonator.

Embodiment 15

Figure 28:
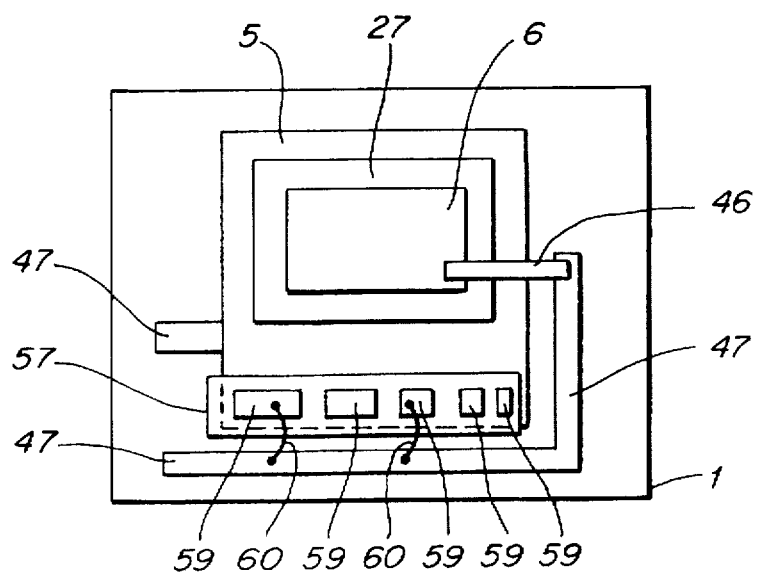
FIG. 28 shows the film bulk acoustic wave device of Embodiment 15 of this invention.

FIG. 28 shows a bulk acoustic wave device according to Embodiment 15 of this invention. The ground conductor 5 of the bulk ultrasonic wave resonator serves as the ground electrode of each condenser. Each condenser is connected in parallel to the bulk ultrasonic wave resonator and it is possible to adjust the resonant frequency of the bulk ultrasonic wave resonator by varying the total capacitance of these condensers. The area of the top-side electrode 59 of each condenser is set to be different from each other. Based on a difference from the expected resonant frequency of the bulk ultrasonic wave resonator, the condenser to be connected by the wire 60 is appropriately selected and connected. In this case, since each condenser is connected in parallel by the wire 60, when the condenser is connected, the capacitive reactance component inserted in parallel to the bulk ultrasonic wave resonator gets large.

Embodiment 16

Figure 29:
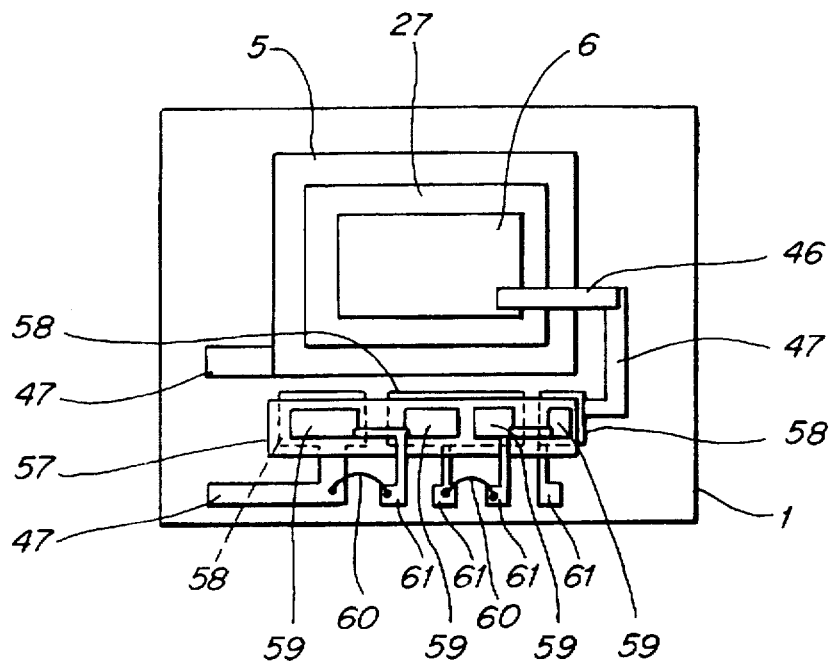
FIG. 29 shows the film bulk acoustic wave device of Embodiment 16 of this invention.

FIG. 29 shows a bulk acoustic wave device according to Embodiment 16 of this invention. In the figure, a pad 61 is provided. Each condenser is connected in series with each other and the condensers connected in series are connected to the bulk ultrasonic wave resonator in series. By varying the total capacitance of these condensers, it is possible to adjust the resonant frequency of the bulk ultrasonic wave resonator. In this case, the area of the top-side electrode 59 of each condenser is set to be different from each other. Based on the difference from the expected resonant frequency of the bulk ultrasonic wave resonator, the condenser is appropriately selected. Based on the selected condenser, each pad 61 is connected by the wire 60 forming a short circuit. In this case, each condenser is connected by the wire 60. When each pad 61 is selectively connected by forming a short-circuit, the capacitive reactance component inserted in series to the bulk ultrasonic wave resonator becomes large.

Embodiment 17

Figure 30:
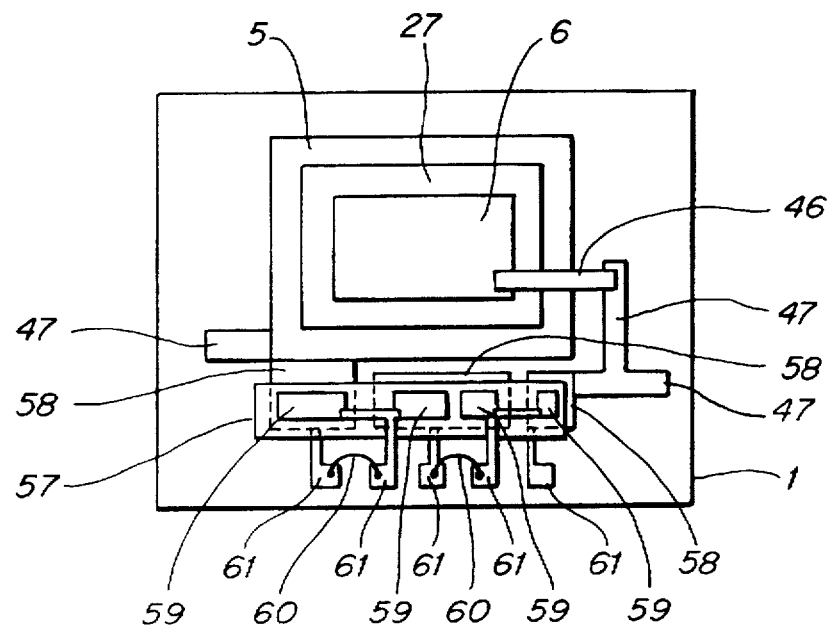
FIG. 30 shows the film bulk acoustic wave device of Embodiment 17 of this invention.

FIG. 30 shows a bulk acoustic wave device according to Embodiment 17 of this invention. Each condenser is connected in series with each other and further each of the condensers connected in series are connected in parallel to the bulk ultrasonic wave resonator. By varying the total capacitance of these condensers, it is possible to adjust the resonant frequency of the bulk ultrasonic wave resonator. The area of the top-side electrode 59 of each condenser is set to be different from each other. Based on the difference from the expected resonant frequency of the bulk ultrasonic wave resonator, the condenser to be connected by the wire 60 is appropriately selected and each pad 61 can be connected to form a short circuit. In this case, when each condenser is selectively connected by forming a short circuit, the capacitive reactance component inserted in parallel to the bulk ultrasonic wave resonator becomes large.

Embodiment 18

Figure 31:
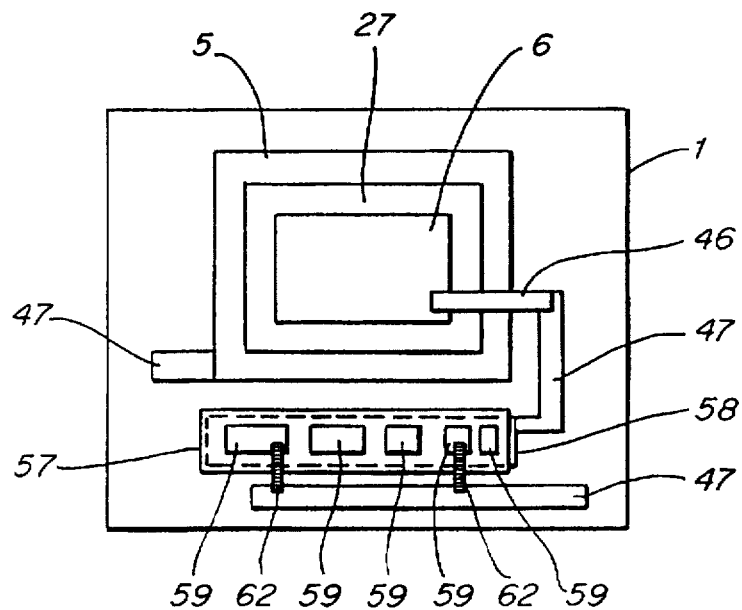
FIG. 31 shows the film bulk acoustic wave device of Embodiment 18 of this invention.

FIG. 31 shows a bulk acoustic wave device according to Embodiment 18 of this invention. The dielectric substance 57 between the ground electrode 58 and the top-side electrode 59 operates as a condenser. The dielectric substance material can be an unpolarized piezoelectric substance like lead titanate ($PbTiO_3$) composed on the same semiconductor substance 1 or a general insulating material like silicon oxide ($SiO_2$). A plurality of condensers is connected in series to the top-side electrode 6 of the bulk ultrasonic wave resonators. The plurality of condensers are connected to the lead electrode 47 via the line patterns 62. Since the capacitive reactance is connected in series to the bulk ultrasonic wave resonator, it is possible to adjust the resonant frequency of the bulk ultrasonic wave resonator by varying the total capacitive reactance. Here, the area of the top-side electrodes 59 are set to be different from each other. Based on the difference from the expected resonant frequency of the bulk ultrasonic wave resonator, the condensers to be connected by the line patterns 62 are appropriately selected and connected. Because each condenser is connected in parallel via the line pattern 62, when the condenser is connected, the capacitive reactance component inserted in series to the bulk ultrasonic wave resonator becomes large. There is little deterioration due to age when the condensers are connected via the line patterns 62. When an appropriate material based on age deterioration is used for the capacitance of the condenser, the bulk ultrasonic wave resonator in which the resonant frequency is adjusted by the above connecting method can show a stable resonance characteristic. The above connecting method using the line pattern 62 is not suitable for adjusting each of the bulk ultrasonic wave resonators independently. However, when the variation of frequency at each lot is within a definite range, it is acceptable to perform adjustment lot by lot. The above connecting method has the advantage of adjusting the bulk ultrasonic wave resonators fabricated on one wafer together.

Embodiment 19

Figure 32:
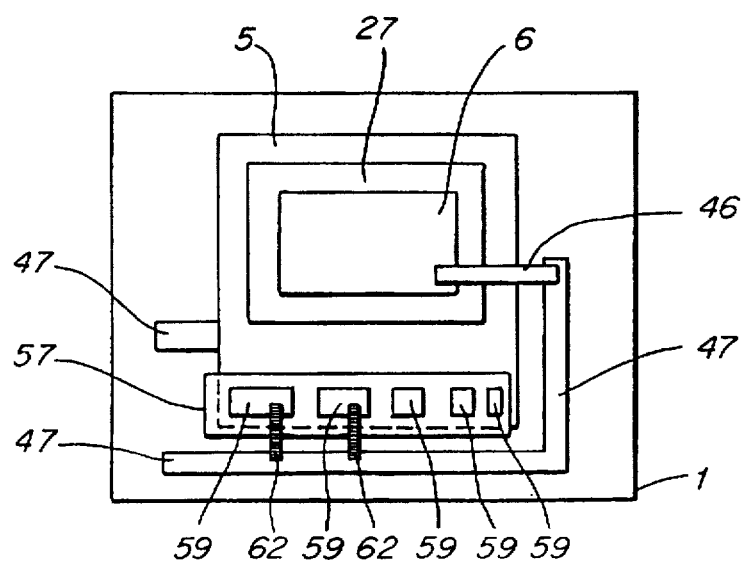
FIG. 32 shows the film bulk acoustic wave device of Embodiment 19 of this invention.

FIG. 32 shows a bulk acoustic wave device according to Embodiment 19 of this invention. The ground conductor 5 of the bulk ultrasonic wave resonator serves as the ground electrode of each condenser. Each condenser is connected in parallel to the bulk ultrasonic wave resonator. It is possible to adjust the resonant frequency of the bulk ultrasonic wave resonator by varying the total capacitance of these condensers. In this case, the area of the top-side electrode 59 of each condenser is set to be different from each other. Based upon a difference from the expected resonant frequency of the bulk ultrasonic wave resonator, the condensers to be connected by the line pattern 62 are appropriately selected and connected. Since each condenser is connected in parallel using the line pattern 62, when the condenser is connected, the capacitive reactance component inserted in parallel to the bulk ultrasonic wave resonator becomes large.

Embodiment 20

Figure 33:
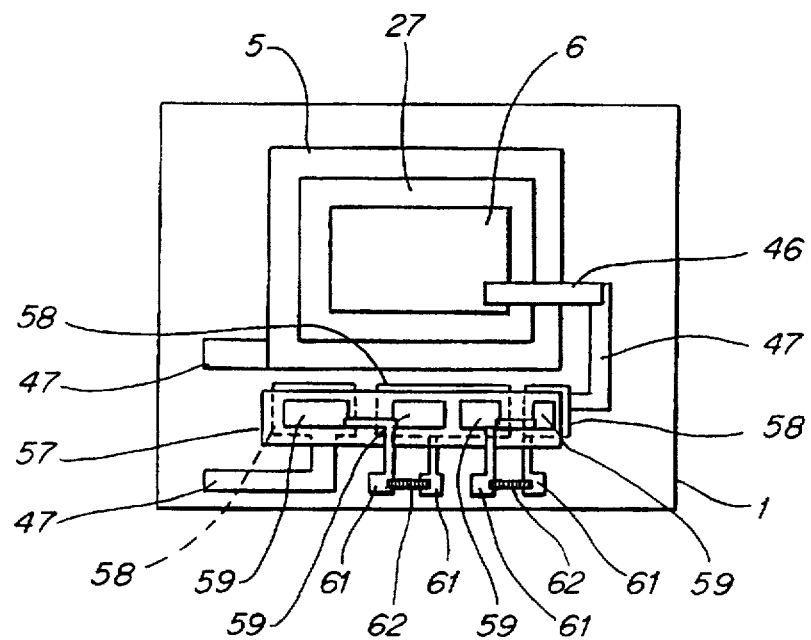
FIG. 33 shows the film bulk acoustic wave device of Embodiment 20 of this invention.

FIG. 33 shows a bulk acoustic wave device according to Embodiment 20 of this invention. Each condenser is connected in series with each other. The condensers connected in series are connected to the bulk ultrasonic wave resonator in series. It is possible to adjust the resonant frequency of the bulk ultrasonic wave resonator by varying the total capacitance of these condensers. The area of the top-side electrode 59 of each condenser is set to be different from each other. Based on the difference from the expected resonant frequency of the bulk ultrasonic wave resonator, the condensers to be connected by the line pattern 62 are appropriately selected and each pad 61 is connected to form a short circuit. Because each condenser is connected by forming the short-circuit using the line pattern 62, the capacitive reactance component inserted in series to the bulk ultrasonic wave resonator becomes large.

Embodiment 21

Figure 34:
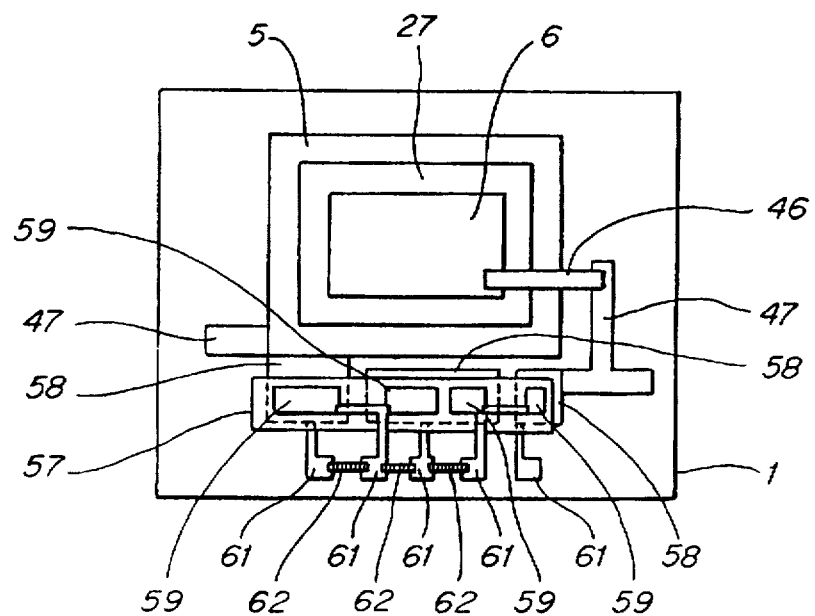
FIG. 34 shows the film bulk acoustic wave device of Embodiment 21 of this invention.

FIG. 34 shows a bulk acoustic wave device according to Embodiment 21 of this invention. Each condenser is connected in series with each other. The condensers connected in series are connected in parallel to the bulk ultrasonic wave resonator. It is possible to adjust the resonant frequency of the bulk ultrasonic wave resonator by varying the total capacitance of the condensers. The area of the top-side electrode 59 of each condenser is set to be different from each other. Based on a difference from the expected resonant frequency of the bulk ultrasonic wave resonator, the condensers to be connected by the line pattern 62 are appropriately selected and each pad 61 can be connected to form a short-circuit. Because each condenser is connected by forming the short-circuit using the line pattern 62, the capacitive reactance component inserted in parallel to the bulk ultrasonic wave resonator becomes large.

Embodiment 22

Figure 35:
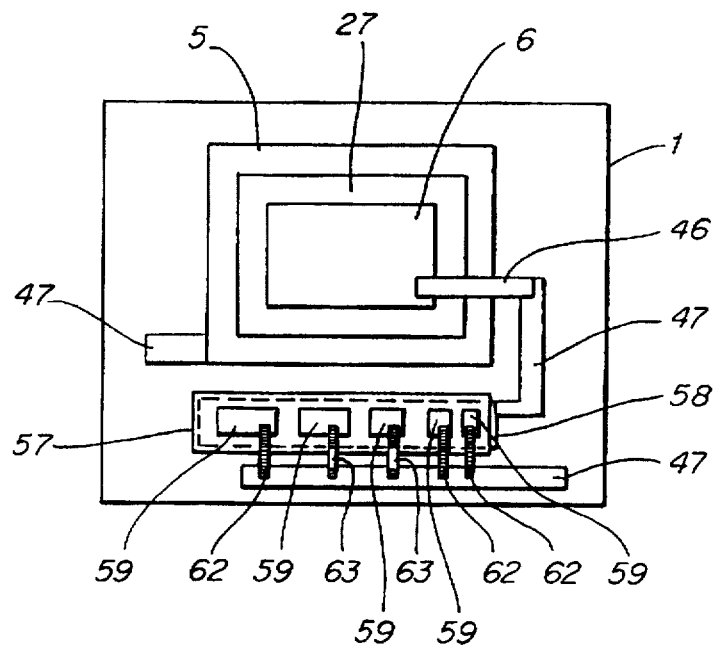
FIG. 35 shows the film bulk acoustic wave device of Embodiment 22 of this invention.

FIG. 35 shows a bulk acoustic wave device according to Embodiment 22 of this invention. The portion 63 is a cut off portion of the line pattern 62 where the line pattern is cut off by using, for example, a laser. The dielectric substance 57 between the ground electrode 58 and the top-side electrode 59 operates as a condenser. The dielectric substance material can be an unpolarized dielectric substance like lead titanate ($PbTiO_3$) composed on the same semiconductor substrate 1 or a general insulating material like silicon oxide ($SiO_2$). plurality of condensers are connected in series to the top-side electrode 6 of the bulk ultrasonic wave resonator and the plurality of condensers are connected to the lead electrode 47 by the line pattern 62. Because the capacitive reactance is connected in series to the bulk ultrasonic wave resonator, it is possible to adjust the resonant frequency of the bulk ultrasonic wave resonator by varying the total capacitive reactance. The area of the top-side electrodes 59 of each condenser is set to be different from each other. By cutting the line pattern 62 using a laser, based on a difference from the expected resonant frequency of the bulk ultrasonic wave resonator, the condensers are selected appropriately or electrically separated. Since each condenser is separated from the parallel connection by the cut off, the capacitive reactance component inserted in series to the bulk ultrasonic wave resonator gets small. There is little deterioration due to age when the condensers are connected via the line patterns 62. When an appropriate material based upon the age deterioration is used for the capacitance of the condenser, the bulk ultrasonic wave resonator in which the resonant frequency is adjusted by the above connecting method shows a stable resonance characteristic. This connecting method can determine the portion 63 to be cut at each lot. This connecting method can change the portion to be cut independently based on each bulk ultrasonic wave resonator. Therefore, this connecting method has an advantage of being applicable in many cases, such as a case where the range to be adjusted is relatively wide and a case where the each bulk ultrasonic wave resonator is strictly adjusted one by one.

Embodiment 23

Figure 36:
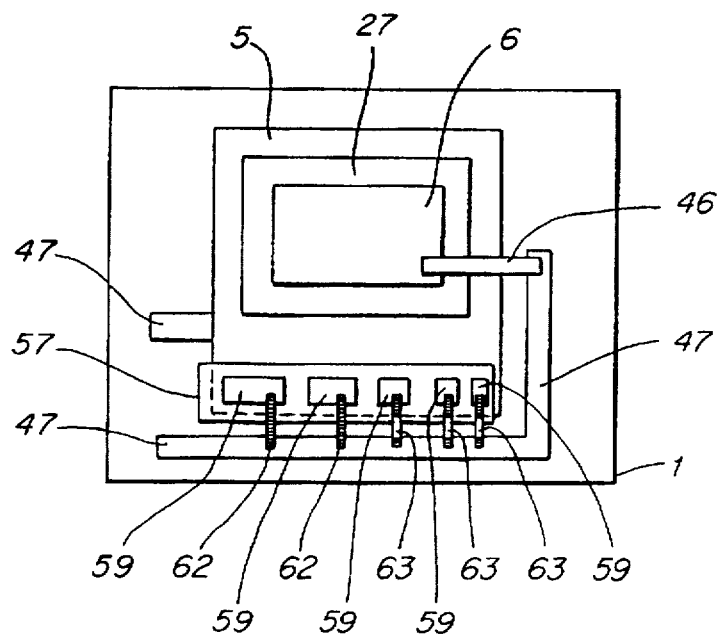
FIG. 36 shows the film bulk acoustic wave device of Embodiment 23 of this invention.

FIG. 36 shows a bulk acoustic wave device according to Embodiment 23 of this invention. The ground conductor 5 of the bulk ultrasonic wave resonator serves as the ground electrode of each condenser. Each condenser is connected in parallel to the bulk ultrasonic wave resonator. It is possible to adjust the resonant frequency of the bulk ultrasonic wave resonator by varying the total capacitance of these condensers. The area of the top-side electrodes 59 is set to be different from each other. Based on the difference from the expected resonant frequency of the bulk ultrasonic wave resonator, the line patterns 62 to be cut are determined and the condensers are appropriately selected or separated. In this case, because the condenser to be separated from the parallel connection are cut, the capacitive reactance inserted in parallel to the bulk ultrasonic wave resonator becomes small.

Embodiment 24

Figure 37:
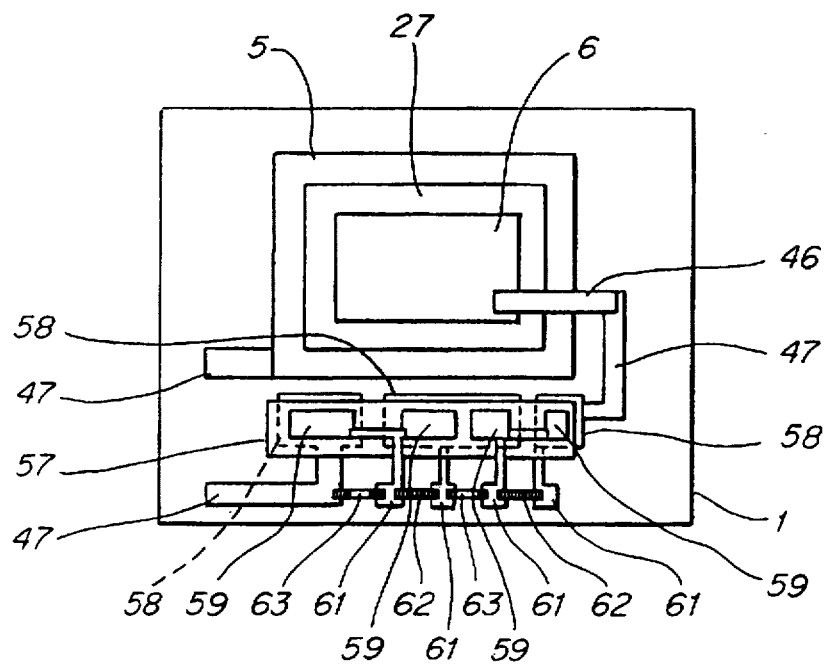
FIG. 37 shows the film bulk acoustic wave device of Embodiment 24 of this invention.

FIG. 37 shows a bulk acoustic wave device according to Embodiment 24 of this invention. Each condenser is connected in series with each other. The condensers connected in series are connected in series to the bulk ultrasonic wave resonator. In addition, each condenser is shorted in advance by the line pattern 62. By varying the total capacitance of these condensers, it is possible to adjust the resonant frequency of the bulk ultrasonic wave resonator. The area of the top-side electrodes 59 of each condenser are set to be different from each other. The condensers are selected by cutting the line patterns 62 based on the difference from the expected resonant frequency of the bulk ultrasonic wave resonator. In this case, because each condenser is connected in series by being cut, the capacitive reactance component inserted in series to the bulk ultrasonic wave resonator gets small.

Embodiment 25

Figure 38:
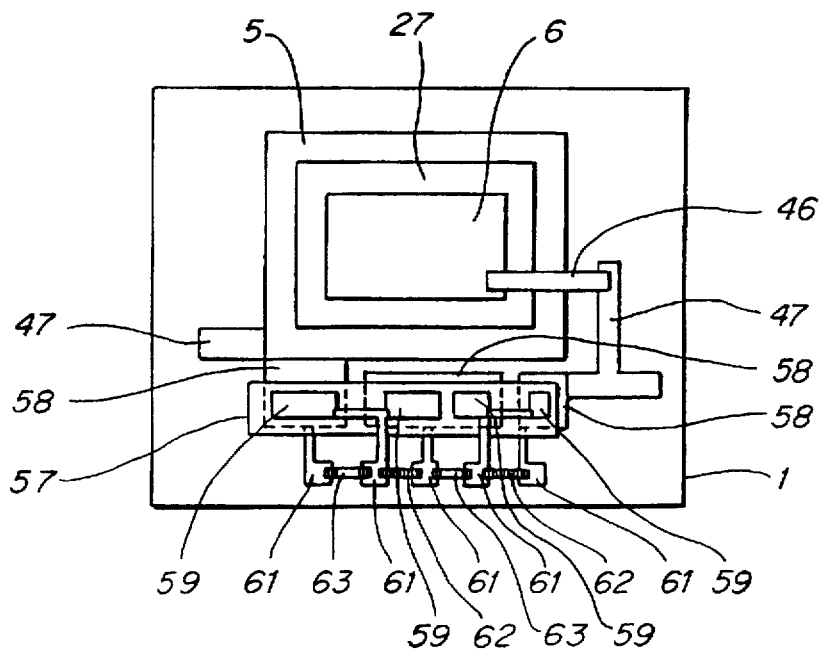
FIG. 38 shows the film bulk acoustic wave device of Embodiment 25 of this invention.

FIG. 38 shows a bulk acoustic wave device according to Embodiment 25 of this invention. Each condenser is connected in series with each other. The condensers connected in series are connected to the bulk ultrasonic wave resonator in parallel. In advance, each condenser is shorted by the line patterns 62. By varying the total capacitance of these condensers, it is possible to adjust the resonant frequency of the bulk ultrasonic wave resonator. The area of the top-side electrodes 59 of each condenser are set to be different from each other. The condensers are selected by cutting the line pattern 62 based on the difference from the expected resonant frequency of the bulk ultrasonic wave resonator. In this case, because each condenser is connected in series by being cut, the capacitive reactance inserted in parallel to the bulk ultrasonic wave resonator becomes large.

Embodiment 26

Figure 39:
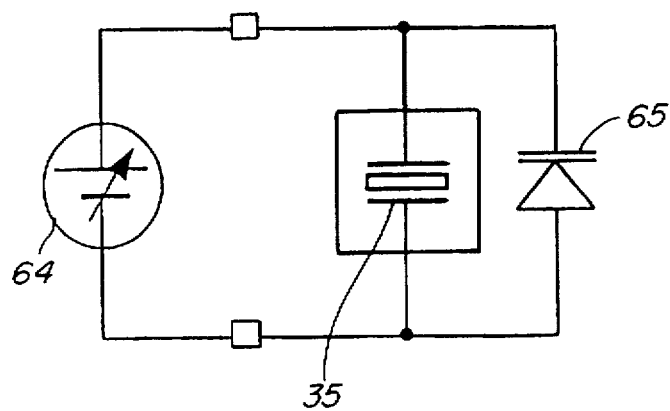
FIG. 39 shows the film bulk acoustic wave device of Embodiment 26 of this invention.

FIG. 39 shows a bulk acoustic wave device according to Embodiment 26 of this invention. In the figure, a power source 64 and a diode 65 with variable capacity are provided.

The diode 65 with variable capacitance can change the capacitance based on the voltage applied from the power source 64. When the diode 65 with variable capacitance and the bulk ultrasonic wave resonator 35 are connected in parallel, as shown in FIG. 39, or in series, the applied voltage from the power source 64 is controlled to vary the value of the capacitive reactance connected in parallel or in series to the bulk ultrasonic wave resonator 35. In this manner, the resonant frequency of the bulk ultrasonic wave resonator 35 is adjusted. Since the bulk ultrasonic wave resonator 35 according to this invention is capable of being fabricated together with the semiconductor circuit, the power source 64 can be manufactured on the same semiconductor substrate 1 with the bulk ultrasonic wave resonator by using a transistor and the like easily.

Embodiment 27

Figure 40:
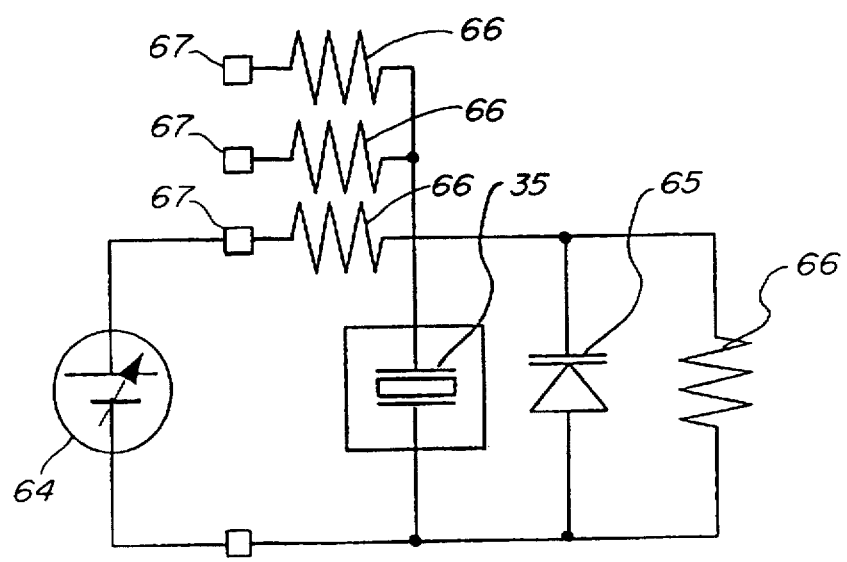
FIG. 40 shows the film bulk acoustic wave device of Embodiment 27 of this invention.

FIG. 40 shows a bulk acoustic wave device according to Embodiment 27 of this invention. In the figure, resistances 66 and a terminal 67 are provided.

In the film bulk acoustic wave device shown in FIG. 40, the applied voltage to the diode 65 with variable capacitance is selected based on the voltage ratio of the resistances 66. Each resistance 66, having a terminal 67, has a different resistance value from the other resistances 66. The terminal 67 which can provide the proper amount of adjustment is selected using, for example, a wire. Accordingly, the applied voltage to the diode 65 with variable capacitance is determined. As a result, the resonant frequency of the bulk ultrasonic wave resonator can be adjusted easily.

Embodiment 28

Figure 41:
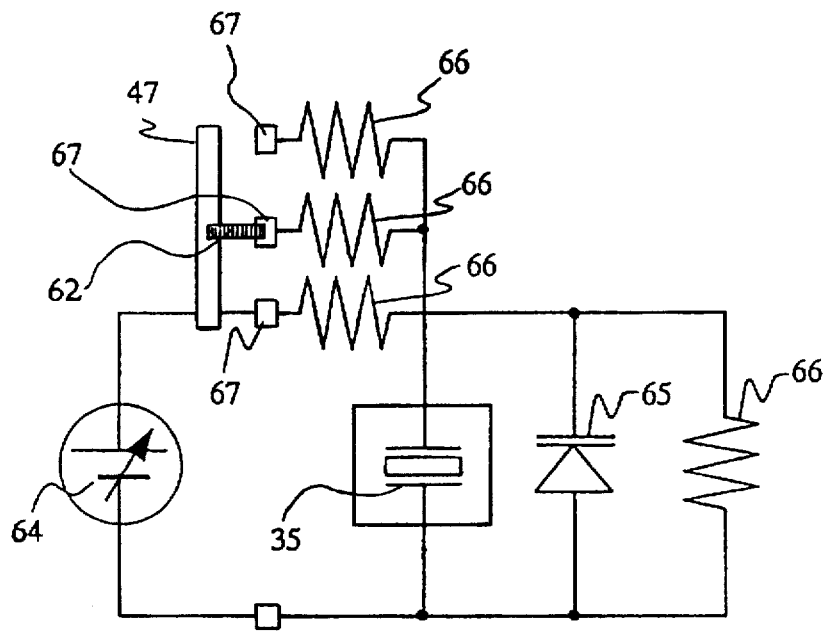
FIG. 41 shows the film bulk acoustic wave device of Embodiment 28 of this invention.

FIG. 41 shows a bulk acoustic wave device according to Embodiment 28 of this invention. The bulk acoustic wave device shown in FIG. 41 determines the applied voltage to the diode 65 with variable capacitance based on the voltage ratio of the resistances 66. Each resistance 66, having a terminal 67, has different resistance values from the other resistances 66. For instance, in case of connection with another power source 64 or connection with power source 64 on the same semiconductor substrate 1 with the bulk acoustic wave device, the terminal 67 of one of the resistances 66 and the lead electrode 47 are connected to provide the proper amount of adjustment. Such method excels in lot by lot adjustment.

Embodiment 29

Figure 42:
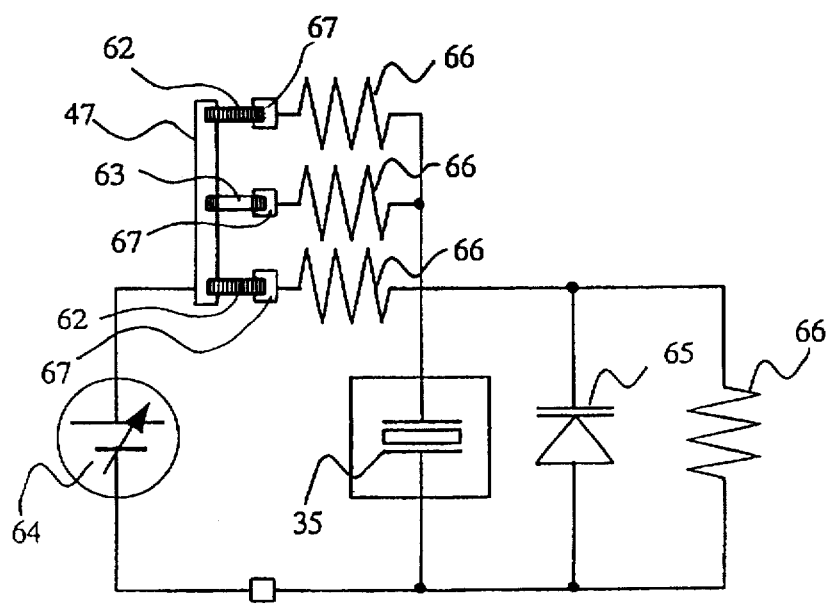
FIG. 42 shows the film bulk acoustic wave device of Embodiment 29 of this invention.

FIG. 42 shows a bulk acoustic wave device according to Embodiment 29 of this invention. The bulk acoustic wave device shown in FIG. 42 determines the applied voltage to the diode 65 with variable capacitance based on the voltage ratio of the resistances 66. The terminal 67 of each resistance 66, which have different resistance values respectively, is connected in advance to the lead electrode 47 using to the line pattern 62. In order to provide the proper amount of adjustment, the connection between the terminal 67 and the lead electrode 47 is cut off by using, for example, a laser. Such method has the advantage of being applicable in case of adjustment at each lot and in case of adjusting each of the bulk acoustic wave devices respectively.

Embodiment 30

Figure 43:
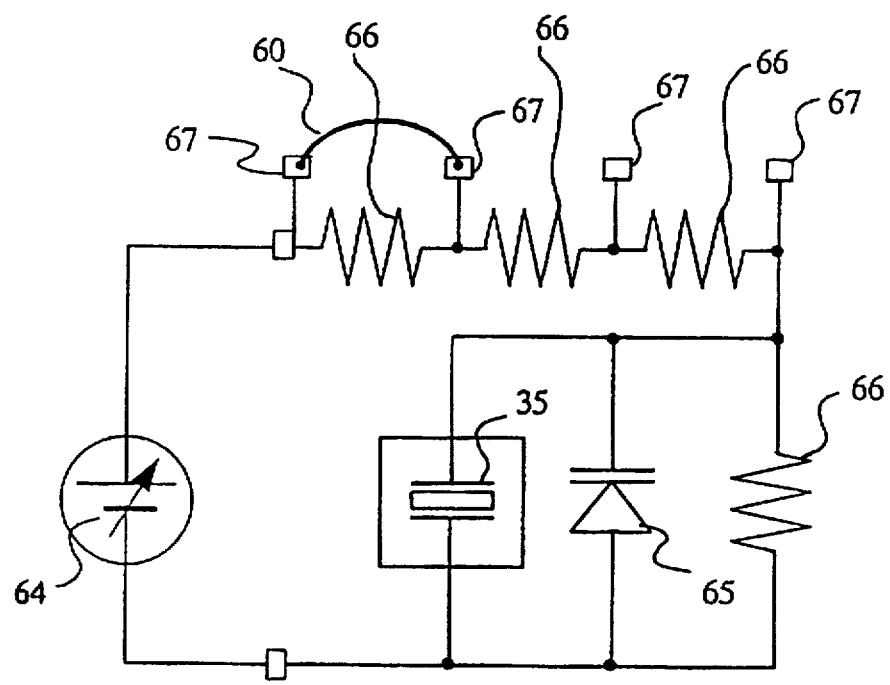
FIG. 43 shows the film bulk acoustic wave device of Embodiment 30 of this invention.

FIG. 43 shows a bulk acoustic wave device according to Embodiment 30 of this invention. The bulk acoustic wave device shown in FIG. 43 determines the applied voltage to the diode 65 with variable capacitance based on the voltage ratio of the resistance 66. Each resistance 66, having a terminal 67, has a different resistance value than the other resistances 66. By selecting the terminal 67 which can provide the proper amount of adjustment by using such as the wire 60 and shorting the resistance 66, the applied voltage to the diode 65 with variable capacitance is determined. As a result, it is possible to adjust the resonant frequency of the bulk ultrasonic wave resonator 35 easily.

Embodiment 31

Figure 44:
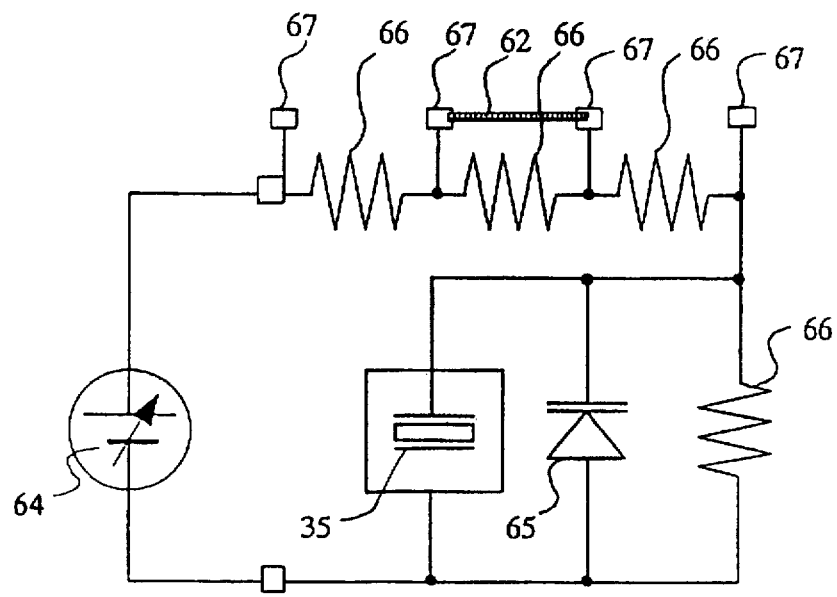
FIG. 44 shows the film bulk acoustic wave device of Embodiment 31 of this invention.

FIG. 44 shows a bulk acoustic wave device according to Embodiment 31 of this invention. The bulk acoustic wave device shown in FIG. 44 determines the applied electric voltage to the diode 65 with variable capacitance according to the voltage ratio of the resistance 66. Each resistance 66, having a terminal 67, has a different resistance value than the other resistances 66. By selecting the terminal 67 to provide the proper amount of adjustment, the applied electric voltage to the diode 65 with variable capacitance is determined. As a result, the resonant frequency of the bulk ultrasonic wave resonator 35 can be adjusted easily. Such method excels in lot by lot adjustment.

Embodiment 32

Figure 45:
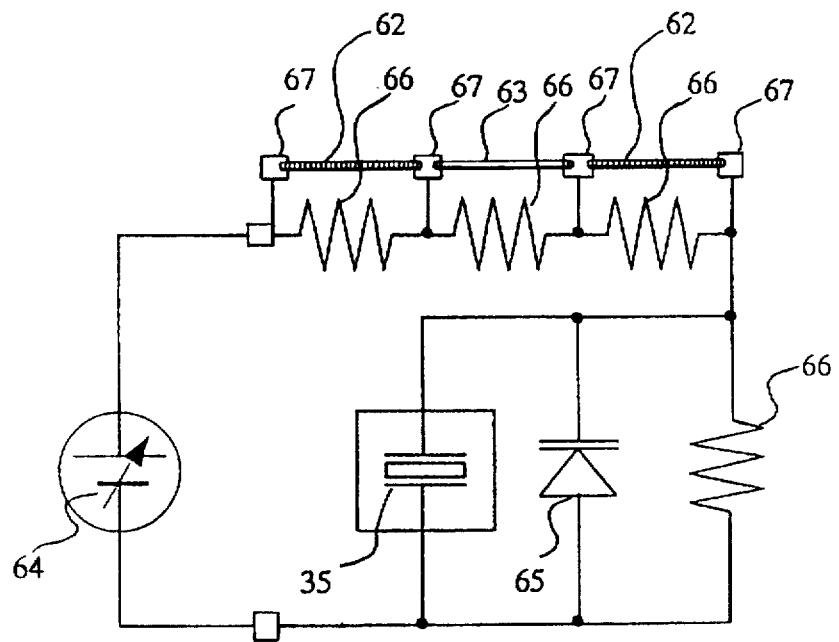
FIG. 45 shows the film bulk acoustic wave device of Embodiment 32 of this invention.
Figure 46:
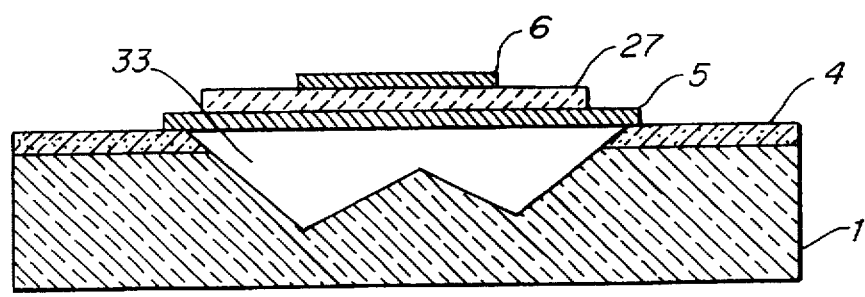
FIG. 46 shows another example of a bulk ultrasonic wave resonator of this invention.
Figure 47:
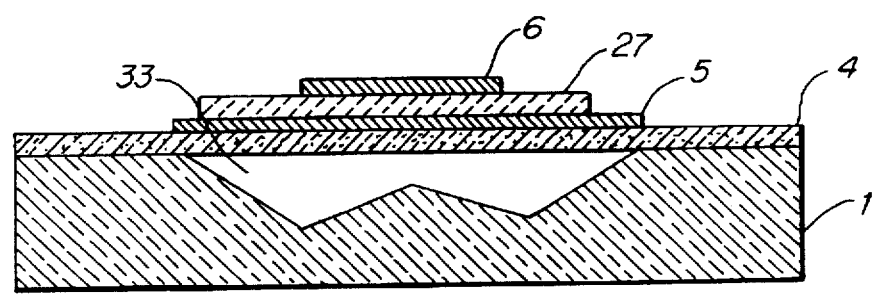
FIG. 47 shows another example of a bulk ultrasonic wave resonator of this invention.
Figure 48:
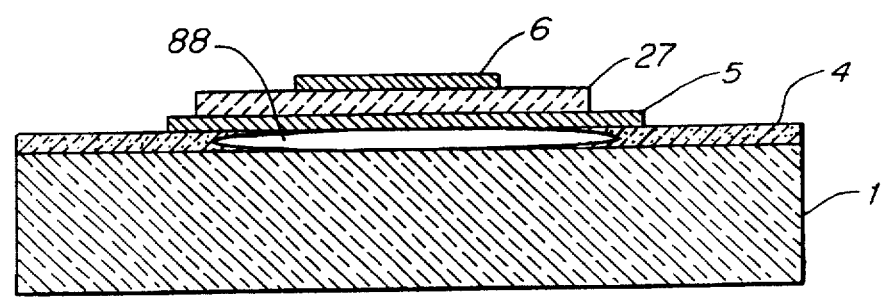
FIG. 48 shows another example of a bulk ultrasonic wave resonator of this invention.
Figure 49:
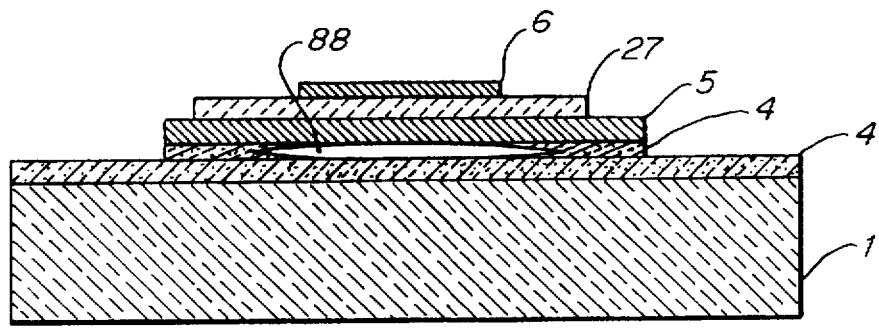
FIG. 49 shows another example of a bulk ultrasonic wave resonator of this invention.
Figure 50:
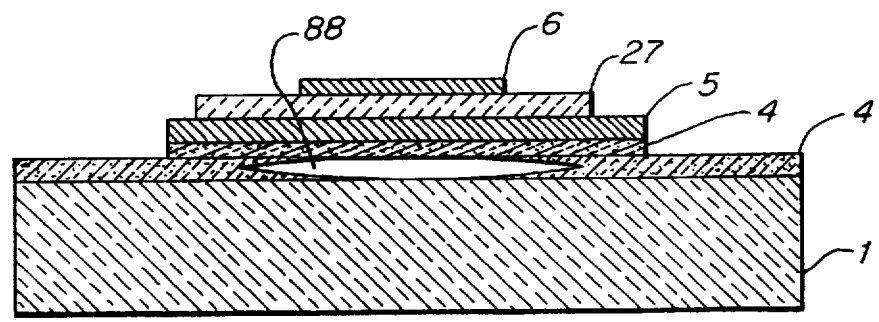
FIG. 50 shows another example of a bulk ultrasonic wave resonator of this invention.
Figure 51:
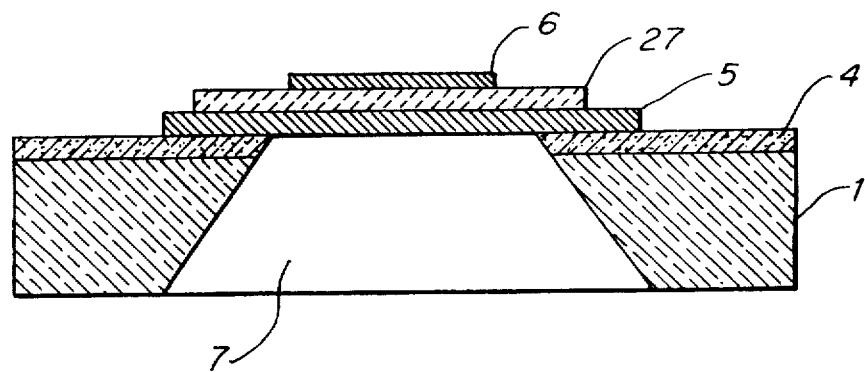
FIG. 51 shows another example of a bulk ultrasonic wave resonator of this invention.
Figure 52:
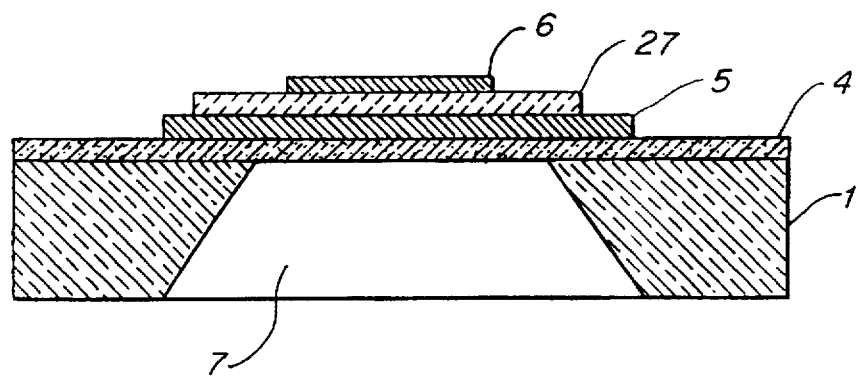
FIG. 52 shows another example of a bulk ultrasonic wave resonator of this invention.
Figure 53:
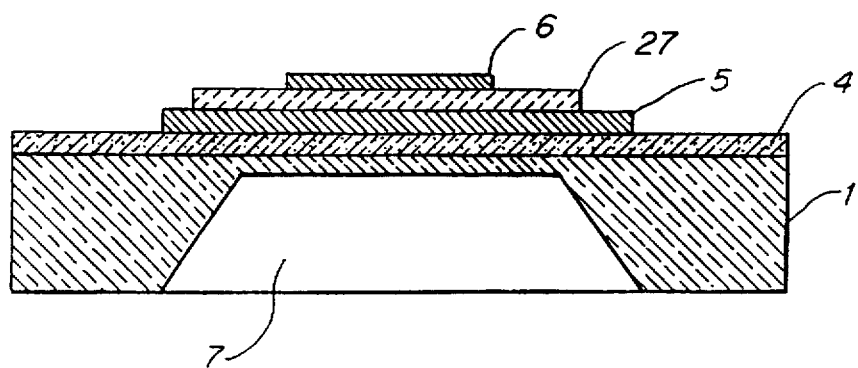
FIG. 53 shows another example of a bulk ultrasonic wave resonator of this invention.
Figure 54:
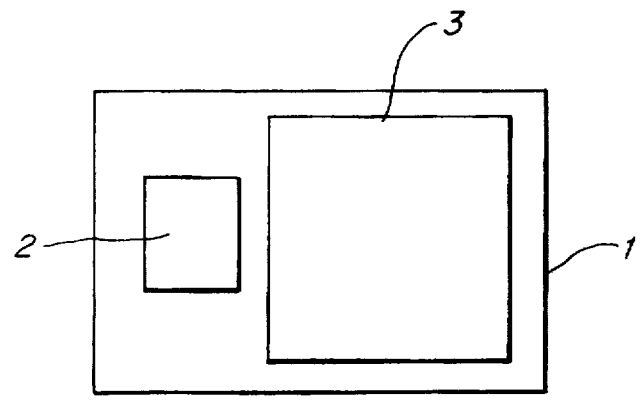
FIG. 54 shows a conventional type of a film bulk acoustic wave device.
Figure 55:
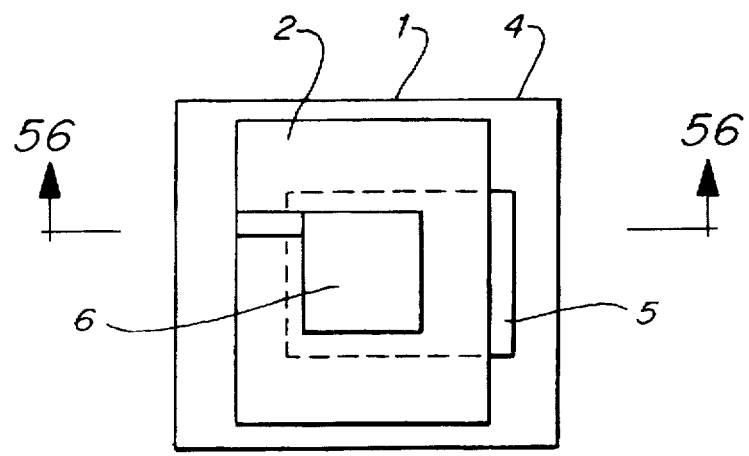
FIG. 55 shows an upper-side view of a conventional type of bulk ultrasonic wave resonator.
Figure 56:
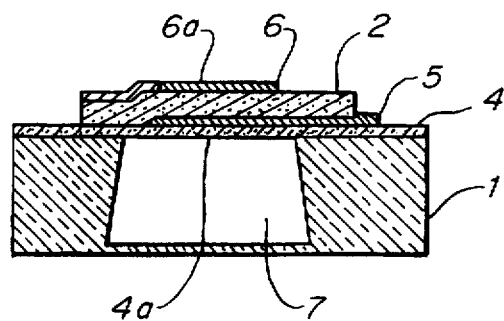
FIG. 56 shows a cross sectional view of a bulk ultrasonic wave resonator.
Figure 57:
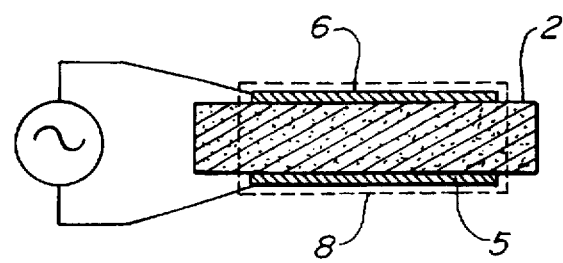
FIG. 57 shows a simplified configuration view of a bulk ultrasonic wave resonator.
Figure 58:
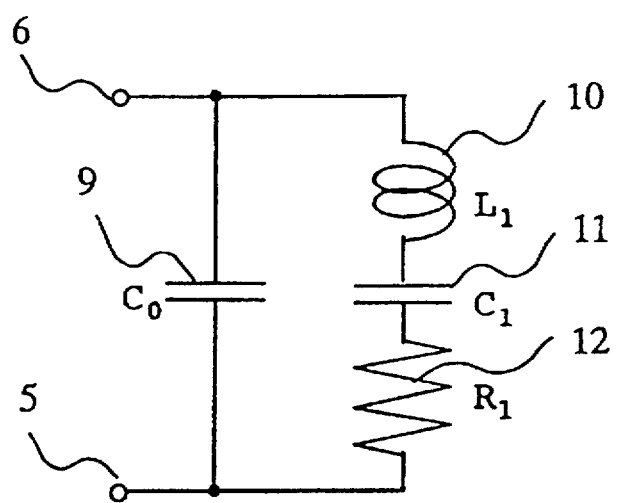
FIG. 58 shows an equivalent circuit of a bulk ultrasonic wave resonator.
Figure 59:
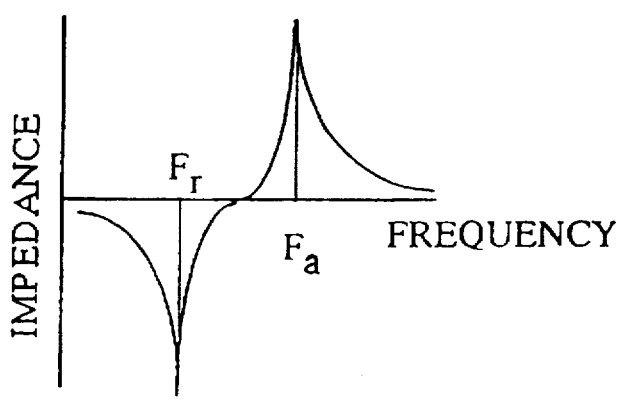
FIG. 59 shows an impedance characteristic of a bulk ultrasonic wave resonator.
Figure 60:
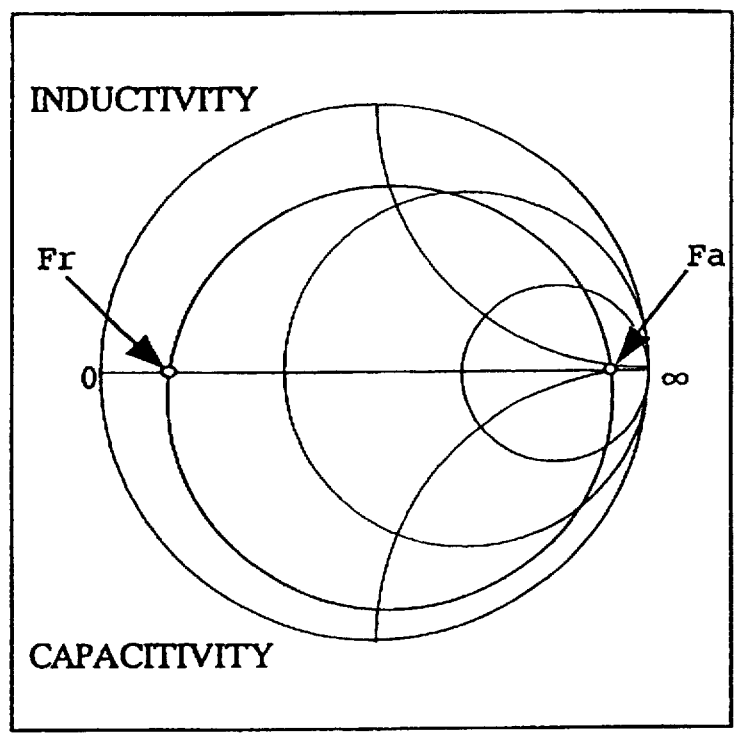
FIG. 60 shows the impedance characteristic of a bulk ultrasonic wave resonator.
Figure 61:
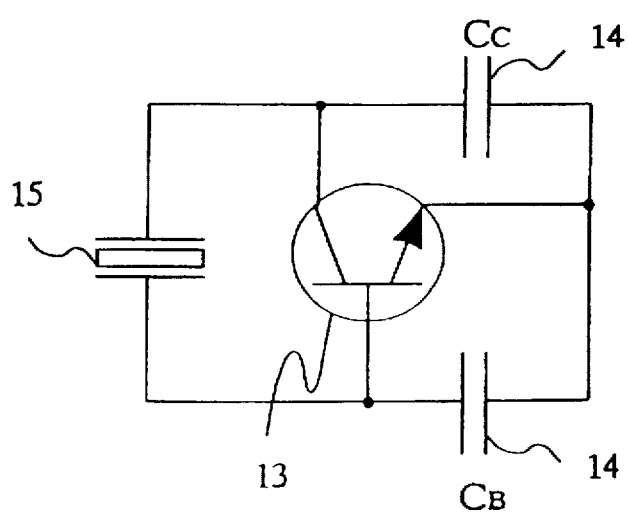
FIG. 61 shows an oscillator circuit.
Figure 62:
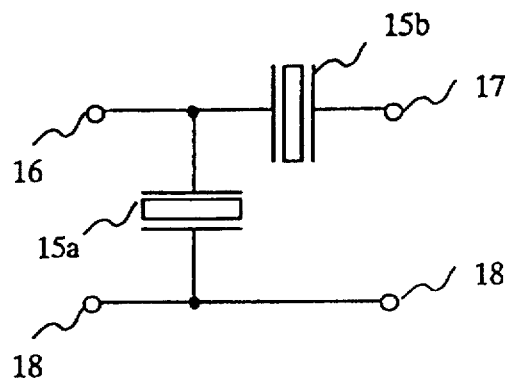
FIG. 62 shows a circuit view of a bulk ultrasonic wave filter connected in a ladder circuit.
Figure 63:
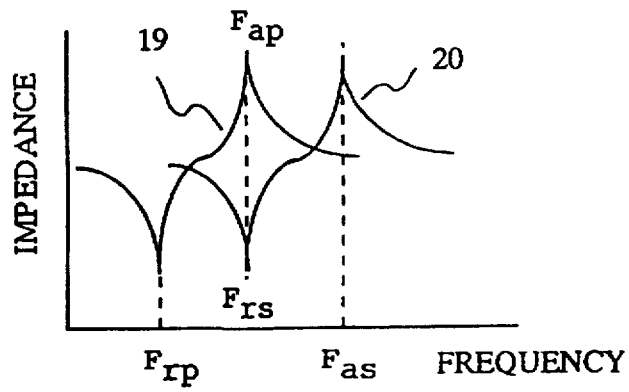
FIG. 63 shows the impedance characteristics of each bulk ultrasonic wave resonator of a bulk ultrasonic wave filter.
Figure 64:
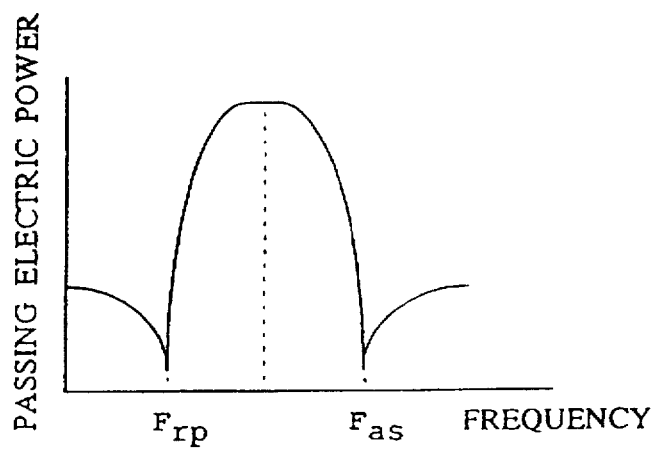
FIG. 64 shows a passing characteristic of a bulk ultrasonic wave filter.
Figure 65:
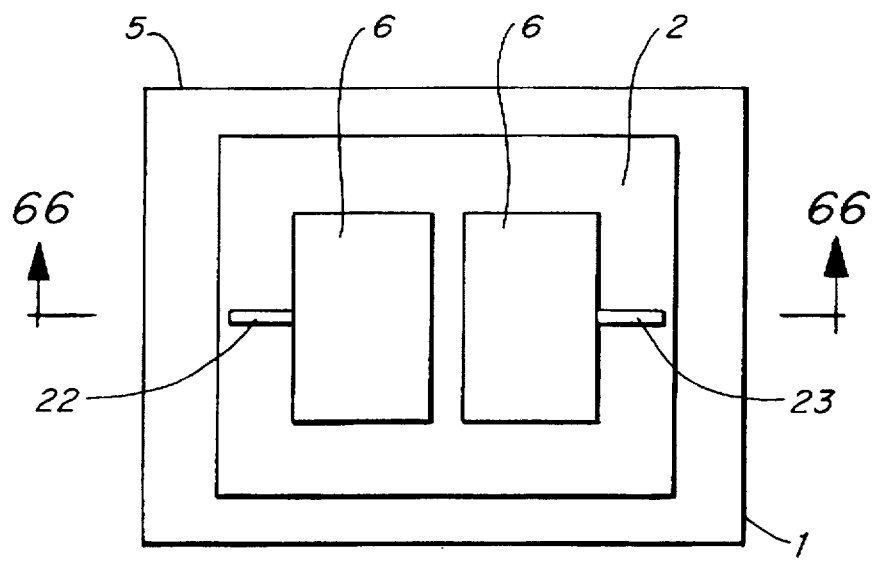
FIG. 65 shows an upper-side view of a bulk ultrasonic wave filter using a multiple mode resonance.
Figure 66:
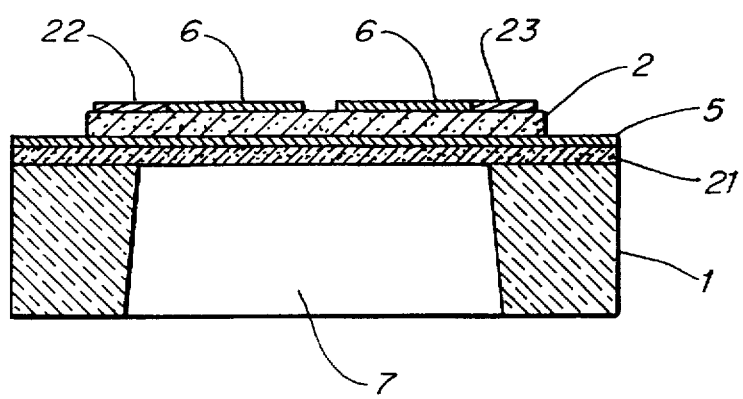
FIG. 66 shows a transverse cross sectional view of a bulk ultrasonic wave filter using the multiple mode resonance.
Figure 67:
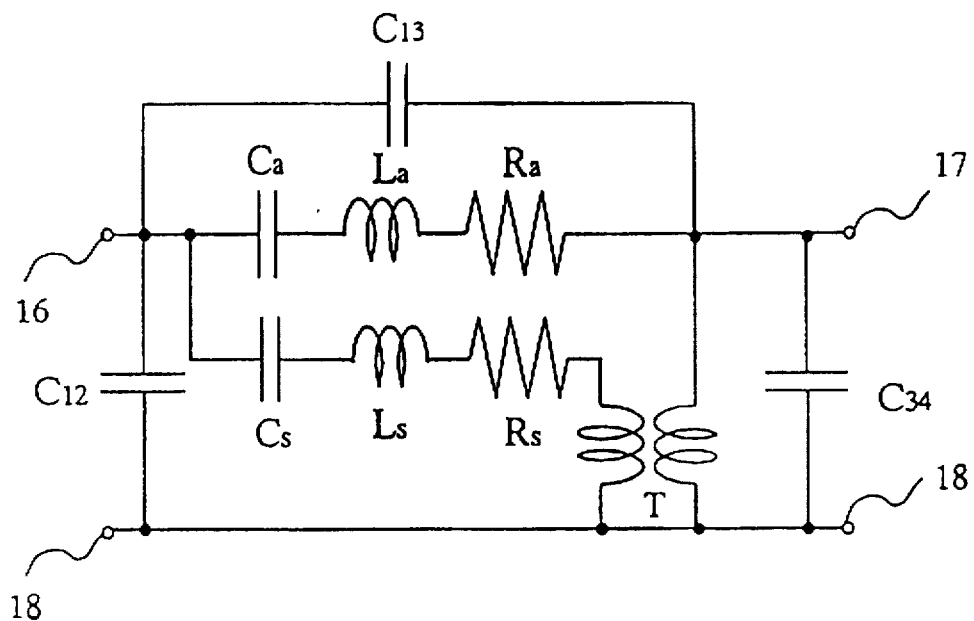
FIG. 67 shows an equivalent circuit of a bulk ultrasonic wave filter using the multiple mode resonance.
Figure 68:
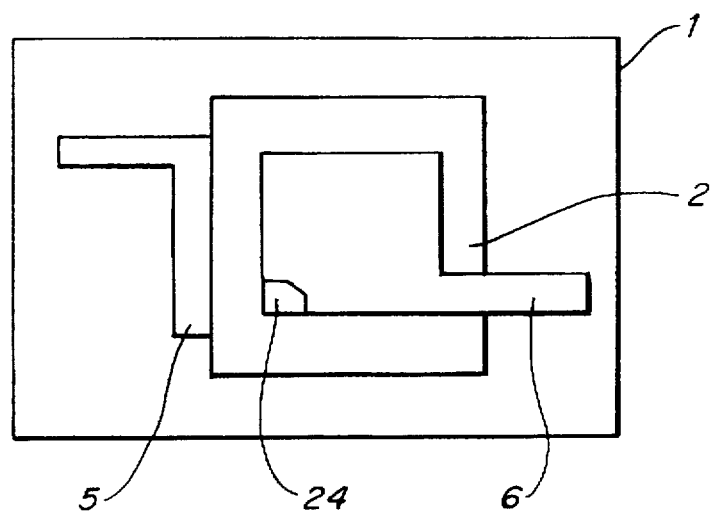
FIG. 68 shows a method of adjusting frequency of a conventional type of bulk ultrasonic wave resonator.
Figure 69:
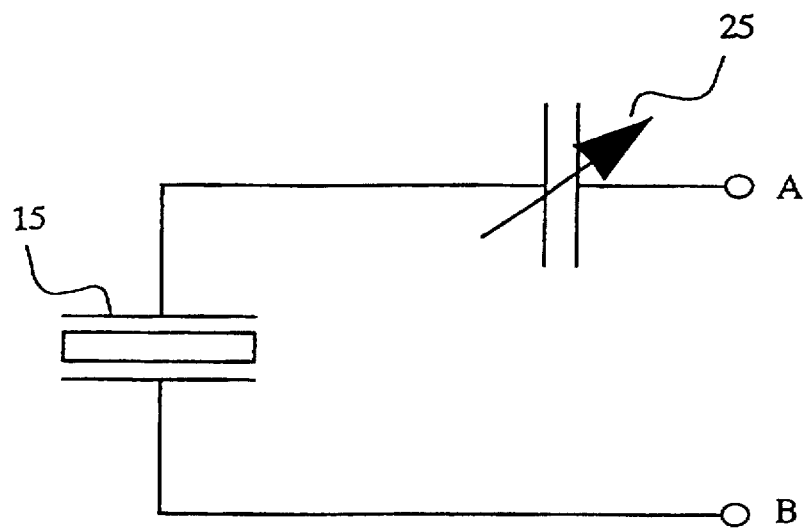
FIG. 69 shows a method of adjusting frequency of a conventional type of bulk ultrasonic wave resonator.
Figure 70:
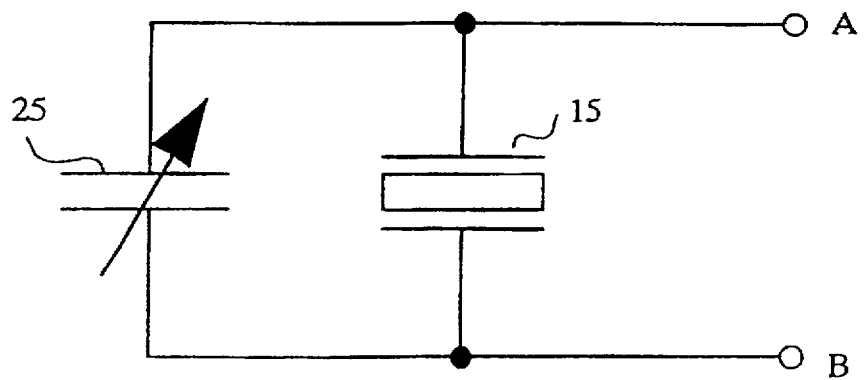
FIG. 70 shows a method of adjusting frequency of a conventional type of bulk ultrasonic wave resonator.
Figure 71:
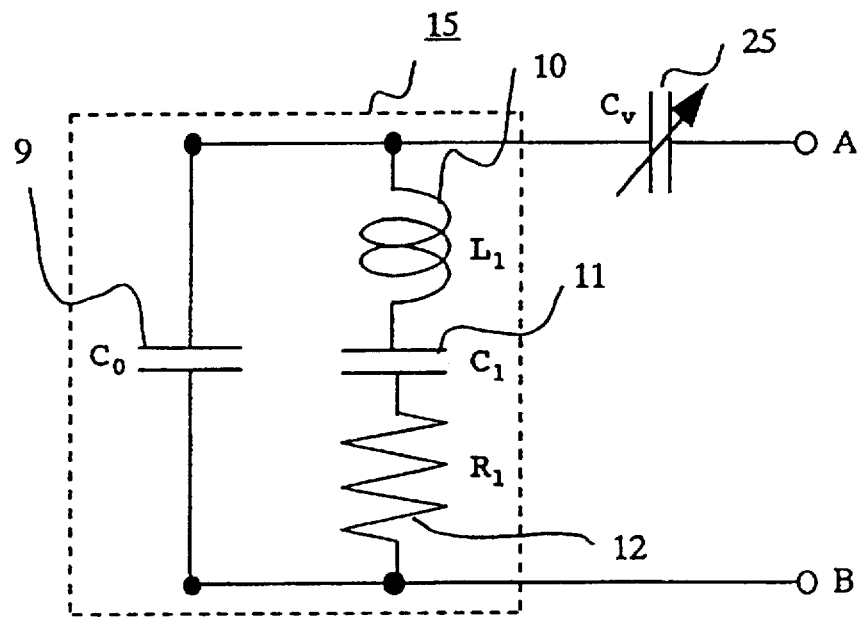
FIG. 71 shows the equivalent circuit of the circuit of FIG. 69.
Figure 72:
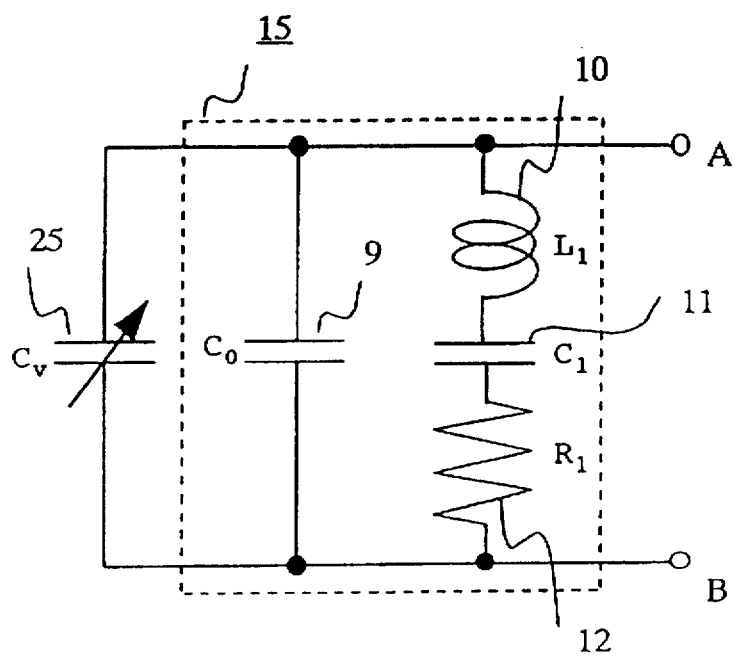
FIG. 72 shows the equivalent circuit of the circuit of FIG. 70.
Figure 73:
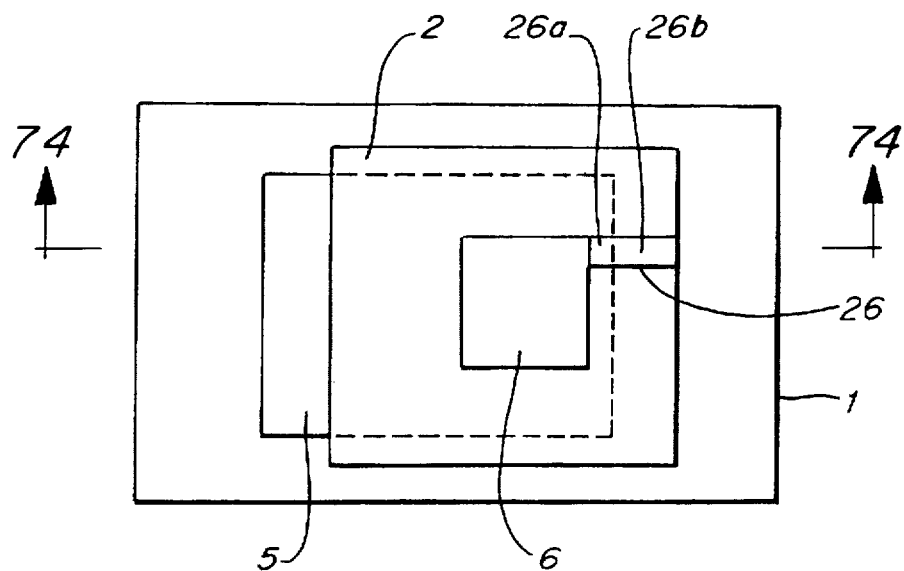
FIG. 73 shows an upper-side view for explaining an influence of a pattern precision; and, FIG. 74 shows a transverse cross sectional view for explaining the influence of the pattern precision.
Figure 74:
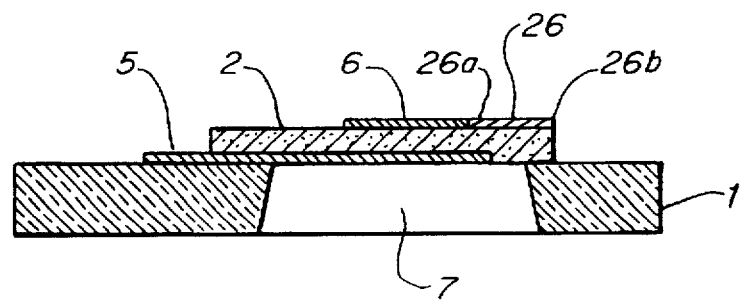

FIG. 45 shows a bulk acoustic wave device according to Embodiment 32 of this invention. The bulk acoustic wave device shown in FIG. 45 determines the applied voltage to the diode 65 with variable capacitance according to the voltage ratio of the resistance 66. Each resistance 66 has a different resistance value than the other resistances 66. Each resistance 66 is shorted in advance using the line pattern 62. The connection of the line pattern 62 between the terminals 67 is cut off by using, for example, a laser to provide the proper amount of adjustment. Such method has the advantage of being applicable in case of lot by lot adjustment and in case of adjusting each of the bulk acoustic wave devices respectively.

As has been described, FIGS. 1 and 2 show an example of using lead titanate (PbTiO$_3$) as the piezoelectric substance. In this invention, lead titanate-zirconate (PZT) 32 can be used instead of the lead titanate (PbTiO$_3$) as the piezoelectric substance. Similarly, in FIGS. 9, 10, lead titanate (PbTiO$_3$) can be used as the piezoelectric substance. In addition, FIGS. 1, 2, 9 and 10 illustrate only the bulk ultrasonic wave resonator. But in the figures, the bulk ultrasonic wave filter and other semiconductor circuits 3 can be on the same semiconductor substrate 1. The structure of the via holes 7 and 33 on the bottom side of the ground conductor 5 shown in FIGS. 1, 2, 9 and 10 can be one of structures shown in FIGS. 46 to 53 in which the via holes 7, 33 or the air gap 88 are provided on the bottom side of the ground conductor 5 or the dielectric substance 4.

As has been described, FIGS. 11, 16, 21, 22, 23 and 24 show an example of the bulk ultrasonic wave oscillator using the bulk ultrasonic wave resonator. In this invention, it is also useful to configure it on the same semiconductor substrate 1 with other generally used semiconductor circuits such as the bulk ultrasonic wave filter, a semiconductor amplifier, a semiconductor mixer, an analog to digital convertor, a digital to analog convertor, a Central Processing Unit (CPU), a Digital Signal Processor (DSP), a memory and so on. As stated, since it is possible to fabricate the bulk ultrasonic wave resonator together with many sorts of semiconductor circuits on the same semiconductor substrate 1, it is possible to apply it to the whole electric circuit or whole electronics circuit using the bulk acoustic wave device without limiting to a specific device.

As has been described, FIG. 15 shows an example in which the bulk ultrasonic wave resonator 35 is inserted as an inductor between the transistor 13 and the output terminal 37. In this invention, it is possible to insert the bulk ultrasonic wave resonator into an arbitrary position in the semiconductor circuit.

As has been described, FIG. 16 shows an example in which the dielectric substance of the condenser $C_O$ 45 and the condenser $C_E$ 45 uses the piezoelectric substance that is used in the bulk ultrasonic wave resonator 35. However, this invention is applicable to the arbitrary condenser 45 in the semiconductor circuit 3.

As has been described, FIGS. 17, 18, 19 and 20 show only condensers in which the piezoelectric substance uses lead titanate (PbTiO$_3$). In this invention, it is possible to use the bulk ultrasonic wave resonator and the bulk ultrasonic wave filter, and arbitrary semiconductor circuits 3 in addition to the condenser. In case of connection with the lead electrode 47, the other connecting methods, except for the air bridge 46, are also effective.

As has been described, FIGS. 21, 22 and 23 show polarization methods. The combination of these methods is more effective. In FIG. 24, the bulk ultrasonic wave oscillator is shown as an example of processing a plurality of chips 53. It is also applicable to other circuits like bulk ultrasonic wave filters and semiconductor circuits. Further, the shape of polarization patterns and the shape of the semiconductor forming the polarization pattern are not necessarily the same as those shown in FIG. 24 and an arbitrary shape can be used. The structure in each chip 53 of FIG. 24 shows a case of employing the polarization process shown in FIG. 22. The structure shown in FIGS. 21 and 23 also can be used for FIG. 24.

As has been described, FIGS. 25 and 26 show examples of the bulk ultrasonic wave filter composed of two electrodes. This invention is also applicable to the connection of the bulk ultrasonic wave filter having more than two electrodes. This invention is also applicable to the connection of the bulk ultrasonic wave resonator and the bulk ultrasonic wave filter formed in a plurality of chips.

As has been described, FIGS. 27 to 38 show a case of the bulk ultrasonic wave resonator. In this invention, the bulk ultrasonic wave filter is also available. Further, the condenser need not always have a structure as shown in FIGS. 27 to 38.

As has been described, FIGS. 39 to 45 show an example using the diode 65 with variable capacitance. A transistor can also be used as well as the diode 65 with variable capacitance. Further, there is shown a case where the diode 65 with variable capacitance is connected in parallel to the bulk ultrasonic wave resonator 35. Instead, the diode 65 can be connected in series.

As has been described, according to this invention, the piezoelectric substance uses piezoelectric ceramics which is mainly composed of lead titanate ($PbTiO_3$) or lead titanate-zirconate (PZT). When the thickness of the piezoelectric ceramics is h, the thickness of platinum (Pt) or gold (Au) as the ground conductor is d and the wave number of acoustic waves to propagate in the direction parallel to the surface of the piezoelectric ceramics is k, kh is less than 2 or d/h is less than 0.1. Accordingly, there causes no spurious and a large electromechanical coupling constant can be realized. As a result, it is possible to obtain a well characterized film bulk acoustic wave device.

Since the piezoelectric ceramics have a large electromechanical coupling constant, it is possible to adjust the resonant frequency by using an electrical adjusting method. Even when the piezoelectric ceramics are fabricated together with the semiconductor circuit, it is possible to select one of the adjustment methods which can be used with the manufacturing process of the semiconductor circuit. Consequently, the manufacturing cost can be reduced.

Furthermore, according to this invention, since the piezoelectric ceramics can show an inductive reactance characteristic in a wide frequency band, it can be used as the inductor in the semiconductor circuit. Consequently, it is possible to make the area of the semiconductor circuit small and to reduce the manufacturing cost of the semiconductor circuit.

Furthermore, according to this invention, the piezoelectric ceramics whose piezoelectricity is strengthened by the polarization process is used. By using a part of the piezoelectric ceramics as a high dielectric substance, the area of the condenser is made small. The other parts can be used as the bulk acoustic wave device by using the polarization process. Therefore, by controlling the manufacturing process of the bulk acoustic wave device, it is possible to downsize the condenser and to reduce the manufacturing cost.

Furthermore, according to this invention, it is possible to prevent the damage of devices in the semiconductor circuit caused by the polarization process. It is possible to perform the polarization process of many bulk ultrasonic wave resonators and the filters at the same time. Therefore, the processing cost for polarization process can be reduced and the effective polarization process can be realized.

Furthermore, according to this invention, since it is electrically possible to adjust the variation of the resonant frequency caused by manufacturing errors of the piezoelectric thin film thickness, the well-qualified film bulk acoustic wave device can be obtained.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only, and not intended to be limiting. The invention is limited only as defined in the following claims and the equivalents thereto. What is claimed is:

1. A film bulk acoustic wave device comprising:

a semiconductor substrate;

a ground conductor layer mounted on the semiconductor substrate;

a piezoelectric ceramic thin film mounted on the ground conductor layer; and, a conductive electrode pattern mounted on the piezoelectric ceramic thin film;

wherein the piezoelectric ceramic thin film has a piezoelectric section processed by a polarization process and a dielectric section that has not been processed by the polarization process.

2. The film bulk acoustic wave device of claim 1:

wherein the ground conductor layer has a thickness;

wherein the piezoelectric ceramic thin film has a thickness; and wherein the thickness of the piezoelectric ceramic thin film is more than 10 times the thickness of the ground conductor layer.

3. The film bulk acoustic wave device of claim 1:

wherein the piezoelectric ceramic thin film has a thickness; and wherein the piezoelectric ceramic thin film generates an acoustic wave propagated in a direction parallel to a surface of the piezoelectric ceramic thin film and a wave number of the acoustic waves is less than 2 divided by the thickness of the piezoelectric ceramic thin film.

4. The film bulk acoustic wave device of claim 1 further comprising:

a semiconductor circuit formed on the semiconductor substrate;

wherein the piezoelectric ceramic thin film constitutes a first piezoelectric ceramic thin film; and wherein the semiconductor circuit includes at least one component having a second piezoelectric ceramic thin film formed with the first piezoelectric ceramic thin film.

5. The film bulk acoustic wave device of claim 1 wherein the dielectric section is used as a part of a capacitive reactance device.

6. The film bulk acoustic wave device of claim 4 wherein the semiconductor circuit is an inductive reactance device.

7. The film bulk acoustic wave device of claim 1 further comprising:

a semiconductor circuit mounted on the semiconductor substrate;

a polarization connection circuit connected to the ground conductor layer and the conduction electrode pattern for applying an electric potential to polarize the piezoelectric ceramic thin film; and a protective circuit connected to the polarization circuit and the semiconductor circuit for protecting the semiconductor circuit from the electric potential.

8. The film bulk acoustic wave device of claim 1 further comprising:

a plurality of reactance devices mounted on the semiconductor substrate; and a means for selectively connecting each of the plurality of reactance devices in a circuit with the ground conductor layer and the conductive electrode pattern.

9. The film bulk acoustic wave device of claim 1 further comprising:

an active device circuit that provides a variable capacitive reactance, mounted on the semiconductor substrate and connected to the ground conductor layer and the conductive electrode pattern.

10. The film bulk acoustic wave device of claim 8, wherein at least one of the plurality of reactance devices includes a second piezoelectric ceramic thin film formed with the first piezoelectric ceramic thin film.

11. The film bulk acoustic wave device of claim 7, wherein the protective circuit has a capacitive reactance connected in series between the semiconductor circuit and at least one of the ground conductor layer and the conductive electrode pattern.

12. The film bulk acoustic wave device of claim 7, wherein the semiconductor circuit has a ground potential electrode, and wherein the protective circuit includes a ground connection circuit for connecting a first one of the conductive electrode pattern and the ground conductor layer to the ground potential electrode of the semiconductor circuit and a disconnection circuit for disconnecting a second one of the conductive electrode pattern and the ground conductor layer from the ground potential electrode of the semiconductor circuit when the electric potential is applied, and wherein the polarization connection circuit applies a direct current voltage for polarization to the second one of the conductive electrode pattern and the ground conductor.

13. The film bulk acoustic wave device of claim 7, wherein the semiconductor circuit has a ground potential electrode, and wherein the protective circuit includes a ground connection circuit for connecting a first one of the conductive electrode pattern and the ground conductor to the ground potential electrode of the semiconductor circuit when the electric potential is applied and includes a resistance between a second one of the conductive electrode pattern and the ground conductor layer and the polarization connection circuit a resistance, wherein the resistance has a larger resistance value than that of a resistance device in the semiconductor circuit between the polarization connection circuit and the ground potential electrode of the semiconductor circuit.

14. The film bulk acoustic wave device of claim 7, wherein the polarization connection circuit is provided for a plurality of film bulk acoustic wave devices.

15. The film bulk acoustic wave device of claim 14, wherein the polarization circuit has one of a first line to electrically couple a plurality of the ground conductor layers and a second line to electrically couple a plurality of the conductive electrode patterns.

16. The film bulk acoustic wave device of claim 15, wherein the first and second lines have a characteristic impedance of more than 50 Ω.

17. The film bulk acoustic wave device of claim 15, wherein the first and second lines have a resistance of more than 50 Ω.

18. The film bulk acoustic wave device of claim 9, wherein the active device circuit has an active device, a plurality of resistance devices, and a means for selectively connecting each of the plurality of resistance devices between the active device and one of the ground conductor layer and the conductive electrode pattern.

19. The film bulk acoustic wave device of claims 8 or 18, wherein the means for selectively connecting includes means for connecting devices in series.

20. The film bulk acoustic wave device of claims 8 or 18, wherein the means for selectively connecting includes means for connecting devices in parallel.

21. The film bulk acoustic wave device of claims 8 or 18, wherein the means for selectively connecting includes wire bonds connected to selected devices.

22. The film bulk acoustic wave device of claims 8 or 18, wherein the means for selectively connecting includes a mask for producing an electrode connected to selected devices.

23. The film bulk acoustic wave device of claims 8 or 18, wherein the means for selectively connecting includes means for cutting an electrode pattern connected to selected devices.

24. The film bulk acoustic wave device of claims 3, 4, 1, 5, 8 or 9, wherein the ground conductor layer has a thickness and the piezoelectric ceramic thin film has a thickness and the thickness of the piezoelectric ceramic thin film is more than 10 times the thickness of the ground conductor layer.

25. The film bulk acoustic wave device of claims 2, 4, 1, 5, 8, or 9, wherein the piezoelectric ceramic thin film has a thickness and wherein the piezoelectric ceramic thin film generates an acoustic wave to propagate in a direction parallel to a surface of the piezoelectric ceramic thin film and a number of acoustic waves is less than 2 divided by the thickness of the piezoelectric thin film.

26. The film bulk acoustic wave device of claim 2, 3, 4, 1, 5, 8, or 9, wherein the piezoelectric ceramic thin film is comprised of one of lead titanate and lead titanate-zirconate.

27. The film bulk acoustic wave device of claim 26, wherein the semiconductor substrate is comprised of one of silicon and gallium arsenide.

28. The film bulk acoustic wave device of claim 26, further comprising at least one of a semiconductor circuit, an active circuit device and a passive circuit device on the semiconductor substrate, so as to configure an electronic system.

29. The film bulk acoustic wave device of claim 26, further comprising a dielectric substance layer between the semiconductor substrate and the ground conductor layer.

30. The film bulk acoustic wave device of claim 27, wherein the ground conductor layer uses at least one of platinum and gold.

31. The film bulk acoustic wave device of claim 30, wherein the ground conductor layer uses one of titanium and tungsten.

32. The film bulk acoustic wave device of claim 31, wherein the conductive electrode pattern uses one of a metal, a conductive semiconductor layer and a conductive material.

33. The piezoelectric thin film of claim 29, wherein the piezoelectric ceramic thin film is mounted on a part of the dielectric substance layer.

34. The film bulk acoustic wave device of claim 29, wherein the dielectric substance layer is mainly composed of one of silicon oxide, silicon nitride and tantalum oxide.

35. A film bulk acoustic wave device comprising:

a semiconductor substrate;

a ground conductor layer mounted on the semiconductor substrate;

a first piezoelectric ceramic thin film mounted on the ground conductor layer;

a conductive electrode pattern mounted on the piezoelectric ceramic thin film; and a semiconductor circuit formed on the semiconductor substrate;

wherein the semiconductor circuit includes at least one component having a second piezoelectric ceramic thin film formed with the first piezoelectric ceramic thin film;

wherein the semiconductor circuit is an inductive reactance device; and wherein an electrical characteristic of the inductive reactance device is based upon a shape of the piezoelectric ceramic thin film and a shape of the conductive electrode pattern.

36. The film bulk acoustic wave device of claim 35, wherein an electrical characteristic of the inductive reactance device is based upon a shape of the ground conductor layer.

* * * * *

UNITED STATES PATENT AND TRADEMARK OFFICE
CERTIFICATE OF CORRECTION

PATENT NO. : 5,789,845
DATED : August 4, 1998
INVENTOR(S): Shusou Wadaka, Koichiro Misu, Tsutomu Nagatsuka, Tomonori Kimura, Shunpei Kameyama, Chisako Maeda, Akira Yamada and Toshihisa Honda It is certified that error appears in the above-identified patent and that said Letters Patent is hereby corrected as shown below:

Drawings:

In FIG. 18, element 46 should be connected to element 6 and to element 47.

In FIG. 20, each instance of element 46 should be connected to element 6 and to element 47.

Signed and Sealed this

Ninth Day of March, 1999

Attest:

Q. TODD DICKINSON

*Attesting Officer*　　*Acting Commissioner of Patents and Trademarks*